US012720958B2

(12) United States Patent
Yamazaki et al.

(10) Patent No.: US 12,720,958 B2
(45) Date of Patent: Aug. 25, 2026

(54) DISPLAY APPARATUS WEARABLE ON HEAD AND DISPLAY SYSTEM INCLUDING WEARABLE DISPLAY APPARATUS

(71) Applicant: SEMICONDUCTOR ENERGY LABORATORY CO., LTD., Atsugi (JP)

(72) Inventors: Shunpei Yamazaki, Tokyo (JP); Takayuki Ikeda, Atsugi (JP); Satoshi Seo, Sagamihara (JP); Sachiko Kawakami, Atsugi (JP); Daiki Nakamura, Atsugi (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 874 days.

(21) Appl. No.: 17/833,926

(22) Filed: Jun. 7, 2022

(65) Prior Publication Data

US 2022/0392982 A1 Dec. 8, 2022

(30) Foreign Application Priority Data

Jun. 8, 2021 (JP) ................................ 2021-096220

(51) Int. Cl.
*H10K 59/122* (2023.01)
*G02B 27/01* (2006.01)
(Continued)

(52) U.S. Cl.
CPC ....... *H10K 59/122* (2023.02); *G02B 27/0172* (2013.01); *G02B 2027/0112* (2013.01);
(Continued)

(58) Field of Classification Search
CPC ................ H10K 59/122; H10K 59/35; G02B 2027/0112; G09G 2300/0452; G06F 1/163
(Continued)

(56) References Cited

U.S. PATENT DOCUMENTS 5,953,985 A 9/1999 Kobayashi
6,120,338 A 9/2000 Hirano et al.
(Continued)

FOREIGN PATENT DOCUMENTS

JP 2000-002856 A 1/2000
JP 2000-036385 A 2/2000
(Continued)

OTHER PUBLICATIONS

Zakhidov.A et al., "Orthogonal processing: A new strategy for organic electronics", Chem. Sci. (Chemical Science), Apr. 7, 2011, vol. 2, No. 6, pp. 1178-1182.
(Continued)

*Primary Examiner* — Eliseo Ramos Feliciano
*Assistant Examiner* — Mikka Liu
(74) *Attorney, Agent, or Firm* — NIXON PEABODY LLP; Jeffrey L. Costellia

(57) ABSTRACT

A display apparatus with a high level of immersion or realistic sensation is provided. The display apparatus includes a display portion capable of full-color display, a communication portion having a wireless communication function, and a wearing portion that can be worn on a head. In an emission spectrum of blue display provided by the display portion at a first luminance, when the intensity of a first emission peak at a wavelength higher than or equal to 400 nm and lower than 500 nm is 1, the intensity of a second emission peak at a wavelength higher than or equal to 500 nm and lower than or equal to 700 nm in the emission
(Continued)

spectrum is 0.5 or lower. The first luminance is any value higher than 0 cd/m$^2$ and lower than 1 cd/m$^2$.

12 Claims, 33 Drawing Sheets

(51) Int. Cl.
*G06F 1/16* (2006.01)
*G09G 3/3233* (2016.01)
*H10K 59/35* (2023.01)

(52) U.S. Cl.
CPC ........... *G06F 1/163* (2013.01); *G09G 3/3233* (2013.01); *G09G 2300/0452* (2013.01); *G09G 2300/0465* (2013.01); *G09G 2300/0842* (2013.01); *H10K 59/35* (2023.02)

(58) Field of Classification Search
USPC ........................................................... 257/79
See application file for complete search history.

(56) References Cited

U.S. PATENT DOCUMENTS 7,248,232 B1 7/2007 Yamazaki et al.
8,293,921 B2 10/2012 Nomura et al.
8,986,857 B2 3/2015 Suzuki et al.
8,993,127 B2 3/2015 Osaka et al.
9,257,655 B2 2/2016 Suzuki et al.
9,577,222 B2 2/2017 Seo et al.
9,685,485 B2 6/2017 Inoue et al.
9,728,693 B2 8/2017 Hatano et al.
9,837,478 B2 12/2017 Ikeda et al.
9,940,086 B2 4/2018 Yoshizumi et al.
9,972,664 B2 5/2018 Yamaguchi et al.
10,084,022 B2 9/2018 Ikeda et al.
10,373,983 B2 8/2019 Takahashi et al.
10,374,018 B2 8/2019 Aoyama. et al.
10,529,780 B2 1/2020 Yamaoka et al.
10,978,489 B2 4/2021 Hirakata
11,018,201 B2 5/2021 Aoyama et al.
11,217,635 B2 1/2022 Ikeda et al.
11,417,687 B2 8/2022 Yamazaki et al.
11,539,034 B2 12/2022 Koshihara
11,706,966 B2 7/2023 Aoyama et al.
12,048,223 B2 7/2024 Aoyama et al.
12,372,789 B2 7/2025 Hashimoto et al.
12,596,274 B2 4/2026 Aoyama et al.
2002/0072139 A1 6/2002 Kashiwabara
2007/0252518 A1* 11/2007 Lee ..................... H10K 71/135 313/504
2011/0148290 A1 6/2011 Oota
2012/0139978 A1* 6/2012 Ikeda .................. G09G 3/3233 345/694
2012/0256204 A1 10/2012 Yoshizumi et al.
2012/0273804 A1 11/2012 Hatano
2012/0276484 A1 11/2012 Izumi et al.
2013/0084531 A1 4/2013 Hamaguchi et al.
2013/0084664 A1 4/2013 Yoshitoku et al.
2013/0084666 A1 4/2013 Oshige
2013/0280839 A1 10/2013 Sonoda et al.
2013/0295705 A1 11/2013 Sonoda et al.
2014/0004640 A1 1/2014 Hamaguchi et al.
2014/0004642 A1 1/2014 Otsuka et al.
2015/0060826 A1 3/2015 Matsumoto et al.
2015/0069360 A1 3/2015 Sato
2015/0076476 A1 3/2015 Odaka et al.
2016/0172595 A1 6/2016 Malinowski et al.
2016/0315133 A1 10/2016 Sato
2017/0103716 A1* 4/2017 Kita ..................... G09G 3/2003
2017/0141167 A1 5/2017 Naganuma
2017/0256754 A1 9/2017 Defranco et al.
2017/0373036 A1* 12/2017 Yamazaki ............. H10K 59/38
2018/0012943 A1* 1/2018 Ikeda ................... H10K 59/121
2018/0151630 A1* 5/2018 Yamaoka ............ H10K 59/876
2018/0190908 A1 7/2018 Ke et al.
2019/0027547 A1 1/2019 Kim et al.
2019/0237514 A1* 8/2019 Tsukamoto ........... H10K 50/11
2020/0057330 A1* 2/2020 Yamazaki ............. H10K 59/50
2020/0111846 A1* 4/2020 Takahara ............ H10K 71/166
2020/0203662 A1 6/2020 Mollard et al.
2020/0357863 A1 11/2020 Nakamura et al.
2021/0313355 A1 10/2021 Yamazaki et al.
2022/0057636 A1* 2/2022 Hashimoto ............ G06F 1/163
2022/0209162 A1 6/2022 Seo et al.
2022/0223671 A1 7/2022 Yamazaki et al.
2022/0236569 A1 7/2022 Yamazaki et al.
2025/0328020 A1 10/2025 Hashimoto et al.

FOREIGN PATENT DOCUMENTS

JP 2003-059663 A 2/2003
JP 2008-098106 A 4/2008
JP 2008-147072 A 6/2008
JP 2008-251270 A 10/2008
JP 2009-058897 A 3/2009
JP 2014-022349 A 2/2014
JP 2014-120218 A 6/2014
JP 2014-135251 A 7/2014
JP 2014-164182 A 9/2014
JP 2014-232568 A 12/2014
JP 2015-026561 A 2/2015
JP 2015-115178 A 6/2015
JP 2016-197494 A 11/2016
JP 2017-085461 A 5/2017
JP 2017-220528 A 12/2017
JP 2017-227858 A 12/2017
JP 2018-010287 A 1/2018
JP 2019-179696 A 10/2019
JP 2020-160305 A 10/2020
JP 2020-184480 A 11/2020
KR 2020-0082920 A 7/2020
WO WO-2015/083586 6/2015
WO WO-2017/037560 3/2017
WO WO-2020/152828 7/2020

OTHER PUBLICATIONS

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.
Malinowski.P et al., "Photolithographic patterning of organic photodetectors with a non-fluorinated photoresist system", Organic Electronics, Jul. 12, 2014, vol. 15, No. 10, pp. 2355-2359.
Malinowski.P et al., "Multicolor 1250 ppi OLED Arrays Patterened by Photolithography", SID Digest '16 : SID International Symposium Digest of Technical Papers, May 22, 2016, vol. 47, No. 1, pp. 1009-1012.
Papadopoulos.N et al., "AMOLED Displays with In-Pixel Photodetector", Liquid Crystals and Display Technology, Jul. 9, 2020, pp. 1-19.
Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.
Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.
Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.
Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.
Gather.M et al., "Solution-Processed Full-Color Polymer-OLED Displays Fabricated by Direct Photolithography", SID Digest '06 :

(56) References Cited

OTHER PUBLICATIONS

SID International Symposium Digest of Technical Papers, Jun. 1, 2006, vol. 37, No. 1, pp. 909-911.
Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.
Lamprecht.B et al., "Organic optoelectronic device fabrication using standard UV photolithography", Phys. Stat. Sol. (RRL) (Physica Status Solidi. Rapid Research Letters.), Oct. 30, 2007, vol. 2, No. 1, pp. 16-18.

* cited by examiner

R
G
B
100A
131
111a
113a
127
113b
111b
113c
111c
122
120
118a
125
118b
114
118c
115
255b
255a
255c
256
130R
130G
130B
240
245
243
241
261
101
271
254
301
315
310
311
312
313
314

R
G
Lin
131
111a
113a
127
113b
111b
113d
111d
122
120
118a
125
118b
114
118d
115
255b
255a
255c
256
130R
130G
150
240
245
243
241
261
101
271
254
301
315
310
311
312
313
314

100H
140
162
164
123
142
128
130G
129b
113b
152
118b
125
127
118a
131
130R
113a
114
115
242
166
172
215
213
211
205
153
126b
G
112b
101
117
129a
126a
R
112a
201
165
204
151
214
128

DISPLAY APPARATUS WEARABLE ON HEAD AND DISPLAY SYSTEM INCLUDING WEARABLE DISPLAY APPARATUS

BACKGROUND OF THE INVENTION

1. Field of the Invention

One embodiment of the present invention relates to a display apparatus. One embodiment of the present invention relates to an electronic device. One embodiment of the present invention relates to a display system.

Note that one embodiment of the present invention is not limited to the above technical field. Examples of the technical field of one embodiment of the present invention disclosed in this specification and the like include a semiconductor device, a display apparatus, a light-emitting apparatus, a power storage device, a memory device, an electronic device, a lighting device, an input device, an input/output device, a driving method thereof, and a manufacturing method thereof. A semiconductor device refers to a device that can function by utilizing semiconductor characteristics in general.

2. Description of the Related Art

Wearable electronic devices are becoming widespread as electronic apparatuses equipped with display devices for augmented reality (AR) or virtual reality (VR). Examples of wearable electronic devices include a head mounted display (HMD) and an eyeglass-type electronic device.

With an electronic device whose display portion is close to the user, such as an HMD, the user is likely to perceive pixels and strongly feels granularity, whereby the sense of immersion or realistic feeling of AR and VR display might be diminished. Therefore, an HMD is preferably provided with a display apparatus that has minute pixels so that pixels are not perceived by the user. Patent Document 1 discloses a method in which an HMD including minute pixels is achieved by transistors capable of high-speed operation.

Organic EL devices are sometimes used in display portions of display apparatuses and HMDs for AR or VR. Non-Patent Document 1 discloses a manufacturing method of an organic optoelectronic device using standard UV photolithography, as an organic EL device.

REFERENCES

Patent Document

[Patent Document 1] Japanese Published Patent Application No. 2000-002856

Non-Patent Document

[Non-Patent Document 1] B. Lamprecht et al., "Organic optoelectronic device fabrication using standard UV photolithography" phys. stat. sol. (RRL) 2, No. 1, pp. 16-18 (2008)

SUMMARY OF THE INVENTION

Reducing the size of the pixel included in the display apparatus can increase the pixel density. Accordingly, more pixels can be provided for the display apparatus to enhance a sense of immersion or realistic sensation. Defects in pixels (bright spots or dark spots) should be reduced to further enhance a sense of immersion or realistic sensation.

A further problem is that a heavy HMD or the like worn on the user's head might place a burden on the user.

An object of one embodiment of the present invention is to provide a display apparatus with a high level of immersion or realistic sensation. Another object of one embodiment of the present invention is to provide a display apparatus or a display system with little burden on the user. Another of one embodiment of the present invention is to provide a display apparatus with high display quality. Another object of one embodiment of the present invention is to provide a display apparatus, a display method, a communication method, or a display system with a novel structure.

An object of one embodiment of the present invention is to reduce at least one of problems of the conventional technique.

Note that the description of these objects does not preclude the existence of other objects. One embodiment of the present invention does not need to achieve all the objects listed above. Objects other than these can be derived from the description of the specification, the drawings, the claims, and the like.

One embodiment of the present invention is a display apparatus including a display portion, a first communication portion, and a wearing portion. The wearing portion is configured to be worn on a head. The first communication portion has a wireless communication function. The display portion is capable of full-color display, and includes a first subpixel and a second subpixel. The first subpixel includes a first light-emitting device that emits blue light. The second subpixel includes a second light-emitting device that emits light of a color different from the blue color of the light emitted by the first light-emitting device. At least one material in the first light-emitting device is different from at least one material in the second light-emitting device. In an emission spectrum of blue display provided by the display portion at a first luminance, when an intensity of a first emission peak at a wavelength higher than or equal to 400 nm and lower than 500 nm is 1, an intensity of a second emission peak at a wavelength higher than or equal to 500 nm and lower than or equal to 700 nm in the emission spectrum is lower than or equal to 0.5. The first luminance is any value higher than 0 cd/m$^2$ and lower than 1 cd/m$^2$.

In the above, the first light-emitting device preferably includes a first pixel electrode, a first EL layer over the first pixel electrode, and a common electrode over the first EL layer. The second light-emitting device preferably includes a second pixel electrode, a second EL layer over the second pixel electrode, and the common electrode over the second EL layer. In that case, preferably, the first EL layer and the second EL layer have structures different from each other and the first EL layer and the second EL layer are separated from each other.

In the above, the first light-emitting device preferably includes a common layer between the first EL layer and the common electrode. The second light-emitting device preferably includes the common layer between the second EL layer and the common electrode. In that case, the common layer preferably includes at least one of a hole-injection layer, a hole-transport layer, a hole-blocking layer, an electron-blocking layer, an electron-transport layer, and an electron-injection layer.

In any of the above, the display portion preferably includes a first insulating layer which covers a side surface of the first EL layer and a side surface of the second EL layer. The common electrode is preferably positioned over the first insulating layer.

In the above, the display portion preferably includes a second insulating layer. In that case, the first insulating layer preferably includes an inorganic material, and the second insulating layer preferably includes an organic material and overlaps with the side surface of the first EL layer and the side surface of the second EL layer with the first insulating layer interposed therebetween.

In any of the above, the resolution of the display portion is preferably higher than or equal to 1000 ppi.

In any of the above, the first subpixel preferably includes a lens overlapping with the first light-emitting device.

In any of the above, the first pixel electrode preferably includes a material that reflects visible light.

In any of the above, the first subpixel preferably includes a reflective layer. The first pixel electrode preferably includes a material that transmits visible light. In that case, the first pixel electrode is preferably positioned between the reflective layer and the first EL layer.

In any of the above, an end portion of the first pixel electrode preferably has a tapered shape.

In any of the above, the first EL layer preferably covers the end portion of the first pixel electrode.

Another embodiment of the present invention is a display system including a server, a terminal, and any of the above display apparatuses. The terminal includes a second communication portion and a third communication portion. The second communication portion is configured to execute communication with the server through the network. The third communication portion is configured to execute communication with the first communication portion.

According to one embodiment of the present invention, a display apparatus with a high level of immersion or realistic sensation can be provided. A display apparatus or a display system with little burden on the user can be provided. A display apparatus with high display quality can be provided. A display apparatus, a display method, a communication method, or a display system with a novel structure can be provided. At least one of problems of the conventional technique can be reduced.

Note that the description of these effects does not preclude the existence of other effects. One embodiment of the present invention does not need to have all the effects listed above. Effects other than these can be derived from the description of the specification, the drawings, the claims, and the like.

DETAILED DESCRIPTION OF THE INVENTION

Figure 1:
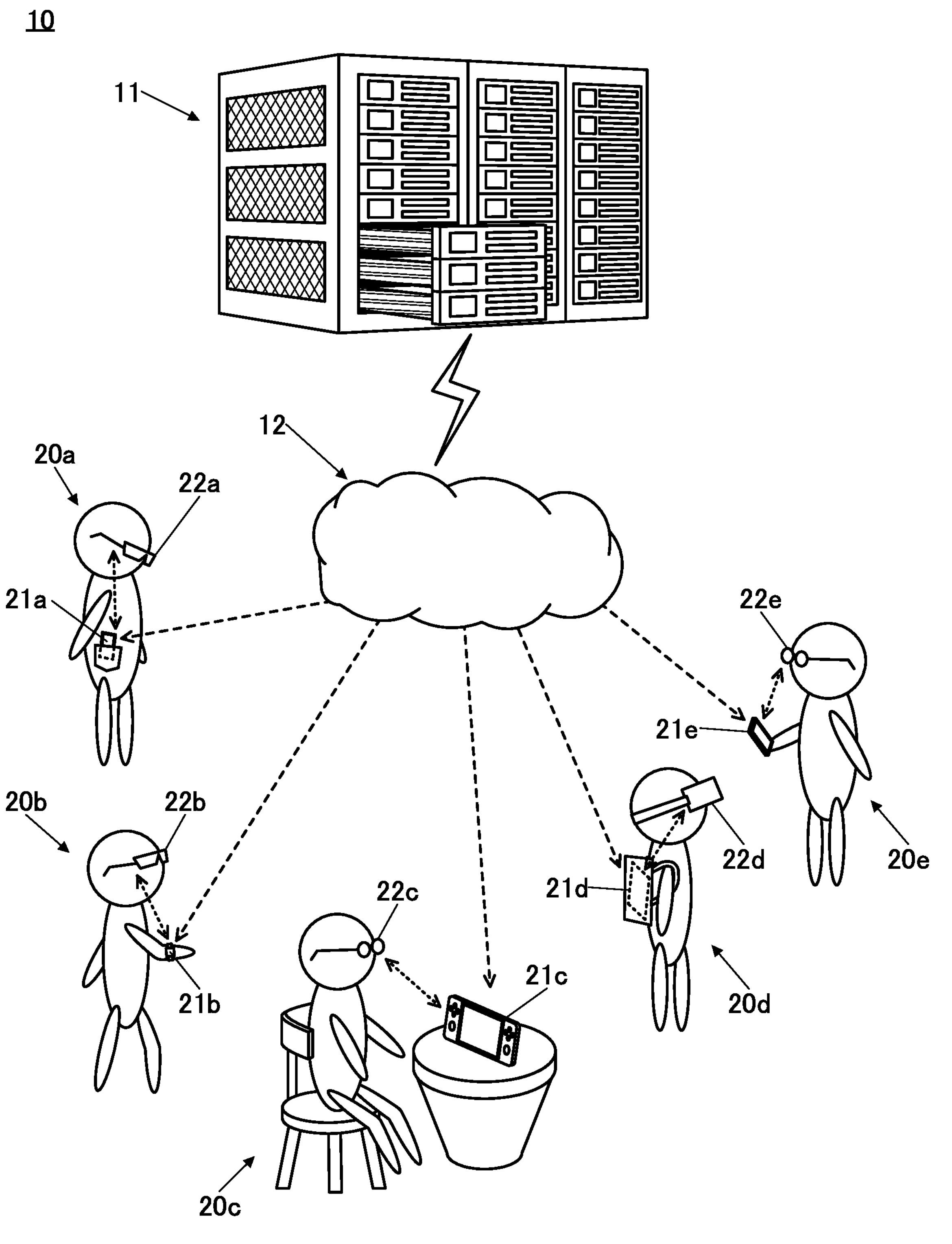
FIG. 1 illustrates a structure example of a display system.

Embodiments will be described below with reference to the drawings. Note that the embodiments can be implemented with many different modes, and it will be readily understood by those skilled in the art that modes and details thereof can be changed in various ways without departing from the spirit and scope thereof. Therefore, the present invention should not be construed as being limited to the description of embodiments below.

Note that in structures of the invention described below, the same portions or portions having similar functions are denoted by the same reference numerals in different drawings, and the description thereof is not repeated. The same hatching pattern is used for portions having similar functions, and the portions are not denoted by specific reference numerals in some cases.

Note that in each drawing described in this specification, the size, the layer thickness, or the region of each component is exaggerated for clarity in some cases. Therefore, the size, the layer thickness, or the region is not limited to the illustrated scale.

Note that in this specification and the like, ordinal numbers such as "first" and "second" are used in order to avoid confusion among components and do not limit the number of components.

In this specification and the like, a display apparatus may be rephrased as an electronic device.

In this specification and the like, a device formed using a metal mask or a fine metal mask (FMM) may be referred to as a device having a metal mask (MM) structure. In this specification and the like, a device formed without using a metal mask or an FMM may be referred to as a device having a metal maskless (MML) structure.

Embodiment 1

In this embodiment, structure examples of a display system and a display apparatus of one embodiment of the present invention, for example, are described.

The display system of one embodiment of the present invention includes a wearable display apparatus typified by a head mounted display (HMD). An example of a display apparatus that can be used for the display system is a non-transmissive display apparatus that displays a picture while covering the entire field of view, such as a goggle-type display apparatus. Another example is a transmissive display apparatus that displays a picture so that the picture is superimposed on the actual scenery viewed through the screen.

The display system includes a terminal besides the wearable display apparatus. The terminal includes a first communication portion for connection to a server through a network. The terminal further includes a second communication portion for communication with the wearable display apparatus. Such a structure is simple and eliminates the need of any direct communication of the wearable display apparatus with the server and allows near field communication with the terminal held by a user. This leads to a light-weight wearable display apparatus and allows the user to wear the apparatus more comfortably.

A display panel included in the wearable display apparatus has a high aperture ratio, high resolution, high definition (a large number of pixels), and high color reproducibility.

The aperture ratio (effective emission area ratio) of the display panel is higher than or equal to 10% and lower than or equal to 100%, preferably higher than or equal to 20% and lower than or equal to 95%, further preferably 30% and lower than or equal to 93%, and still further higher than or equal to 40% and lower than or equal to 90%. In particular, an increased aperture ratio makes the display portion, where images are magnified with a lens or the like for viewing, more immersive because the pixel graininess is rendered almost invisible.

The display panel preferably has a higher resolution. The resolution of the display panel can be 500 ppi or higher, preferably 800 ppi or higher, further preferably 1000 ppi or higher, still further preferably 2000 ppi or higher, and yet further preferably 3000 ppi or higher, and 10000 ppi or lower, 8000 ppi or lower, or 6000 ppi or lower, for example. As the resolution increases, the sense of immersion can be enhanced.

The display panel preferably has a higher definition. For example, the definition of the display panel is preferably as extremely high as HD (1280×720 effective pixels), FHD (1920×1080 effective pixels), WQHD (2560×1440 effective pixels), WQXGA (2560×1600 effective pixels), 4K (3840×2160 effective pixels), or 8K (7680×4320 effective pixels), and preferably 4K2K, 8K4K, or higher, in particular.

According to the display panel, there is preferably a small difference in color between low luminance display and high luminance display. According to the display panel of one embodiment of the present invention, in an emission spectrum of blue display provided by a display portion at a first luminance, the intensity of a first emission peak at a wavelength higher than or equal to 400 nm and lower than 500 nm is assumed to be 1; in this case, the intensity of a second emission peak at a wavelength higher than or equal to 500 nm and lower than or equal to 700 nm in the emission spectrum is higher than or equal to 0 and lower than or equal to 0.5, and the first luminance is any value higher than 0 $cd/m^2$ and lower than 1 $cd/m^2$. In other words, when blue display is provided in the display panel of one embodiment of the present invention at a low luminance, blue light is mainly observed while light having a wavelength longer than blue light is less observed (including the case where substantially no light having a wavelength longer than blue light is observed). A display panel having such a structure can have high display quality. For specific structure examples of the display panel, Embodiments 2 to 4, for example, can be referred to mainly.

More specific examples will be described below with reference to drawings.

[Display System]

FIG. 1 schematically illustrates a display system 10. The display system 10 includes a server 11, a network 12, and terminals and display apparatuses that are held by users. According to the display system 10 of one embodiment of the present invention, a plurality of users in remote places can experience the same content at the same time by simultaneous communication with the server 11. FIG. 1 illustrates five users (users 20*a* to 20*e*).

In the case where items common to components which are distinguished with use of alphabets, such as the users 20*a* to 20*e*, are described, a reference numeral without the alphabet, such as the user 20, is used in some cases.

A terminal 21 has a function of communication with the server 11 through the network 12, and a variety of devices can be used as the terminal 21. For example, a portable information terminal such as a smartphone, a tablet terminal, or a mobile phone can be used. The terminal 21 does not necessarily include a display portion.

A display apparatus 22 has a function of communication with the terminal 21 with or without a wire and can be worn on the head of the user 20. As the display apparatus 22, an immersive (non-transmissive) or transmissive HMD can be used, for example. A goggle- or glasses-type structure, a structure worn on one eye, or the like can be used as the display apparatus 22.

The user 20*a* has a terminal 21*a* and a display apparatus 22*a*. The terminal 21*a* is put in a user's clothes pocket. The terminal 21*a* functions as a smartphone, for example. The user 20*a* also wears the display apparatus 22*a*. The user 20*b* wears a terminal 21*b* on the user's arm and the display apparatus 22*b* on the head. The terminal 21*b* functions as a watch-type information terminal. The user 20*c* wears a display apparatus 22*c* while sitting on a chair, and a terminal 21*c* is put on a nearby table. The terminal 21*c* functions as a game machine. A user 20*d* has a terminal 21*d* in the user's backpack and also wears a display apparatus 22*d*. The terminal 21*d* functions as a tablet terminal. A user 20*e* holds a terminal 21*e* in the user's hand and wears a display apparatus 22*e*.

The terminal 21 held by the user 20 can communicate with the server 11 through the network 12. The server 11 has a function of offering some kind of processing in response to the need from clients. The server 11 may be composed of hardware such as a computer and software that runs on the hardware. Note that an external view of a large computer as an example of the server 11 is shown in FIG. 1. The server 11 may include a so-called supercomputer capable of large-scale arithmetic processing, in addition to a large-scale storage.

The terminal 21 and the display apparatus 22 can perform mutual communication as indicated by the dotted lines. The terminal 21 can transmit visual data and audio data supplied from the server 11 to the display apparatus 22. The terminal 21 can transmit input information from the user 20 to the server 11 through the network 12.

The information input by the user 20 can be obtained by a sensor included in the terminal 21 or the display apparatus 22. Alternatively, an input device such as a controller, a stick, or a glove may be used besides the terminal 21 and the display apparatus 22. Examples of the sensor include cameras, acceleration sensors, and touch sensors (including contactless sensors). Examples of the input information include information on touches (including contactless input), gestures with fingers or arms, the attitude or motion of part or the whole of the body, the number of steps, and positions.

The display system 10, which does not necessarily need any equipment, can be used at any place accessible to the network 12, such as user's home, for example. Alternatively, the display system 10 may be used in limited facilities such as amusement facilities, entertainment facilities, or recreation halls.

[Examples of Content]

Examples of the content that the user 20 can enjoy using the display system 10 are described.

Figure 2A:
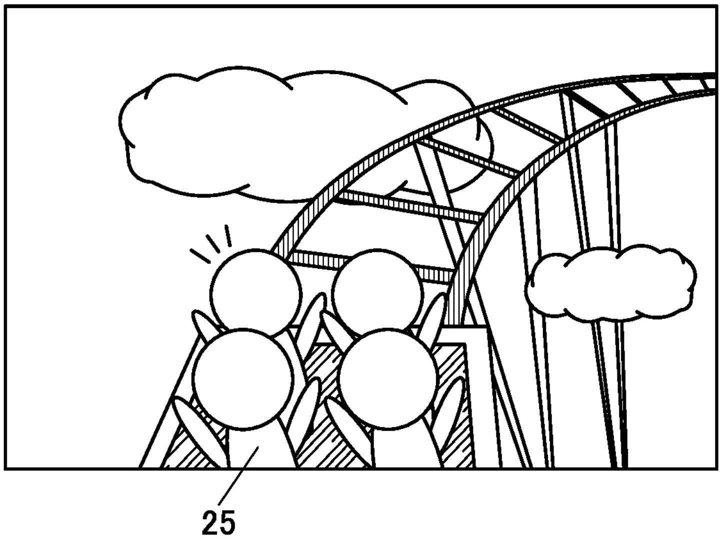
FIGS. 2A and 2B each illustrate a content example.

FIG. 2A illustrates an example of a content for roller coaster experiences. In FIG. 2A, a plurality of avatars 25 are riding on a roller coaster running above clouds. The images presented to the user 20 correspond to the field of view of any of the plurality of avatars 25, so that the user 20 can have such an unreal experience of riding on the roller coaster running above the clouds. The plurality of avatars 25 are riding on the roller coaster and linked to the different users 20.

The avatar 25 preferably moves along with the input information from the user 20. The avatar 25 turns his/her eyes or changes the posture along with the motion of the user 20, such as turning his/her eyes, head, or body. The avatar 25 raises a hand when the user 20 raises a hand. In addition, when the user 20 speaks, the avatar 25 makes a sound in response thereto and the other users 20 linked to the other avatars 25 can hear the sound. This enables a scream uttered by another user 20 who is virtually riding on the same roller coaster to be heard in real time, encouraging a sense of reality.

Figure 2B:
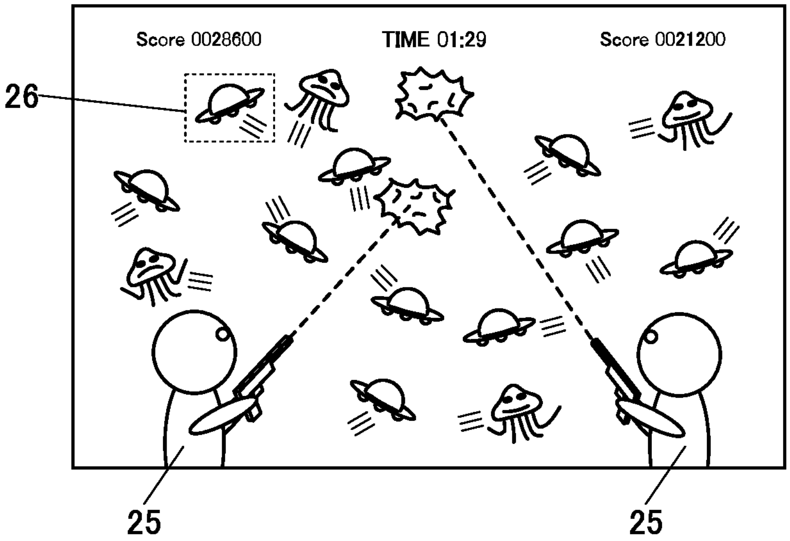

FIG. 2B illustrates an example a content for a shooter game. The example in FIG. 2B is a content of a match game in which the avatars 25 are operated to break a targeted object 26 to compete for points. In FIG. 2B, suspended airvehicles and strange living objects are examples of the object 26. The points (indicated as "Score") scored by the users 20 and the remaining time (indicated as "TIME") are displayed on the upper portion of the image. Although two avatars 25 are illustrated in FIG. 2B, three or more avatars 25 can join at the same time. Instead of the object 26, any of the avatars 25 may be targeted.

[Structure Example of Display System]

Hereinafter, a more specific structure example of the display system 10 will be described.

Figure 3:
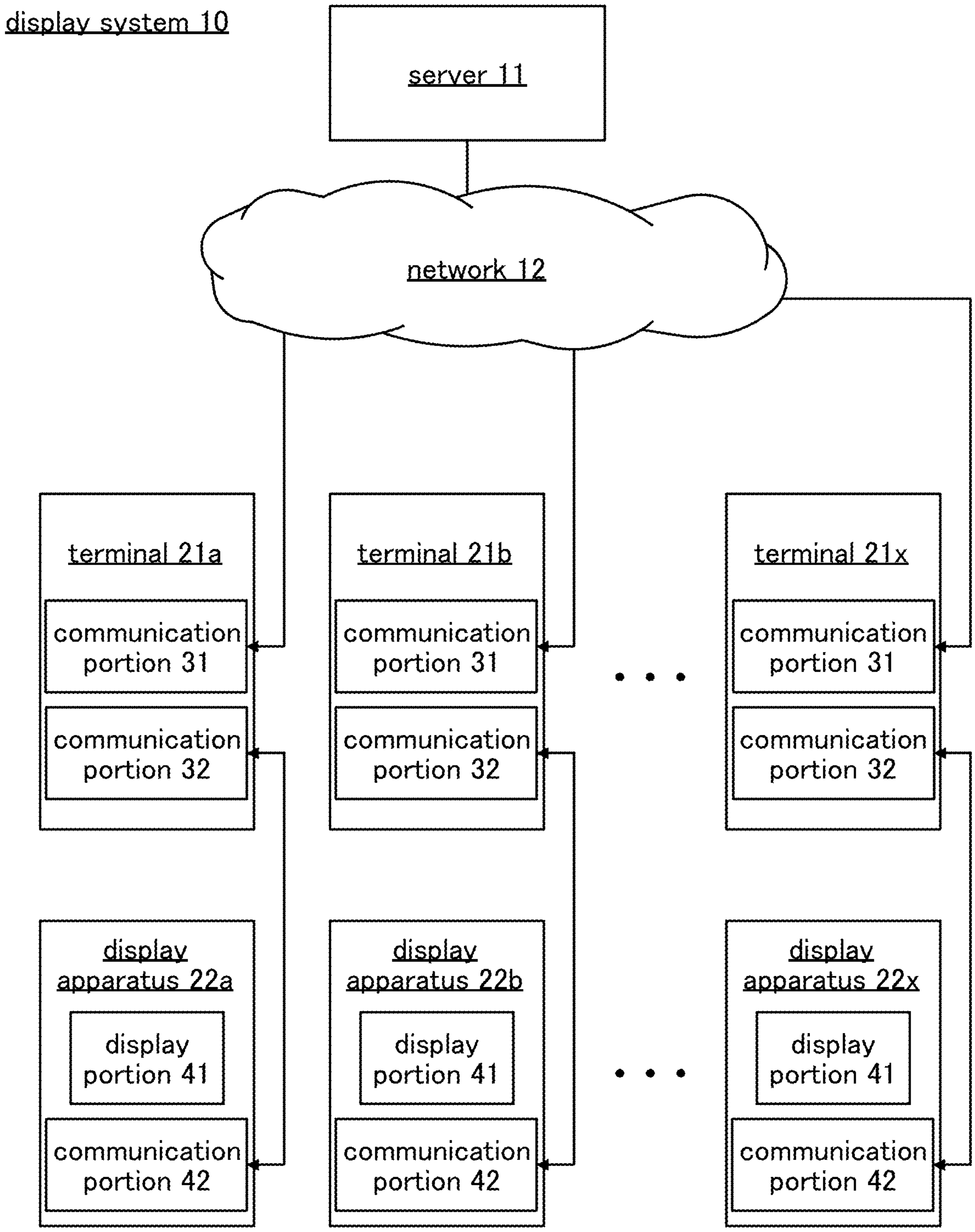
FIG. 3 illustrates a structure example of a display system.

FIG. 3 is a block diagram of a structure example of the display system 10. The display system 10 includes the server 11, the network 12, one or more terminals 21, and one or more display apparatuses 22 (display apparatuses 22*a* to 22*x*). In this example, x terminals 21 (terminals 21*a* to 21*x*) are connected, where x is a natural number.

The terminal 21 includes a communication portion 31 for communication with the server 11 through the network 12 and a communication portion 32 for communication with the display apparatus 22. The display apparatus 22 includes a display portion 41 for displaying an image and a communication portion 42 for communication with the terminal 21.

For wireless communication between the communication portion 31 and the server 11 through the network 12, the communication portion 31 can have an antenna. Examples of the network 12 as a communication means (a communication method) between the communication portion 31 and the server 11 include computer networks such as the Internet, which is the infrastructure of the World Wide Web (WWW), an intranet, an extranet, a personal area network (PAN), a local area network (LAN), a campus area network (CAN), a metropolitan area network (MAN), a wide area network (WAN), and a global area network (GAN). For wireless communication, it is possible to use, as a communication protocol or a communication technology, such as the third-generation mobile communication system (3G), the fourth-generation mobile communication system (4G), or the fifth-generation mobile communication system (5G), or a communication standard developed by IEEE such as Wi-Fi (registered trademark) or Bluetooth (registered trademark).

A communication means similar to the above can be applied to the communication between the communication portions 32 and 42. Note that the communication between the communication portions 32 and 42 does not necessarily require a large-scale network because this is a relatively close-range communication. For example, a home area network such as a PAN or a LAN can be used for home use. Without through any network, an intercommunication function between the two devices may be used. The communication portions 32 and 42 may be connected to each other through a cable to perform wired communication.

In the display apparatus 22, the display portion 41 has one or both of a function of displaying a content of augmented reality (AR) and a function of displaying a content of virtual reality (VR). Note that the display apparatus 22 may also have a function of displaying a content of substitutional reality (SR) or a content of mixed reality (MR), in addition to contents of AR and VR. The display apparatus 22 having a function of displaying contents of at least one of AR, VR, SR, MR, and the like enables the user to feel a higher level of immersion.

[Specific Examples of Terminal and Display Apparatus]

Figure 4A:
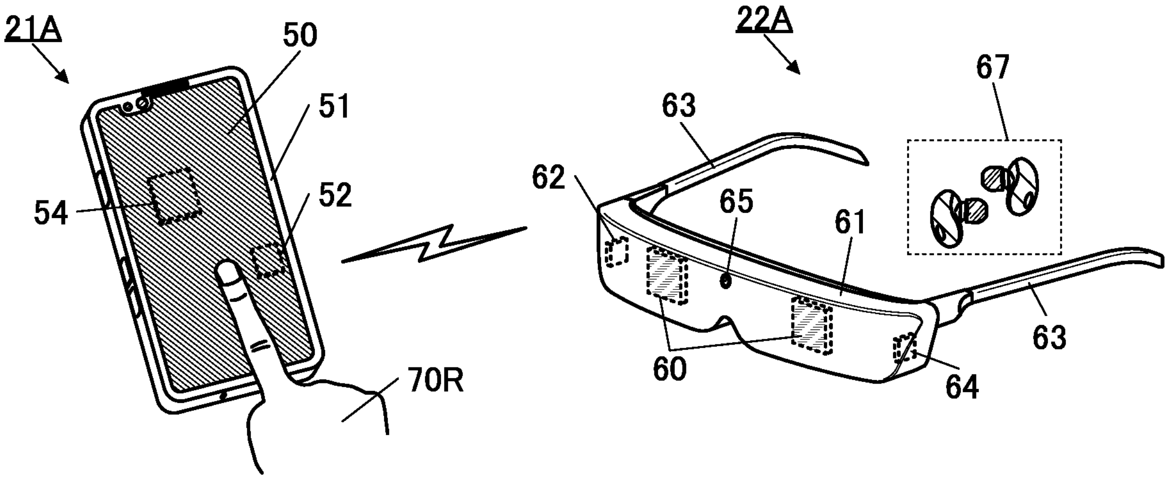
FIGS. 4A to 4C illustrate structure examples of terminals and display apparatuses.
Figure 4B:
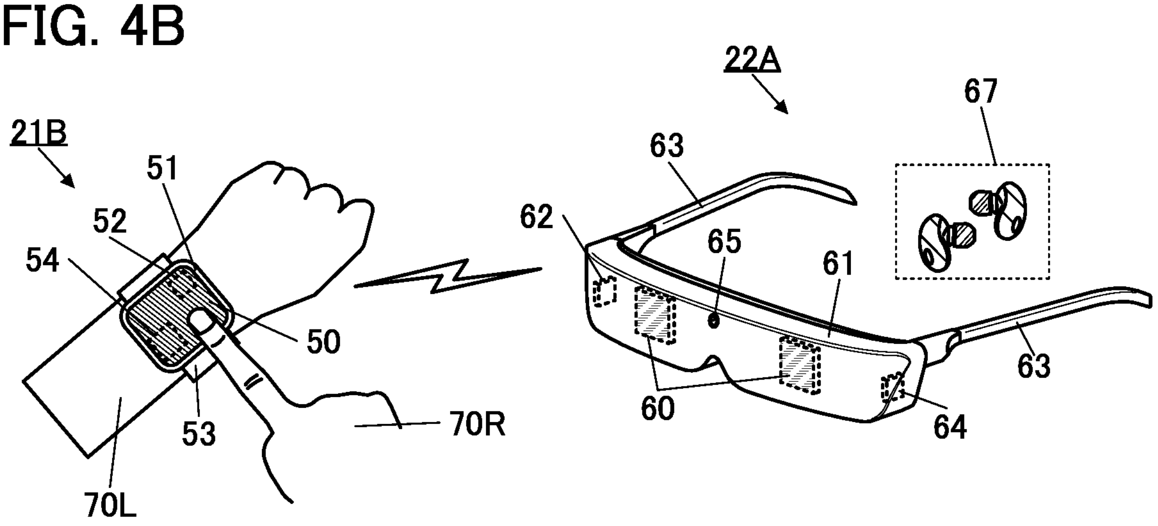
Figure 4C:
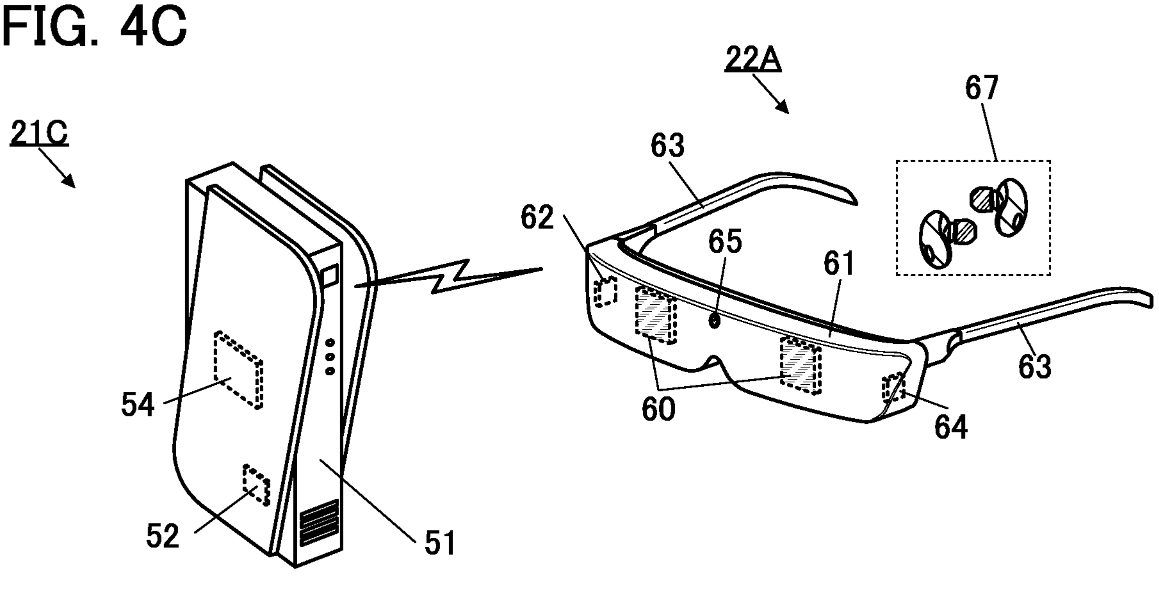

FIGS. 4A to 4C illustrate specific examples of terminals and display apparatuses.

FIG. 4A illustrates a terminal 21A and a display apparatus 22A. The terminal 21A and the display apparatus 22A each have a wireless communication function. The display apparatus 22A has a region where the pixel density is higher than that of the terminal 21A. With the use of the above wireless communication function, part or the whole of the image on the screen of the terminal 21A can be displayed on the display apparatus 22A.

As illustrated in FIG. 4A, a display apparatus may be used as a terminal in the display system of one embodiment of the present invention. That is, a plurality of display apparatuses may be included in the display system. Between the display apparatuses, data can be transmitted by wireless communication, and data in one display apparatus can be partly processed, e.g., upconverted or downconverted to be displayed by another display apparatus. Such a display system enables greater user convenience, image display with the most suitable image quality for an individual display apparatus, or lower power consumption of the display apparatuses.

The terminal 21A includes a display portion 50, a housing 51, a communication portion 52, and a control portion 54. Here, the communication portion 52 functions as the communication portion 31 and also as the communication portion 32. Specifically, the communication portion 52 has both a function of performing communication with the server 11 through the network 12 and a function of performing communication with the display apparatus 22A. Note that FIG. 4A illustrates a right hand 70R of the user operating the display portion 50 that functions as a touch panel.

The display apparatus 22A includes a display portion 60, a housing 61, a communication portion 62, a wearing portion 63, a control portion 64, and a camera portion 65. The wireless communication can be performed between the communication portion 52 and the communication portion 62, as illustrated in FIG. 4A. The communication portion 52 has a function of transmitting information to the display apparatus 22A in accordance with the operation for the terminal 21A. The communication portion 62 has a function of transmitting information to the terminal 21A in accordance with the operation for the display apparatus 22A.

The display apparatus 22A is a goggle-type display apparatus. The camera portion 65 of the display apparatus 22A has a function of obtaining external information. For example, data obtained by the camera portion 65 can be output to the display portion 60 or the display portion 50 of the terminal 21A. The wearing portion 63 of the display apparatus 22A enables the user to put the display apparatus 22A on the head. FIG. 4A shows an example where the wearing portion 63 has a shape like a temple of glasses; however, one embodiment of the present invention is not limited thereto. The wearing portion 63 can have any shape with which the user can wear the electronic device, for example, a shape of a helmet or a band.

The display apparatus 22A has a function of outputting audio to an earphone 67. Here, an example in which audio information is output to the earphone by wireless communication is described. Note that one embodiment is not limited to this example. The earphone 67 and the display apparatus 22A may be connected by a cable so that audio information can be output through the cable.

Although an example where the camera portion 65 is provided is shown here, a range sensor capable of measuring a distance between the user and an object (hereinafter also referred to as a detection portion) just needs to be provided. In other words, the camera portion 65 is one embodiment of the detection portion. As the detection portion, an image sensor or a range image sensor such as a light detection and ranging (LiDAR) sensor can be used, for example. By using images obtained by the camera and images obtained by the range image sensor, more information can be obtained and a gesture operation with higher accuracy is possible.

A terminal 21B illustrated in FIG. 4B includes the display portion 50, the housing 51, the communication portion 52, a band 53, and the control portion 54. FIG. 4B illustrates a left hand 70L of the user wearing the terminal 21B and the right hand 70R of the user operating the display portion 50 that functions as a touch panel. The structure of the display apparatus 22A illustrated in FIG. 4B is similar to that illustrated in FIG. 4A; thus, the description thereof is omitted here.

The terminal 21A illustrated in FIG. 4A functions as a so-called portable information terminal (typically, a smartphone). The terminal 21B illustrated in FIG. 4B functions as a so-called watch-type portable information terminal. The terminals 21A and 21B each have at least one or both functions of calling and time display. The display apparatus 22A has one or both of a function of displaying an AR content and a function of displaying a VR content. Note that the display apparatus 22A may have a function of displaying SR or MR contents besides AR and/or VR contents. The display apparatus 22A having a function of displaying at least one of AR, VR, SR, and MR contents allows the user to feel a higher level of immersion.

A terminal 21C illustrated in FIG. 4C functions as a game machine. The terminal 21C includes, at least in the housing 51, the communication portion 52 and the control portion 54. The structure of the display apparatus 22A illustrated in FIG. 4C is similar to that illustrated in FIG. 4A; thus, the description thereof is omitted here.

The terminal 21C includes a processor, a storage, and the like. With the terminal 21C, the user can start an application and enjoy a variety of game contents. The terminal 21C is capable of executing not only game contents but also applications such as video replay, image reproduction, music replay, and an Internet browser. The terminal 21C can also be used as a personal computer.

Figure 5A:
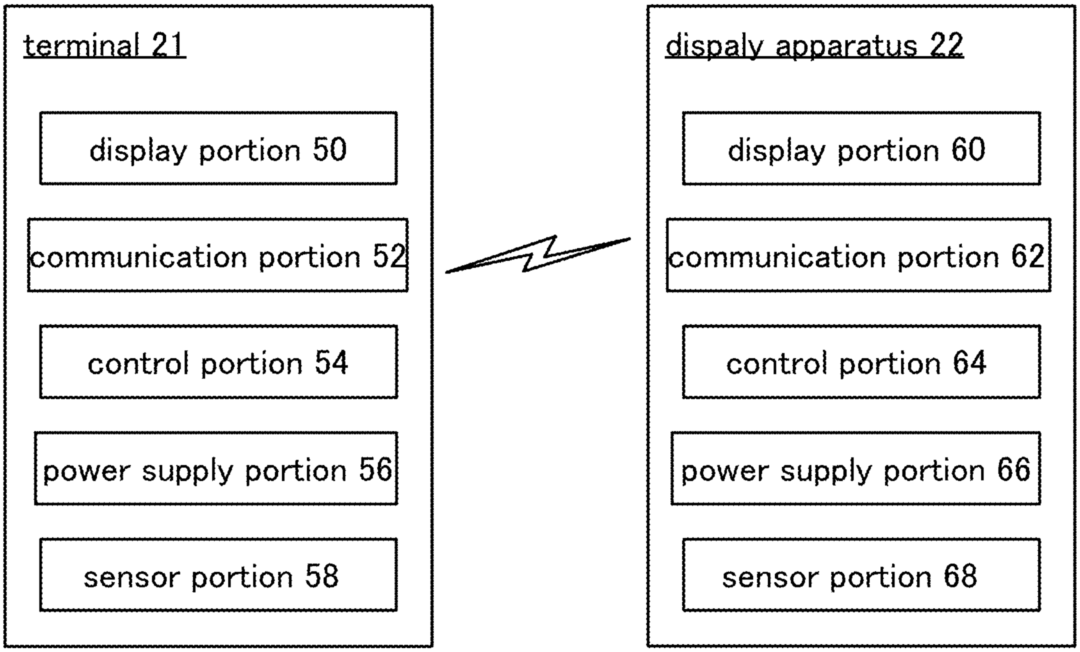
FIGS. 5A and 5B each illustrate a structure example of a terminal and a display apparatus.

FIG. 5A is a block diagram illustrating structure examples of the terminal 21 and the display apparatus 22. The terminal 21 includes the display portion 50, the communication portion 52, the control portion 54, a power supply portion 56, and a sensor portion 58. As illustrated in FIG. 5A, the display apparatus 22 includes the display portion 60, the communication portion 62, the control portion 64, a power supply portion 66, and a sensor portion 68.

Although FIG. 5A illustrates the structure in which the terminal 21 and the display apparatus 22 have the same function, one embodiment of the present invention is not limited to this structure. For example, the terminal 21 and the display apparatus 22 may have different functions, as illustrated in FIG. 5B.

Figure 5B:
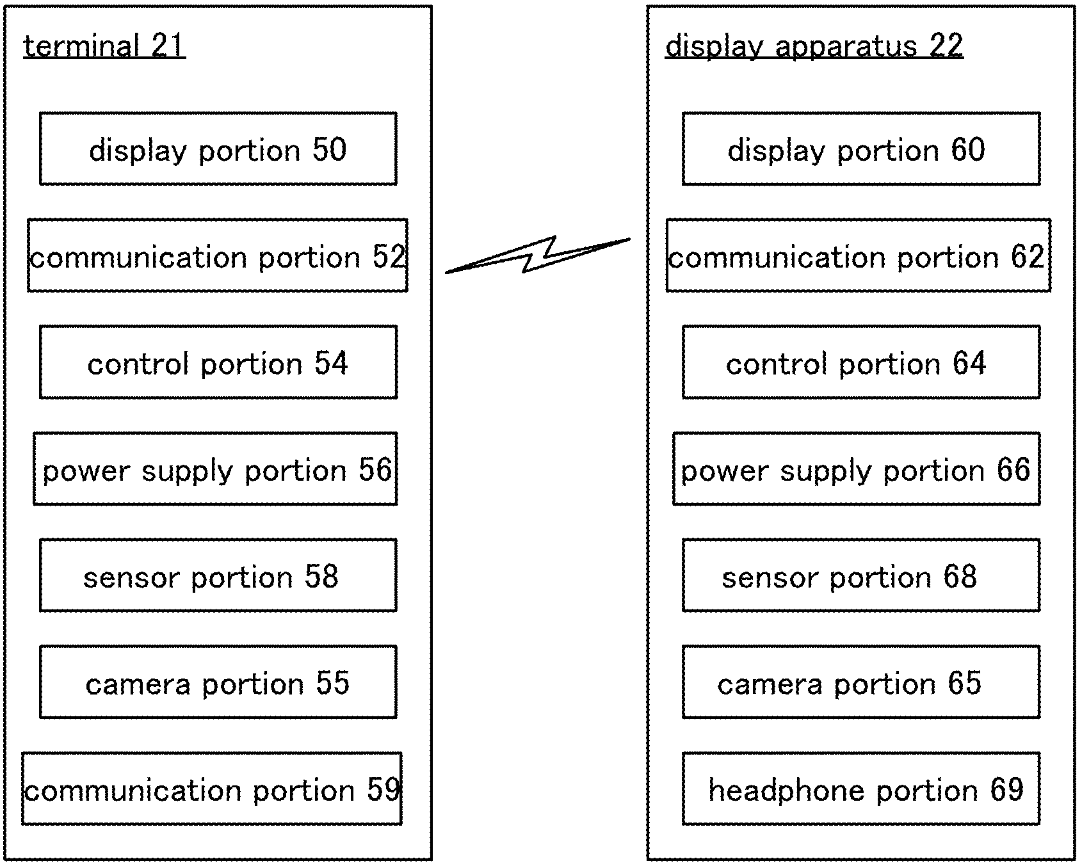

In FIG. 5B, the terminal 21 includes the camera portion 55 (also referred to as detection portion) and a second communication portion 59 in addition to the components illustrated in FIG. 5A. The display apparatus 22 includes the camera portion 65 and a headphone portion 69 in addition to the components illustrated in FIG. 5A. The camera portion 55 includes an imaging portion such as an image sensor. Moreover, a plurality of cameras may be provided so as to support a plurality of fields of view, such as a telescope field of view and a wide field of view. The second communication portion 59 can have a communication function different from that of the communication portion 52. For example, the communication portion 52 has a function of performing communication with the communication portion 62, and the second communication portion 59 has a communication means that enables audio call, electronic payment, or the like utilizing the third-generation mobile communication system (3G), the fourth-generation mobile communication system (4G), the fifth-generation mobile communication system (5G), or the like.

The display portion 60 preferably has a higher definition than the display portion 50. For example, the definition of the display portion 50 can be HD (1280×720 pixels), FHD (1920×1080 pixels), or WQHD (2560×1440 pixels). The definition of the display portion 60 is preferably as extremely high as WQXGA (2560×1600 pixels), 4K (3840×2160 pixels), or 8K (7680×4320 pixels), and preferably 4K2K, 8K4K, or higher, in particular.

The display portion 60 preferably has a higher pixel density (resolution) than the display portion 50. For example, the pixel density of the display portion 50 can be higher than or equal to 100 ppi and lower than 1000 ppi, preferably higher than or equal to 300 ppi and lower than or equal to 800 ppi. The pixel density of the display portion 60 can be higher than or equal to 1000 ppi and lower than or equal to 10000 ppi, preferably higher than or equal to 2000 ppi and lower than or equal to 8000 ppi, further preferably higher than or equal to 3000 ppi and lower than or equal to 6000 ppi.

The aperture ratio (effective emission area ratio) of each of the display portions 50 and 60 is higher than or equal to 10% and lower than or equal to 100%, preferably higher than or equal to 20% and lower than or equal to 95%, further preferably higher than or equal to 30% and lower than or equal to 93%, and still further higher than or equal to 40% and lower than or equal to 90%. In particular, an increased aperture ratio makes the display portion 60, where images are magnified with a lens or the like for viewing, more immersive because the pixel graininess is rendered almost invisible.

In each of the display portions 50 and 60, there is preferably in color between low luminance display and high luminance display. The display panel of one embodiment of the present invention is preferably used for one or both of the display portions 50 and 60. Specifically, in an emission spectrum obtained when the display panel of one embodiment of the present invention displays blue color at the first luminance, when the first emission peak at a wavelength higher than or equal to 400 nm and lower than 500 nm has an intensity of 1, the second emission peak at a wavelength higher than or equal to 500 nm and lower than or equal to 700 nm in the emission spectrum has an intensity higher than or equal to 0 and lower than or equal to 0.5, and the first luminance is any value higher than 0 cd/m$^2$ and lower than 1 cd/m$^2$. In other words, when the display panel of one embodiment of the present invention displays blue color at a low luminance, blue light is mainly observed while light having a wavelength longer than blue light is less observed (including the case where light having a wavelength longer than blue light is substantially not observed). When a display panel having such a structure is used for each of the display portions 50 and 60, high display quality can be achieved.

There is no particular limitation on the screen ratio (aspect ratio) of the display portions 50 and 60. For example, the display portions 50 and 60 are each compatible with a variety of screen ratios such as 1:1 (a square), 3:4, 16:9, and 16:10.

Preferably, the display portion 50 is formed over a glass substrate and the display portion 60 is formed over a silicon substrate. Forming the display portion 50 over a glass substrate reduces the manufacturing costs. However, forming the display portion 50 over a glass substrate might prevent an increase in the pixel density of the display portion

50 (to 1000 ppi or higher typically) due to the manufacturing apparatus. In the display apparatus and the display system of one embodiment of the present invention, the pixel density of the display portion 60 can be increased (to 1000 ppi or higher typically) by forming the display portion 60 over a silicon substrate. In other words, an image with a resolution with which the display portion 50 is incompatible can be displayed on the display portion 60 complementarily.

With the display portion 60 with high definition or resolution, the pixels can be imperceptible (e.g., lines between pixels can be invisible) to the user and accordingly can provide a higher level of one or more of immersion, realistic sensation, and depth.

The terminal 21 has a period during which the display portion does not perform display and, in this period, can function as an input/output means (e.g., controller) for the display apparatus 22. Such a function extends the usage period of the power supply portion 56 in the terminal 21. In other words, the display system of one embodiment of the present invention can achieve power saving. As the power supply portion 56, a lithium-ion secondary battery or the like can be used, for example.

<Display Portion>

The display portions 50 and 60 each have a function of displaying an image. For the display portions 50 and 60, one or more of a liquid crystal display device, a light-emitting device including an organic EL device, and a light-emitting device including a light-emitting diode such as a micro LED can be used. Using a light-emitting device including an organic EL device for the display portions 50 and 60 is preferred in terms of productivity and emission efficiency.

<Communication Portion>

The communication portions 52 and 62 each have a function of wireless or wired communication. The communication portions 52 and 62 preferably have a function of wireless communication to reduce the number of components, such as a connection cable.

When having a wireless communication function, the communication portions 52 and 62 can communicate through an antenna. Examples of the communication means (communication method) that can be used for the communication portions 52 and 62 include computer networks such as the Internet, an intranet, an extranet, a PAN, a LAN, a CAN, a MAN, a WAN, and a GAN. For wireless communication, it is possible to use, as a communication protocol or a communication technology, such as the third-generation mobile communication system (3G), the fourth-generation mobile communication system (4G), or the fifth-generation mobile communication system (5G), or a communication standard developed by IEEE such as Wi-Fi (registered trademark) or Bluetooth (registered trademark).

<Control Portion>

The control portions 54 and 64 each have a function of controlling the display portion. As the control portions 54 and 64, an arithmetic processing device such as a central processing unit (CPU) or a graphics processing unit (GPU) can be used.

<Power Supply Portion>

The power supply portions 56 and 66 each have a function of supplying power to the display portion. As the power supply portions 56 and 66, a primary battery or a secondary battery can be used, for example. A preferred example of the secondary battery is a lithium-ion secondary battery.

<Sensor Portion>

The sensor portions 58 and 68 each have a function of obtaining information on one or more of the senses of sight, hearing, touch, taste, smell, and the like of the user. Specifically, the sensor portion 58 has a function of measuring at least one of force, displacement, position, speed, acceleration, angular velocity, rotational frequency, distance, light, magnetism, temperature, sound, time, electric field, current, voltage, electric power, radiation, humidity, gradient, oscillation, a smell, and infrared rays.

The sensor portion 68 preferably has a function of measuring brain waves in addition to the above function of the sensor portion 58. For example, the sensor portion 68 has a mechanism of measuring brain waves are measured from weak current flowing through electrodes in contact with the user's head. When the sensor portion 68 is capable of measuring brain waves, an image displayed on the display portion 50 or part of the image can be displayed on the user's intended area of the display portion 60. In this case, the user does not use both hands to operate the display apparatus and can perform an input operation or the like with nothing in the hands (in the open-hand state).

At least part of any of the structure examples, the drawings corresponding thereto, and the like described in this embodiment can be implemented in combination with any of the other structure examples, the other drawings corresponding thereto, and the like as appropriate.

Embodiment 2

In this embodiment, the display panel of one embodiment of the present invention is described with reference to FIGS. 6A and 6B, FIGS. 7A to 7C, FIGS. 8A and 8B, FIGS. 9A to 9C, FIGS. 10A to 10C, and FIGS. 11A to 11F.

One embodiment of the present invention is a display panel including a display portion capable of full-color display. The display portion includes a first subpixel and a second subpixel that emit light of different colors. The first-subpixel includes a first light-emitting device that emits blue light and the second subpixel includes a second light-emitting device that emits light of a color different from the color of light emitted by the first light-emitting device. The first light-emitting device includes at least one material in the first light-emitting device is different from at least one material in the second light-emitting device; for example, the light-emitting material in the first light-emitting device is different from that in the second light-emitting device. That is, light-emitting devices for different emission colors are separately formed in the display panel of one embodiment of the present invention. Note that the display portion capable of full-color display includes at least two or more kinds of subpixels that is composed of a subpixel that emits blue light and a subpixel that emits light of color different from blue. An example of the blue light is light with a wavelength higher than or equal to 400 nm and lower than 500 nm.

A structure in which light-emitting layers in light-emitting devices of different colors (e.g., blue (B), green (G), and red (R)) are separately formed or separately patterned may be referred to as a side-by-side (SBS) structure. The SBS structure can optimize materials and structures of light-emitting devices and thus can extend freedom of choice of materials and structures, whereby the luminance and the reliability can be easily improved.

According to the display panel of one embodiment of the present invention, in an emission spectrum of blue display provided by a display portion at a first luminance, the intensity of a first emission peak at a wavelength higher than or equal to 400 nm and lower than 500 nm is assumed to be 1; in this case, the intensity of a second emission peak at a wavelength higher than or equal to 500 nm and lower than or equal to 700 nm in the emission spectrum is higher than or equal to 0 and lower than or equal to 0.5, and the first luminance is any value higher than 0 cd/m$^2$ and lower than 1 cd/m$^2$. In other words, when blue display is provided in the display panel of one embodiment of the present invention at a low luminance, blue light is mainly observed while light having a wavelength longer than blue light is less observed (including the case where substantially no light having a wavelength longer than blue light is observed).

In a light-emitting device having a single structure (including only one light-emitting unit) with a plurality of light-emitting layers emitting light of different colors, the carrier balance cannot be easily adjusted and the emission color at a low luminance might be different from that at a high luminance. For example, in a white light-emitting device having a single structure, the emission color at a low luminance might be different from that at a high luminance.

By contrast, in a light-emitting device with the SBS structure which emits light such as red light, green light, or blue light, the carrier balance can be more easily adjusted and the emission color at a low luminance is less different from that at a high luminance than in a light-emitting device with a single structure which emits white light. Consequently, the display panel of one embodiment of the present invention exhibits a small difference in color between low luminance display and high luminance display and can achieve high display quality.

In the case of manufacturing a display panel including a plurality of light-emitting devices emitting light of different colors, the light-emitting layers each need to be formed in an island shape.

For example, an island-shaped light-emitting layer can be formed by a vacuum evaporation method using a metal mask (also referred to as a shadow mask). However, this method causes a deviation from the designed shape and position of an island-shaped light-emitting layer due to various influences such as the low accuracy of the metal mask position, the positional deviation between the metal mask and a substrate, a warp of the metal mask, and the vapor-scattering-induced expansion of outline of the formed film; accordingly, it is difficult to achieve high resolution and high aperture ratio of the display apparatus. In addition, the outline of the layer may blur during vapor deposition, whereby the thickness of an end portion may be small. That is, the thickness of the island-shaped light-emitting layer may vary from area to area. In the case of manufacturing a display panel with a large size, high definition, or high resolution, the manufacturing yield might be reduced because of low dimensional accuracy of the metal mask and deformation due to heat or the like.

In a method for manufacturing the display panel of one embodiment of the present invention, a first layer (also referred to as an EL layer or part of an EL layer) including a light-emitting layer emitting light of a first color is formed on the entire surface and then a first sacrificial layer is formed over the first layer. Then, a first resist mask is formed over the first sacrificial layer and the first layer and the first sacrificial layer are processed using the first resist mask, whereby the first layer is formed into an island shape. Next, in a manner similar to that of the first layer, a second layer (also referred to as an EL layer or part of an EL layer) including a light-emitting layer emitting light of a second color is processed into an island shape using a second sacrificial layer and a second resist mask.

As a way of processing the light-emitting layer into an island shape, there is performing processing by a photolithography method directly on the light-emitting layer. In this way, damage to the light-emitting layer (e.g., processing damage) might significantly degrade the reliability. In view of the above, in the manufacture of the display panel of one embodiment of the present invention, a sacrificial layer or the like is preferably formed over a layer above the light-emitting layer (e.g., a carrier-transport layer or a carrier-injection layer, and specifically an electron-transport layer or an electron-injection layer), followed by the processing of the light-emitting layer into an island shape. Such a method provides a highly reliable display panel.

As described above, the island-shaped EL layer in the manufacturing method of the display panel of one embodiment of the present invention is formed by processing an EL layer deposited on the entire surface, not by using a metal mask having a fine pattern. Accordingly, a high-resolution display panel or a display panel having a high aperture ratio, which had been difficult to achieve, can be manufactured. Moreover, EL layers of different colors can be formed separately, which enables extremely clear images with a high contrast; thus, a display panel with high display quality can be manufactured. In addition, a sacrificial layer provided over an EL layer can reduce damage to the EL layer in the manufacturing process of the display panel, increasing the reliability of the light-emitting device.

It is difficult to set the distance between adjacent light-emitting devices to be less than 10 μm with a formation method using a metal mask, for example. By contrast, with the above method, the distance can be decreased to be less than 10 μm, 5 μm or less, 3 μm or less, 2 μm or less, or 1 μm or less. For example, with use of an exposure tool for LSI, the distance between adjacent light-emitting devices can be decreased to be less than or equal to 500 nm, less than or equal to 200 nm, less than or equal to 100 nm, or less than or equal to 50 nm. Accordingly, the area of a non-light-emitting region that could exist between two light-emitting devices can be significantly reduced, and the aperture ratio can be close to 100%. For example, the aperture ratio is higher than or equal to 50%, higher than or equal to 60%, higher than or equal to 70%, higher than or equal to 80%, or higher than or equal to 90%; that is, an aperture ratio lower than 100% can be achieved.

Furthermore, the size of the EL layer itself can be made much smaller than that of the case of using a metal mask. For example, in the case of using a metal mask for forming EL layers separately, a variation in the thickness occurs between the center and the edge of the island-shaped EL layer. This causes a reduction in an effective area that can be used as a light-emitting region with respect to the area of the entire EL layer. By contrast, in the above manufacturing method, the film with a uniform thickness is processed, so that island-shaped EL layers can be formed to have a uniform thickness. Accordingly, even when the size of the EL layer is small, almost all the area of the light-emitting layer can be used as a light-emitting region. Thus, the display panel can achieve both high resolution and a high aperture ratio.

Furthermore, in the method for manufacturing a display panel of one embodiment of the present invention, it is preferable to form a sacrificial layer over a layer including a light-emitting layer (which can also be referred to as an EL layer or part of an EL layer) after the EL layer is formed on an entire surface. Then, a resist mask is formed over the sacrificial layer, and the EL layer and the sacrificial layer are processed using the resist mask, whereby an island-shaped EL layer is preferably formed.

Provision of a sacrificial layer over an EL layer can reduce damage to the EL layer during a manufacturing process of the display panel and increase the reliability of the light-emitting device.

Here, each of the first layer and the second layer includes at least a light-emitting layer and preferably consists of a plurality of layers. Specifically, one or more layers are preferably formed over the light-emitting layer. A layer between the light-emitting layer and the sacrificial layer can inhibit the light-emitting layer from being exposed on the outermost surface during the manufacturing process of the display panel and can reduce damage to the light-emitting layer. Accordingly, the reliability of the light-emitting device can be increased. Thus, the first and second layers each preferably include the light-emitting layer and a carrier-transport layer (electron-transport layer or hole-transport layer) over the light-emitting layer.

Note that it is not necessary to form all layers included in the EL layers separately between the light-emitting devices emitting light of different colors, and some layers of the EL layers can be formed in the same step. Examples of layers in the EL layer include a light-emitting layer, carrier-injection layers (a hole-injection layer and an electron-injection layer), carrier-transport layers (a hole-transport layer and an electron-transport layer), carrier-blocking layers (a hole-blocking layer and an electron-blocking layer), and the like. In the method for manufacturing the display panel of one embodiment of the present invention, some layers included in the EL layer are formed into an island shape separately for each color, and then at least part of the sacrificial layer is removed. After that, other layers included in the EL layers and a common electrode (also referred to as an upper electrode) are formed so as to be shared by the light-emitting devices of different colors (formed as one film). For example, the carrier-injection layer and the common electrode can be formed so as to be shared by the light-emitting devices of different colors.

In this specification and the like, a hole or an electron is sometimes referred to as a carrier. Specifically, the hole-injection layer or the electron-injection layer may be referred to as a carrier-injection layer, the hole-transport layer or the electron-transport layer may be referred to as a carrier-transport layer, and the hole-blocking layer or the electron-blocking layer may be referred to as a carrier-blocking layer. Note that the above-described carrier-injection layer, carrier-transport layer, and carrier-blocking layer cannot be distinguished from each other depending on the cross-sectional shape or properties in some cases. One layer may serve as two or three functions of the carrier-injection layer, the carrier-transport layer, and the carrier-blocking layer in some cases.

The carrier-injection layer is often a layer having relatively high conductivity in the EL layer. Therefore, when the carrier-injection layer is in contact with a side surface of any layer included in the EL layer formed in an island shape or a side surface of the pixel electrode, the light-emitting device might be short-circuited. Note that also in the case where the carrier-injection layer is formed in an island shape and the common electrode is shared by light-emitting devices of different colors, the light-emitting device might be short-circuited when the common electrode is in contact with a side surface of the EL layer or a side surface of the pixel electrode.

In view of the above, the display panel of one embodiment of the present invention includes an insulating layer that covers at least a side surface of the island-shaped light-emitting layer. Note that here, the side surface of the island-shaped light-emitting layer refers to the plane that is not parallel to the substrate (or the surface where the light-emitting layer is formed) among the interfaces between the island-shaped light-emitting layer and other layers. The side surface is not necessarily a flat plane or a curved plane in an exactly mathematical perspective.

Thus, at least some layer in the EL layer formed in an island shape and the pixel electrode can be prevented from being in contact with the carrier-injection layer or the common electrode. Hence, a short circuit in the light-emitting device is suppressed, and the reliability of the light-emitting device can be increased.

The insulating layer preferably has a function of a barrier insulating layer against at least one of water and oxygen. The insulating layer preferably has a function of inhibiting the diffusion of at least one of water and oxygen. The insulating layer preferably has a function of capturing or fixing (also referred to as gettering) at least one of water and oxygen.

Note that in this specification and the like, a barrier insulating layer refers to an insulating layer having a barrier property. A barrier property in this specification and the like means a function of inhibiting diffusion of a particular substance (also referred to as a function of less easily transmitting the substance). Alternatively, a barrier property refers to a function of capturing or fixing (also referred to as gettering) a particular sub stance.

When the insulating layer used has a function of the barrier insulating layer or a gettering function, entry of impurities (typically, at least one of water and oxygen) that would diffuse into the light-emitting devices from the outside can be suppressed. With such a structure, a highly reliable light-emitting device and also a highly reliable display panel can be provided.

The display panel of one embodiment of the present invention includes a pixel electrode functioning as an anode; an island-shaped hole-injection layer, an island-shaped hole-transport layer, an island-shaped light-emitting layer, and an island-shaped electron-transport layer that are provided in this order over the pixel electrode; an insulating layer provided to cover side surfaces of the hole-injection layer, the hole-transport layer, the light-emitting layer, and the electron-transport layer; an electron-injection layer provided over the electron-transport layer; and a common electrode that is provided over the electron-injection layer and functions as a cathode.

Alternatively, the display panel of one embodiment of the present invention includes a pixel electrode functioning as a cathode; an island-shaped electron-injection layer, an island-shaped electron-transport layer, an island-shaped light-emitting layer, and an island-shaped hole-transport layer that are provided in this order over the pixel electrode; an insulating layer provided to cover side surfaces of the electron-injection layer, the electron-transport layer, the light-emitting layer, and the hole-transport layer; a hole-injection layer provided over the hole-transport layer; and a common electrode that is provided over the hole-injection layer and functions as an anode.

The hole-injection layer or the electron-injection layer, for example, often has relatively high conductivity in the EL layer. Since the side surfaces of these layers are covered with the insulating layer in the display panel of one embodiment of the present invention, these layers can be prevented from being in contact with the common electrode or the like. Consequently, a short circuit in the light-emitting device can be suppressed, and the reliability of the light-emitting device can be increased.

The insulating layer that covers the side surface of the island-shaped EL layer may have a single-layer structure or a stacked-layer structure.

For example, an insulating layer having a single-layer structure using an inorganic material can be used as a protective insulating layer for the EL layer. This increases the reliability of the display panel.

In the case of stacked insulating layers, the first layer insulating layer is preferably formed using an inorganic insulating material because it is formed in contact with the EL layer. In particular, the first layer is preferably formed by an atomic layer deposition (ALD) method, by which damage due to deposition is small. Alternatively, an inorganic insulating layer is preferably formed by a sputtering method, a chemical vapor deposition (CVD) method, or a plasma-enhanced chemical vapor deposition (PECVD) method, which have higher deposition speed than an ALD method. In that case, a highly reliable display panel can be manufactured with high productivity. The second insulating layer is preferably formed using an organic material to fill a depressed portion formed by the first layer of the insulating layer.

For example, an aluminum oxide film formed by an ALD method can be used as the first layer of the insulating layer, and an organic resin film can be used as the second layer of the insulating layer.

In the case where the side surface of an EL layer and an organic resin film are in direct contact with each other, the EL layer might be damaged by an organic solvent or the like that might be contained in the organic resin film. When an aluminum oxide film formed by an ALD method is used as the first layer of the insulating layer, a structure can be employed in which the organic resin film and the side surface of the EL layer are not in direct contact with each other. Thus, the EL layer can be inhibited from being dissolved by the organic solvent, for example.

In the display panel of one embodiment of the present invention, it is not necessary to provide an insulating layer that covers the end portion of the pixel electrode between the pixel electrode and the EL layer; thus, the distance between adjacent light-emitting devices can be made extremely small. Thus, a display panel with higher resolution or higher definition can be achieved. In addition, a mask for forming the insulating layer is not needed, which leads to a reduction in manufacturing cost of the display panel.

Furthermore, light emitted by the EL layer can be extracted efficiently with a structure where an insulating layer covering the end portion of the pixel electrode is not provided between the pixel electrode and the EL layer, i.e., a structure where an insulating layer is not provided between the pixel electrode and the EL layer. Therefore, the display panel of one embodiment of the present invention can significantly reduce the viewing angle dependence. A reduction in the viewing angle dependence leads to an increase in visibility of an image on the display panel. For example, in the display panel of one embodiment of the present invention, the viewing angle (the maximum angle with a certain contrast ratio maintained when the screen is seen from an oblique direction) can be more than or equal to 100° and less than 180°, preferably more than or equal to 150° and less than or equal to 170°. Note that the viewing angle refers to that in both the vertical direction and the horizontal direction.

To prevent crosstalk, one embodiment of the present invention is not limited to the structure in which the island-shaped EL layers are formed for the respective light-emitting devices. For example, crosstalk can be prevented also by the structure in which a region where the EL layer is thinner is formed between adjacent light-emitting devices. The existence of the region where the EL layer is thinner between adjacent light-emitting devices prevents current flow through the outside of a region of the EL layer that is in contact with the pixel electrode. In the EL layer, the region in contact with the pixel electrode can be used mainly as a light-emitting region.

For example, the ratio of a thickness T1 of the pixel electrode to a thickness T2 of the EL layer, i.e., T1/T2, is preferably higher than or equal to 0.5, further preferably higher than or equal to 0.8, further preferably higher than or equal to 1.0, still further preferably higher than or equal to 1.5. In the region between adjacent light-emitting devices, the thickness T1 of the pixel electrode may be smaller in some cases when a depressed portion is formed in the insulating layer having surface where the pixel electrode is formed (refer to an insulating layer 255*c* described later in Embodiment 3 (see FIG. 18A or the like)). Specifically, the ratio of T3, which is the sum of the thickness of the pixel electrode and the depth of the depressed portion, to the thickness T2 of the EL layer, i.e., T3/T2, is preferably higher than or equal to 0.5, further preferably higher than or equal to 0.8, further preferably higher than or equal to 1.0, still further preferably higher than or equal to 1.5. When T1 and T2, or T2 and T3 have the above relationship, the region where the EL layer is thinner can be formed easily between adjacent light-emitting devices. The EL layer may have a region where the EL layer is extremely thinner, so that part of the EL layer may be separated.

Each of the thickness T1 of the pixel electrode and the sum T3 is, for example, preferably greater than or equal to 160 nm, greater than or equal to 200 nm, or greater than or equal to 250 nm and less than or equal to 1000 nm, less than or equal to 750 nm, less than or equal to 500 nm, less than or equal to 400 nm, or less than or equal to 300 nm.

For example, the angle (also referred to as a taper angle) between the side surface of the pixel electrode and the substrate surface (the surface where a component is formed) is preferably greater than or equal to 60° and less than or equal to 140°, further preferably greater than or equal to 70° and less than or equal to 140°, still further preferably greater than or equal to 80° and less than or equal to 140°. When the taper angle of the pixel electrode has the above value, the region where the EL layer is thinner can be formed easily between adjacent light-emitting devices.

Structure Example 1 of Display Panel

FIGS. 6A and 6B and FIGS. 7A to 7C illustrate the display panel of one embodiment of the present invention.

Figure 6A:
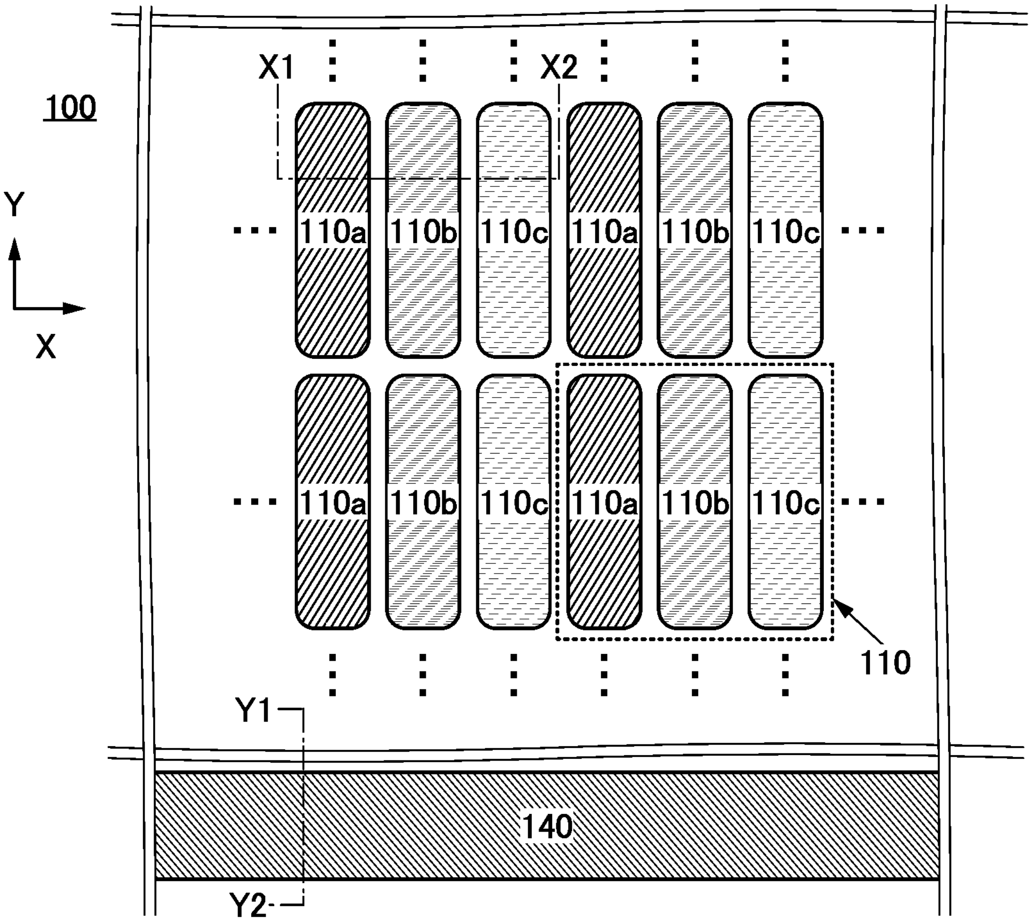
FIG. 6A is a top view illustrating an example of a display panel.

FIG. 6A is a top view of the display panel 100. The display panel 100 includes a display portion in which a plurality of pixels 110 are arranged, and the connection portion 140 placed outside the display portion. A plurality of subpixels are arranged in a matrix in the display portion. FIG. 6A illustrates subpixels arranged in two rows and six columns, which form pixels in two rows and two columns. The connection portion 140 can also be referred to as a cathode contact portion.

The pixel 110 illustrated in FIG. 6A employs stripe arrangement. The pixel 110 in FIG. 6A consists of three types of subpixels 110*a*, 110*b*, and 110*c*. The subpixels 110*a*, 110*b*, and 110*c* each include light-emitting devices that emit light of different colors. The subpixels 110*a*, 110*b*, and 110*c* can be of three colors of red (R), green (G), and blue (B) or of three colors of yellow (Y), cyan (C), and magenta (M), for example. The number of types of subpixels is not limited to three, and four or more types of subpixels may be used. Examples of four subpixels include subpixels emitting light of four colors, R, G, and B, and white (W), subpixels emitting light of four colors R, G, and B, and Y, and subpixels emitting light of colors, R, G, and B and emitting infrared light (IR).

In this specification and the like, the row direction is referred to as X direction and the column direction is referred to as Y direction. The X direction and the Y direction intersect with each other and are, for example, orthogonal to each other (see FIG. 6A).

FIG. 6A illustrates an example where subpixels of different colors are arranged in the X direction and subpixels of the same color are arranged in the Y direction.

Although the top view of FIG. 6A illustrates an example in which the connection portion 140 is positioned in the lower side of the display portion, one embodiment of the present invention is not limited thereto. The connection portion 140 is provided in at least one of the upper side, the right side, the left side, and the lower side of the display portion in the top view, and may be provided so as to surround the four sides of the display portion. The top surface shape of the connection portion 140 can be a belt-like shape, an L shape, a U shape, a frame-like shape, or the like. The number of the connection portions 140 can be one or more.

Figure 6B:
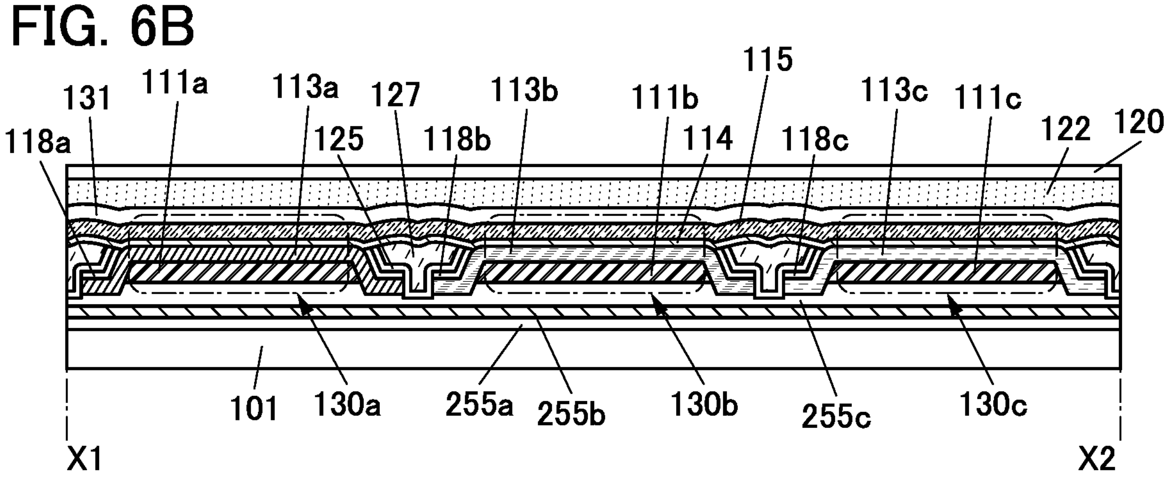
FIG. 6B is a cross-sectional view illustrating the example of a display panel.
Figure 7A:
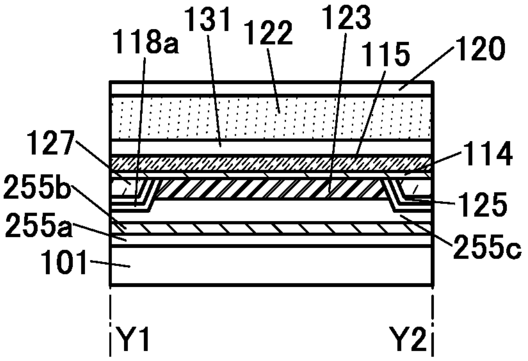
FIGS. 7A to 7C are cross-sectional views each illustrating the example of a display panel.
Figure 7B:
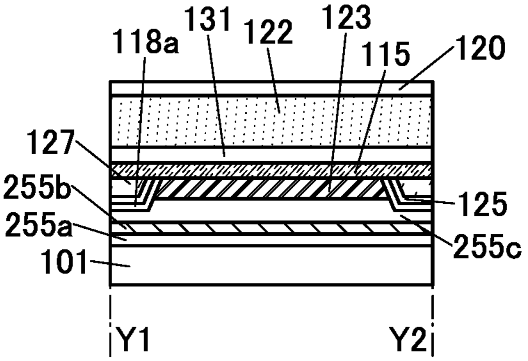
Figure 7C:
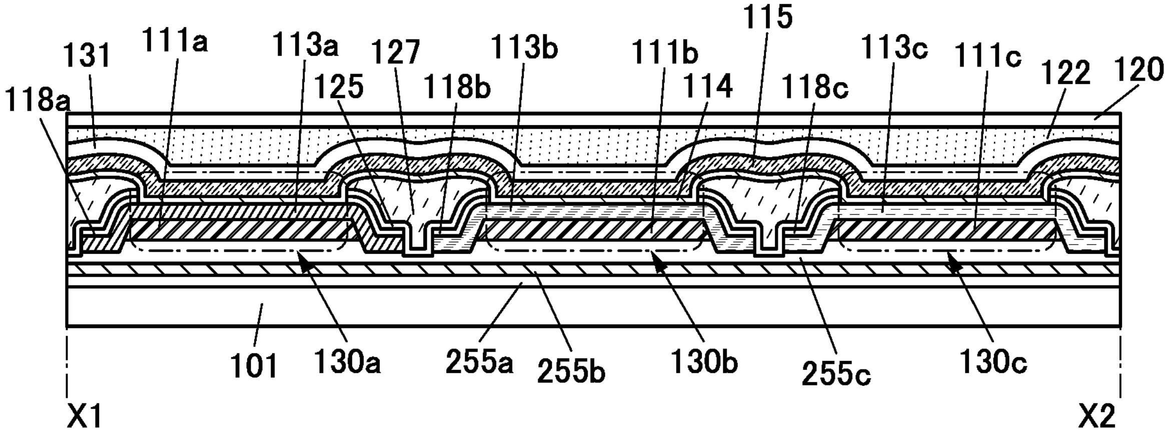

FIG. 6B and FIG. 7C are cross-sectional views along dashed-dotted line X1-X2 in FIG. 6A. FIG. 7A and FIG. 7B are cross-sectional views taken along dashed-dotted line Y1-Y2 in FIG. 6A.

FIGS. 8A and 8B, FIGS. 9A to 9C, and FIGS. 10A to 10C each illustrate a cross section along dashed-dotted line X1-X2 and a cross section along dashed-dotted line Y1-Y2 in FIG. 6A side by side.

As illustrated in FIG. 6B, the display panel 100 includes insulating layers over a layer 101 including a transistor, light-emitting devices 130*a*, 130*b*, and 130*c* over the insulating layers, and a protective layer 131 provided to cover these light-emitting devices. A substrate 120 is bonded to the protective layer 131 with a resin layer 122. In a region between the adjacent light-emitting devices, an insulating layer 125 and an insulating layer 127 on the insulating layer 125 are provided.

Although FIG. 6B and the like show cross sections of a plurality of insulating layers 125 and a plurality of insulating layers 127, the insulating layers 125 are connected to each other and the insulating layers 127 are connected to each other when the display panel 100 is seen from above. In other words, the display panel 100 can have a structure such that one insulating layer 125 and one insulating layer 127 are provided, for example. Note that the display panel 100 may include a plurality of insulating layers 125 which are separated from each other and a plurality of insulating layers 127 which are separated from each other.

The display panel of one embodiment of the present invention can have any of the following structures: a top-emission structure in which light is emitted in a direction opposite to the substrate where the light-emitting device is formed, a bottom-emission structure in which light is emitted toward the substrate where the light-emitting device is formed, and a dual-emission structure in which light is emitted toward both surfaces.

The layer 101 including a transistor can employ a stacked-layer structure in which a plurality of transistors are provided over a substrate and an insulating layer is provided to cover these transistors, for example. The insulating layer over the transistors may have a single-layer structure or a stacked-layer structure. In FIG. 6B and the like, an insulating layer 255*a*, an insulating layer 255*b* over the insulating layer 255*a*, and the insulating layer 255*c* over the insulating layer 255*b* are illustrated as the insulating layer over the transistors. These insulating layers may have a depressed portion between adjacent light-emitting devices. In the example shown in FIG. 6B and the like, the insulating layer 255*c* has a depressed portion. Note that the insulating layers 255*a*, 255*b*, and 255*c* can be considered as the components of the layer 101 including a transistor.

As each of the insulating layers 255*a*, 255*b*, and 255*c*, a variety of inorganic insulating films such as an oxide insulating film, a nitride insulating film, an oxynitride insulating film, and a nitride oxide insulating film can be suitably used. As each of the insulating layers 255*a* and 255*c*, an oxide insulating film or an oxynitride insulating film, such as a silicon oxide film, a silicon oxynitride film, or an aluminum oxide film, is preferably used. As the insulating layer 255*b*, a nitride insulating film or a nitride oxide insulating film, such as a silicon nitride film or a silicon nitride oxide film, is preferably used. Specifically, it is preferred that silicon oxide films be used as the insulating layers 255*a* and 255*c* and a silicon nitride film be used as the insulating layer 255*b*. The insulating layer 255*b* preferably has a function of an etching protective film.

Note that in this specification and the like, oxynitride refers to a material that contains more oxygen than nitrogen, and nitride oxide refers to a material that contains more nitrogen than oxygen. For example, silicon oxynitride refers to a material which contains oxygen at a higher proportion than nitrogen, and silicon nitride oxide refers to a material which contains nitrogen at a higher proportion than oxygen.

The light-emitting devices 130*a*, 130*b*, and 130*c* emit light of different colors. Preferably, the light-emitting devices 130*a*, 130*b*, and 130*c* emit light of three colors, red (R), green (G), and blue (B), for example.

As the light-emitting devices 130*a*, 130*b*, and 130*c*, EL devices such as organic light-emitting diodes (OLEDs) or quantum-dot light-emitting diodes (QLEDs) are preferably used. Examples of light-emitting substances included in EL devices include a substance exhibiting fluorescence (a fluorescent material), a substance exhibiting phosphorescence (a phosphorescent material), an inorganic compound (e.g., a quantum dot material), and a substance exhibiting thermally activated delayed fluorescence (a thermally activated delayed fluorescent (TADF) material). As a TADF material, a material that is in thermal equilibrium between a singlet excited state and a triplet excited state may be used. Such a TADF material has a shorter light emission lifetime (excitation lifetime) and thus can inhibit a reduction in efficiency of the light-emitting device in a high-luminance region.

The light-emitting device includes an EL layer between a pair of electrodes. The EL layer includes at least a light-emitting layer. In this specification and the like, one of the pair of electrodes may be referred to as a pixel electrode and the other may be referred to as a common electrode.

One of the pair of electrodes of the light-emitting device functions as an anode, and the other electrode functions as a cathode. The case where the pixel electrode functions as an anode and the common electrode functions as a cathode will be described below as an example.

The end portions of the pixel electrodes 111*a*, 111*b*, and 111*c* each preferably have a tapered shape. When the end portions of these pixel electrodes have a tapered shape, a first layer 113*a*, a second layer 113*b*, and a third layer 113*c* provided along the side surfaces of the pixel electrodes also have a tapered shape. When the side surface of the pixel electrode has a tapered shape, the coverage with the EL layer provided along the side surface of the pixel electrode can be increased. When the side surface of the pixel electrode has a tapered shape, foreign matter (such as dust or particles) in the manufacturing process is easily removed by processing such as cleaning, which is preferable.

Note that in this specification and the like, a tapered shape refers to a shape such that at least part of a side surface of a component is inclined with respect to the substrate surface. For example, a tapered shape preferably includes a region where the angle between the inclined side surface and the substrate surface (such an angle is also referred to as a taper angle) is less than 90°.

The light-emitting device 130*a* includes a pixel electrode 111*a* over the insulating layer 255*c*, an island-shaped first layer 113*a* over the pixel electrode 111*a*, a common layer 114 over the island-shaped first layer 113*a*, and a common electrode 115 over the common layer 114. In the light-emitting device 130*a*, the first layer 113*a* and the common layer 114 can be collectively referred to as an EL layer.

The light-emitting device 130*b* includes a pixel electrode 111*b* over the insulating layer 255*c*, an island-shaped second layer 113*b* over the pixel electrode 111*b*, a common layer 114 over the island-shaped second layer 113*b*, and a common electrode 115 over the common layer 114. In the light-emitting device 130*b*, the second layer 113*b* and the common layer 114 can be collectively referred to as an EL layer.

The light-emitting device 130*c* includes a pixel electrode 111*c* over the insulating layer 255*c*, an island-shaped third layer 113*c* over the pixel electrode 111*c*, a common layer 114 over the island-shaped third layer 113*c*, and a common electrode 115 over the common layer 114. In the light-emitting device 130*c*, the third layer 113*c* and the common layer 114 can be collectively referred to as an EL layer.

There is no particular limitation on the structure of the light-emitting device in this embodiment, and the light-emitting device can have a single structure or a tandem structure.

In this embodiment, in the EL layer included in the light-emitting device, the island-shaped layers provided in each light-emitting device are referred to as the first layer 113*a*, the second layer 113*b*, and the third layer 113*c*, and the layer shared by a plurality of light-emitting devices is referred to as the common layer 114.

The first layer 113*a*, the second layer 113*b*, and the third layer 113*c* each include at least a light-emitting layer. Preferably, the first layer 113*a*, the second layer 113*b*, and the third layer 113*c* include a light-emitting layer that emits red light, a light-emitting layer that emits green light, and a light-emitting layer that emits blue light, respectively, for example.

The first layer 113*a*, the second layer 113*b*, and the third layer 113*c* may each include one or more of a hole-injection layer, a hole-transport layer, a hole-blocking layer, a charge generation layer, an electron-blocking layer, an electron-transport layer, and an electron-injection layer.

The first layer 113*a*, the second layer 113*b*, and the third layer 113*c* may include a hole-injection layer, a hole-transport layer, a light-emitting layer, and an electron-transport layer, for example. In addition, an electron-blocking layer may be provided between the hole-transport layer and the light-emitting layer. Furthermore, an electron-injection layer may be provided over the electron-transport layer.

The first layer 113*a*, the second layer 113*b*, and the third layer 113*c* may include an electron-injection layer, an electron-transport layer, a light-emitting layer, and a hole-transport layer in this order, for example. In addition, a hole-blocking layer may be provided between the electron-transport layer and the light-emitting layer. Furthermore, a hole-injection layer may be provided over the hole-transport layer.

The first layer 113*a*, the second layer 113*b*, and the third layer 113*c* each preferably include a light-emitting layer and the carrier-transport layer (electron-transport layer or hole-transport layer) over the light-emitting layer. Since the surfaces of the first layer 113*a*, the second layer 113*b*, and the third layer 113*c* are exposed in the manufacturing process of the display panel, providing the carrier-transport layer over the light-emitting layer prevents the light-emitting layer from being exposed on the outermost surface, so that damage to the light-emitting layer can be reduced. Thus, the reliability of the light-emitting device can be increased.

The first layer 113*a*, the second layer 113*b*, and the third layer 113*c* each include a first light-emitting unit, a charge generation layer, and a second light-emitting unit, for example. Preferably, the first layer 113*a*, the second layer 113*b*, and the third layer 113*c* include two or more light-emitting units that emit red light, two or more light-emitting units that emit green light, and two or more light-emitting units that emit blue light, respectively, for example.

It is preferable that the second light-emitting unit include a light-emitting layer and a carrier-transport layer (an electron-transport layer or a hole-transport layer) over the light-emitting layer. Since the surface of the second light-emitting unit is exposed in the manufacturing process of the display panel, providing the carrier-transport layer over the light-emitting layer prevents the light-emitting layer from being exposed on the outermost surface, so that damage to the light-emitting layer can be reduced. Thus, the reliability of the light-emitting device can be increased.

The common layer 114 includes, for example, an electron-injection layer or a hole-injection layer. Alternatively, the common layer 114 may be a stack of an electron-transport layer and an electron-injection layer, and may be a stack of a hole-transport layer and a hole-injection layer. The common layer 114 is shared by the light-emitting devices 130*a*, 130*b*, and 130*c*.

The common electrode 115 is shared by the light-emitting devices 130*a*, 130*b*, and 130*c*. The common electrode 115 shared by the plurality of light-emitting devices is electrically connected to a conductive layer 123 provided in the connection portion 140 (see FIGS. 7A and 7B). The conductive layer 123 is preferably formed using a conductive layer formed using the same material and through the same steps as the pixel electrode 111*a*, 111*b*, or 111*c*.

Note that FIG. 7A illustrates an example in which the common layer 114 is provided over the conductive layer 123 and the conductive layer 123 and the common electrode 115 are electrically connected to each other through the common layer 114. The common layer 114 is not necessarily provided in the connection portion 140. In FIG. 7B, the conductive layer 123 and the common electrode 115 are directly connected to each other. For example, by using a mask for specifying a film formation area (also referred to as an area mask or a rough metal mask to be distinguished from a fine metal mask), the common layer 114 can be formed in a region different from a region where the common electrode 115 is formed.

The protective layer 131 is preferably provided over the light-emitting devices 130*a*, 130*b*, and 130*c*. Providing the protective layer 131 can improve the reliability of the light-emitting devices. The protective layer 131 may have a single-layer structure or a layered structure including two or more layers.

There is no limitation on the conductivity of the protective layer 131. As the protective layer 131, at least one type of insulating films, semiconductor films, and conductive films can be used.

The protective layer 131 including an inorganic film can suppress deterioration of the light-emitting devices by preventing oxidation of the common electrode 115 and inhibiting entry of impurities (e.g., moisture and oxygen) into the light-emitting devices, for example; thus, the reliability of the display panel can be improved.

As the protective layer 131, an inorganic insulating film such as an oxide insulating film, a nitride insulating film, an oxynitride insulating film, or a nitride oxide insulating film can be used, for example. Examples of the oxide insulating film include a silicon oxide film, an aluminum oxide film, a gallium oxide film, a germanium oxide film, an yttrium oxide film, a zirconium oxide film, a lanthanum oxide film, a neodymium oxide film, a hafnium oxide film, a tantalum oxide film, and the like. Examples of the nitride insulating film include a silicon nitride film, an aluminum nitride film, and the like. Examples of the oxynitride insulating film include a silicon oxynitride film, an aluminum oxynitride film, and the like. Examples of the nitride oxide insulating film include a silicon nitride oxide film, an aluminum nitride oxide film, and the like. In particular, the protective layer 131 preferably includes a nitride insulating film or a nitride oxide insulating film, and further preferably includes a nitride insulating film.

As the protective layer 131, an inorganic film containing In—Sn oxide (also referred to as ITO), In—Zn oxide, Ga—Zn oxide, Al—Zn oxide, indium gallium zinc oxide (In—Ga—Zn oxide, also referred to as IGZO), or the like can also be used. The inorganic film preferably has high resistance, specifically, higher resistance than the common electrode 115. The inorganic film may further contain nitrogen.

When light emitted from the light-emitting device is extracted through the protective layer 131, the protective layer 131 preferably has a high visible-light-transmitting property. For example, ITO, IGZO, and aluminum oxide are preferable because they are inorganic materials having a high visible-light-transmitting property.

The protective layer 131 can be, for example, a stack of an aluminum oxide film and a silicon nitride film over the aluminum oxide film, or a stack of an aluminum oxide film and an IGZO film over the aluminum oxide film. Such a stacked-layer structure can suppress entry of impurities (such as water and oxygen) into the EL layer.

Furthermore, the protective layer 131 may include an organic film. For example, the protective layer 131 may include both an organic film and an inorganic film. Examples of an organic material that can be used for the protective layer 131 include organic insulating materials that can be used for the insulating layer 121 described later.

The protective layer 131 may have a stacked structure of two layers which are formed by different formation methods. Specifically, the first layer of the protective layer 131 may be formed by an ALD method, and the second layer of the protective layer 131 may be formed by a sputtering method.

In FIG. 6B and the like, an insulating layer covering an end portion of the top surface of the pixel electrode 111*a* is not provided between the pixel electrode 111*a* and the first layer 113*a*. An insulating layer covering an end portion of the top surface of the pixel electrode 111*b* is not provided between the pixel electrode 111*b* and the second layer 113*b*. Thus, the distance between adjacent light-emitting devices can be extremely shortened. Accordingly, the display panel can have high resolution or high definition.

In FIG. 6B and the like, a sacrificial layer 118*a* is positioned over the first layer 113*a* in the light-emitting device 130*a*, a sacrificial layer 118*b* is positioned over the second layer 113*b* in the light-emitting device 130*b*, and a sacrificial layer 118*c* is positioned over the third layer 113*c* in the light-emitting device 130*c*. The sacrificial layer 118*a* is a remaining portion of the sacrificial layer provided over the first layer 113*a* when the first layer 113*a* is processed. Similarly, the sacrificial layer 118*b* and the sacrificial layer 118*c* are remaining portions of the sacrificial layers provided when the second layer 113*b* and the third layer 113*c* are formed, respectively. Thus, the sacrificial layer used to protect the EL layer in the manufacture of the EL layer may partly remain in the display panel of one embodiment of the present invention. For any two or all of the sacrificial layers 118*a* to 118*c*, the same or different materials may be used.

In FIG. 6B, one end portion of the sacrificial layer 118*a* is aligned or substantially aligned with an end portion of the first layer 113*a*, and the other end portion of the sacrificial layer 118*a* is located over the first layer 113*a*. The sacrificial layer may remain between, for example, the EL layer processed into an island shape (the first layer 113*a*, the second layer 113*b*, or the third layer 113*c*) and the insulating layer 125 or 127.

As the sacrificial layer, one or more of a metal film, an alloy film, a metal oxide film, a semiconductor film, an organic insulating film, and can be used, for example. As the sacrificial layer, a variety of inorganic insulating films that can be used as the protective layer 131 can be used. For example, an inorganic insulating material such as aluminum oxide, hafnium oxide, or silicon oxide can be used for the sacrificial layer.

As illustrated in FIG. 7C, one or both of the insulating layers 125 and 127 may cover part of the top surface of the EL layer (the first layer 113*a*, the second layer 113*b*, or the third layer 113*c*) processed into an island shape. When one or both of the insulating layers 125 and 127 cover not only the side surface but also the top surface of the EL layer (the first layer 113*a*, the second layer 113*b*, or the third layer 113*c*) processed into an island shape, separation of the EL layer can further be prevented and the reliability of the light-emitting device can be increased. The manufacturing yield of the light-emitting device can also be increased. In the example in FIG. 7C, the first layer 113*a*, the sacrificial layer 118*a*, the insulating layer 125, and the insulating layer 127 are stacked in the position over the end portion of the pixel electrode 111*a*. Similarly, the second layer 113*b*, the sacrificial layer 118*b*, the insulating layer 125, and the insulating layer 127 are stacked in the position over the end portion of the pixel electrode 111*b*; the third layer 113*c*, the sacrificial layer 118*c*, the insulating layer 125, and the insulating layer 127 are stacked in the position over the end portion of the pixel electrode 111*c*.

The width of the pixel electrode may be larger or smaller than that of the island-shaped EL layer. The pixel electrode 111*a* and the first layer 113*a* are given as an example in the description below. Such description can be applied to the pixel electrode 111*b* and the second layer 113*b* and to the pixel electrode 111*c* and the third layer 113*c*.

FIG. 6B and the like illustrate an example in which the end portion of the first layer 113*a* is positioned on an outer side than the end portion of the pixel electrode 111*a*. In FIG. 6B and the like, the first layer 113*a* is formed to cover the end portion of the pixel electrode 111*a*. The aperture ratio of such a structure can be higher than that of the structure in which the end portion of the island-shaped EL layer is positioned on an inner side than the end portion of the pixel electrode.

Covering the side surface of the pixel electrode with the EL layer prevents contact between the pixel electrode and the common electrode 115, so that a short circuit in the light-emitting device can be suppressed. Furthermore, the distance between the light-emitting region (i.e., the region overlapping with the pixel electrode) in the EL layer and the end portion of the EL layer can be increased, resulting in higher reliability.

Figure 8A:
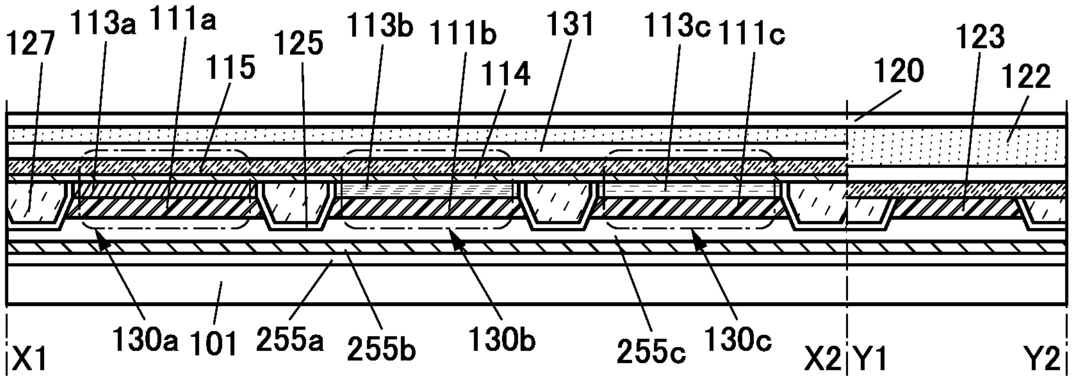
FIGS. 8A and 8B are cross-sectional views each illustrating an example of a display panel.
Figure 8B:
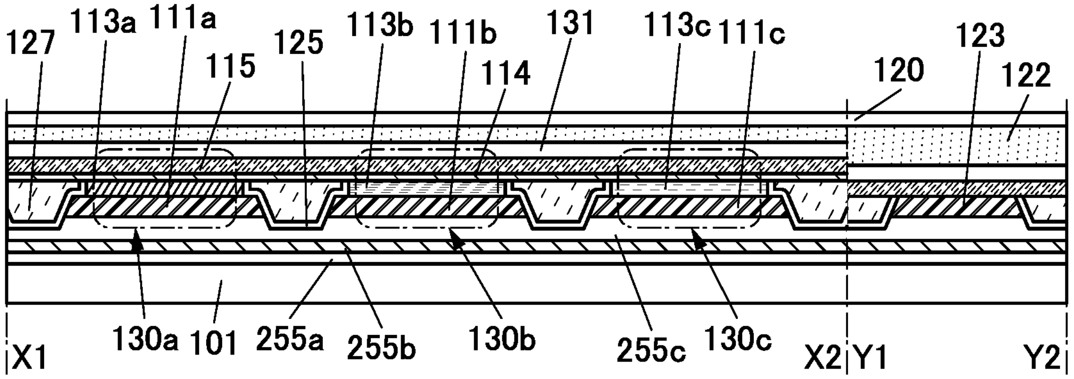

FIG. 8A illustrates an example in which the end portion of the top surface of the pixel electrode 111*a* and the end portion of the first layer 113*a* are aligned or substantially aligned with each other. FIG. 8A illustrates an example in which the end portion of the first layer 113*a* is positioned on an inner side than the end portion of the bottom surface of the pixel electrode 111*a*. FIG. 8B illustrates an example in which the end portion of the first layer 113*a* is positioned on an inner side than the end portion of the top surface of the pixel electrode 111*a*. In FIGS. 8A and 8B, the end portion of the first layer 113*a* is positioned over the pixel electrode 111*a*.

As illustrated in FIGS. 8A and 8B, when the end portion of the first layer 113*a* is positioned over the pixel electrode 111*a*, a reduction in the thickness of the first layer 113*a* at or near the end portion of the pixel electrode 111*a* can be inhibited to make the thickness of the first layer 113*a* uniform.

In the case where end portions are aligned or substantially aligned with each other and the case where top surface shapes are the same or substantially the same, it can be said that outlines of stacked layers at least partly overlap with each other in a top view. For example, the case of patterning or partly patterning an upper layer and a lower layer with use of the same mask pattern is included in the expression. The expression "end portions are aligned or substantially aligned with each other" or "top surface shapes are the same or substantially the same" also includes the case where the outlines do not completely overlap with each other; for instance, the edge of the upper layer may be positioned on an inner side or an outer side than the edge of the lower layer.

The end portion of the first layer 113*a* may have both a part positioned on an outer side than the end portion of the pixel electrode 111*a* and a part positioned on an inner side than the end portion of the pixel electrode 111*a*.

Figure 9A:
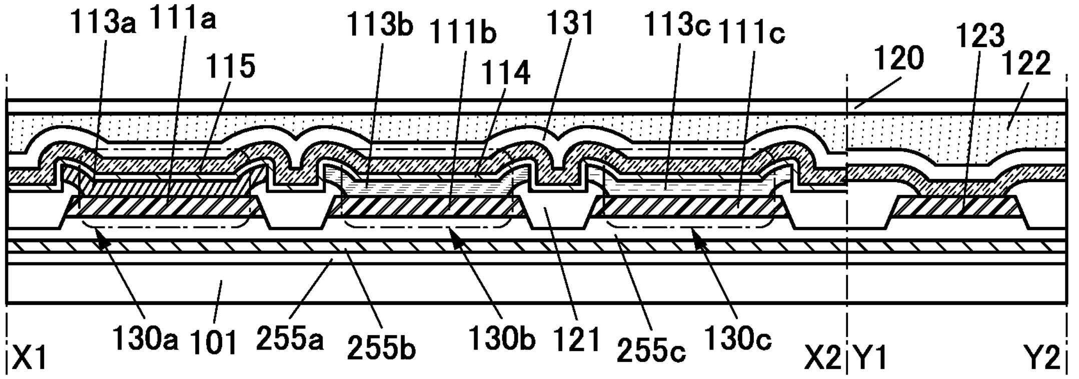
FIGS. 9A to 9C are cross-sectional views each illustrating an example of a display panel.
Figure 9B:
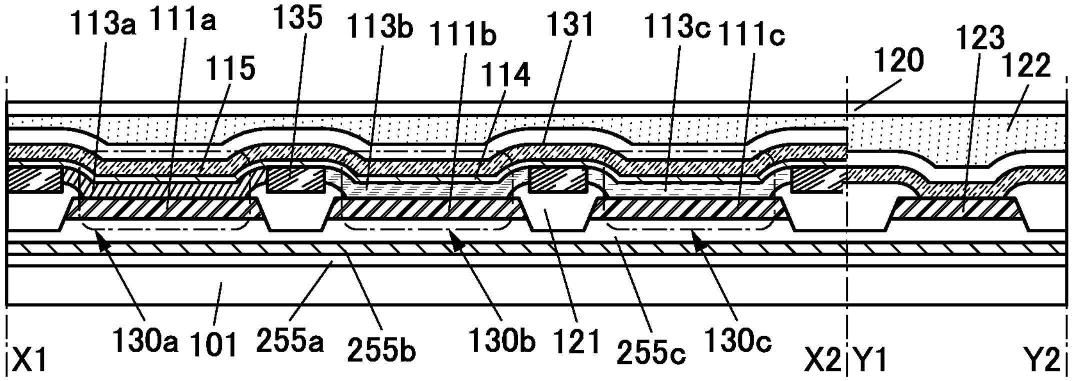
Figure 9C:
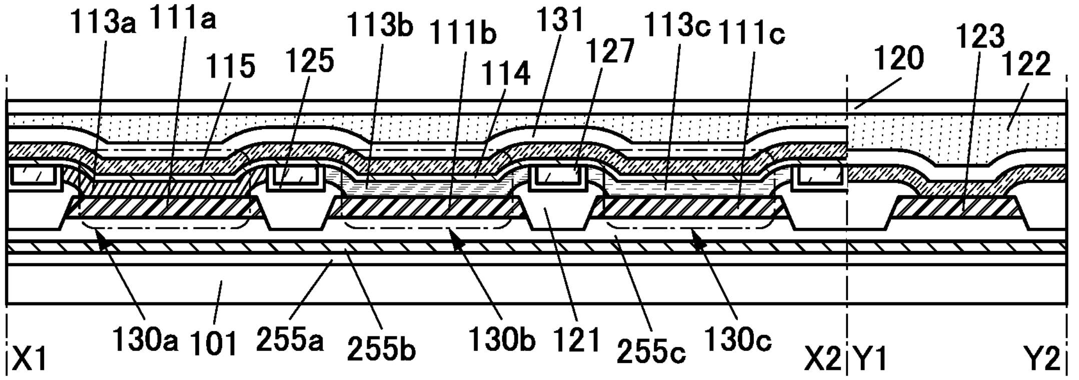

As illustrated in FIGS. 9A to 9C, the insulating layer 121 covering the end portions of the top surfaces of the pixel electrodes 111*a*, 111*b*, and 111*c* may be provided. The first layer 113*a*, the second layer 113*b*, and the third layer 113*c* can include a portion over and in contact with the pixel electrode and a portion over and in contact with the insulating layer 121. The insulating layer 121 can have a single-layer structure or a stacked-layer structure including one or both of an inorganic insulating film and an organic insulating film.

Examples of an organic insulating material that can be used for the insulating layer 121 include an acrylic resin, an epoxy resin, a polyimide resin, a polyamide resin, a polyimide-amide resin, a polysiloxane resin, a benzocyclobutene-based resin, and a phenol resin. As an inorganic insulating film that can be used as the insulating layer 121, an inorganic insulating film that can be used as the protective layer 131 can be used.

When an inorganic insulating film is used as the insulating layer 121, impurities are less likely to enter the light-emitting device as compared with the case where an organic insulating film is used; therefore, the reliability of the light-emitting device can be improved. Furthermore, the insulating layer 121 can be thinner, so that high resolution can be easily achieved. When an organic insulating film is used as the insulating layer 121 covering the end portion of the pixel electrode, a short circuit in the light-emitting device can be prevented because the organic insulating film has higher step coverage and is less likely to be influenced by the shape of the pixel electrode than the inorganic insulating film. Specifically, when an organic insulating film is used as the insulating layer 121, the insulating layer 121 can be processed into a tapered shape or the like.

Note that the insulating layer 121 is not necessarily provided. The aperture ratio of the subpixel can be sometimes increased without providing the insulating layer 121. Alternatively, the distance between subpixels can be shortened and the resolution or the definition of the display panel can be sometimes increased.

Note that FIG. 9A illustrates an example in which the common layer 114 is also formed over the insulating layer 121 in a region between the first layer 113*a* and the second layer 113*b* and a region between the second layer 113*b* and the third layer 113*c*, for example. As illustrated in FIG. 9B, spaces 135 may be formed in the regions.

The space 135 includes, for example, one or more selected from air, nitrogen, oxygen, carbon dioxide, and Group 18 elements (typically, helium, neon, argon, xenon, and krypton). Alternatively, a resin or the like may be embedded in the space 135.

As illustrated in FIG. 9C, the insulating layer 125 may be provided to cover the top surface of the insulating layer 121 and the side surfaces of the first layer 113*a*, the second layer 113*b*, and the third layer 113*c*, and the insulating layer 127 may be provided over the insulating layer 125.

In FIG. 6B and the like, side surfaces of the pixel electrodes 111*a*, 111*b*, and 111*c*, the first layer 113*a*, the second layer 113*b*, and the third layer 113*c* are covered with the insulating layers 125 and 127. Thus, the common layer 114 (or the common electrode 115) can be prevented from being in contact with the side surfaces of the pixel electrodes 111*a*, 111*b*, and 111*c*, the first layer 113*a*, the second layer 113*b*, and the third layer 113*c*, so that a short circuit of light-emitting device can be suppressed. Thus, the reliability of the light-emitting device can be increased.

The insulating layer 125 preferably covers at least one of the side surface of the pixel electrode and the side surface of the island-shaped EL layer, and further preferably covers both the side surface of the pixel electrode and the side surface of the island-shaped EL layer. The insulating layer 125 can be in contact with the side surface of the pixel electrode and the side surface of the island-shaped EL layer.

In FIG. 6B and the like, the end portion of the pixel electrode 111*a* is covered with the first layer 113*a* and the insulating layer 125 is in contact with the side surface of the first layer 113*a*. Similarly, the end portion of the pixel electrode 111*b* is covered with the second layer 113*b*, the end portion of the pixel electrode 111*c* is covered with the third layer 113*c*, and the insulating layer 125 is in contact with the side surface of the second layer 113*b* and the side surface of the third layer 113*c*.

The insulating layer 127 is provided over the insulating layer 125 to fill a depressed portion formed by the insulating layer 125. The insulating layer 127 can overlap the side surfaces of the first layer 113*a*, the second layer 113*b*, and the third layer 113*c*, with the insulating layer 125 therebetween.

The insulating layers 125 and 127 can fill a gap between the adjacent island-shaped layers, whereby the surface where the layers (e.g., the carrier-injection layer and the common electrode) provided over the island-shaped layers are formed can be less uneven and flatter. Thus, the coverage with the carrier-injection layer, the common electrode, and the like can be increased and disconnection of the common electrode can be prevented.

The common layer 114 and the common electrode 115 are provided over the first layer 113*a*, the second layer 113*b*, the third layer 113*c*, and the insulating layers 125 and 127. Before the insulating layer 125 and the insulating layer 127 are provided, a step is generated due to a difference between a region where the pixel electrode and the EL layer are provided and a region where neither the pixel electrode nor the EL layer is provided (region between the light-emitting elements). In the display panel of one embodiment of the present invention, the step can be planarized with the insulating layer 125 and the insulating layer 127, and the coverage with the common layer 114 and the common electrode 115 can be improved. Thus, connection defects caused by disconnection can be inhibited. An increase in electrical resistance, which is caused by a reduction in thickness locally of the common electrode 115 due to the step, can be prevented.

To improve the planarity of a surface over which the common layer 114 and the common electrode 115 are formed, the levels of the top surfaces of the insulating layers 125 and 127 are preferably aligned or substantially aligned with the level of the top surface of at least one of the end portions of the first layer 113*a*, the second layer 113*b*, and the third layer 113*c*. The top surface of the insulating layer 127 preferably has a flat surface, and may include a projection portion, a convex surface, a concave surface, or a depression portion.

The insulating layers 125 and the insulating layer 127 can be provided in contact with the island-shaped EL layer. Thus, the island-shaped EL layer can be prevented from being separated. When the insulating layer and the island-shaped EL layer are in close contact with each other, the adjacent island-shaped EL layers can be fixed by or attached to the insulating layer. Accordingly, the reliability of the light-emitting device can be increased. The manufacturing yield of the light-emitting device can also be increased.

Figure 10A:
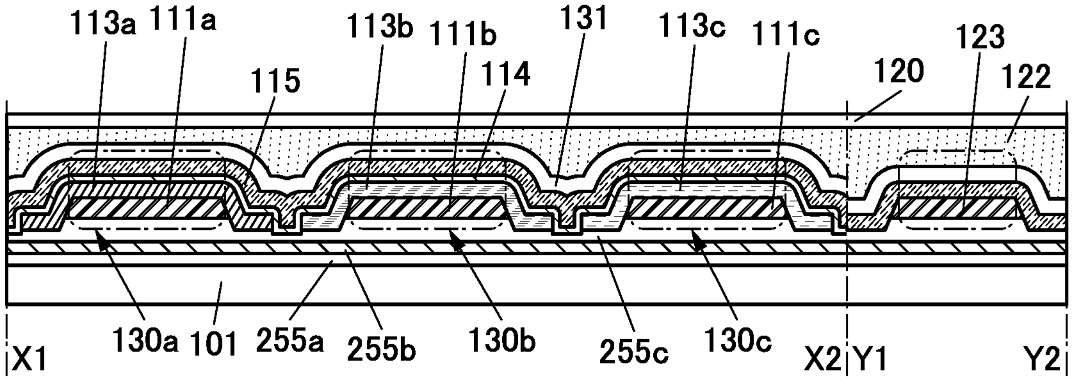
FIGS. 10A to 10C are cross-sectional views each illustrating an example of a display panel.

As illustrated in FIG. 10A, the display panel does not necessarily include the insulating layers 125 and 127. In FIG. 10A, the common layer 114 is provided in contact with the top surface of the insulating layer 255*c* and the top and side surfaces of the first layer 113*a*, the second layer 113*b*, and the third layer 113*c*. Note that as illustrated in FIG. 9B, the space 135 may be provided in the region between the first layer 113*a* and the second layer 113*b* and the region between the second layer 113*b* and the third layer 113*c*, for example.

Note that one of the insulating layers 125 and 127 is not necessarily provided. For example, a single-layer insulating layer 125 using an inorganic material can be used as a protective insulating layer of the EL layer. In this way, the reliability of the display panel can be increased. For another example, a single-layer insulating layer 127 using an organic material can fill a gap between the adjacent island-shaped EL layers and planarization can be performed. In this way, the coverage with the common electrode 115 (upper electrode) formed over the island-shaped EL layers and the insulating layer 127 can be increased.

Figure 10B:
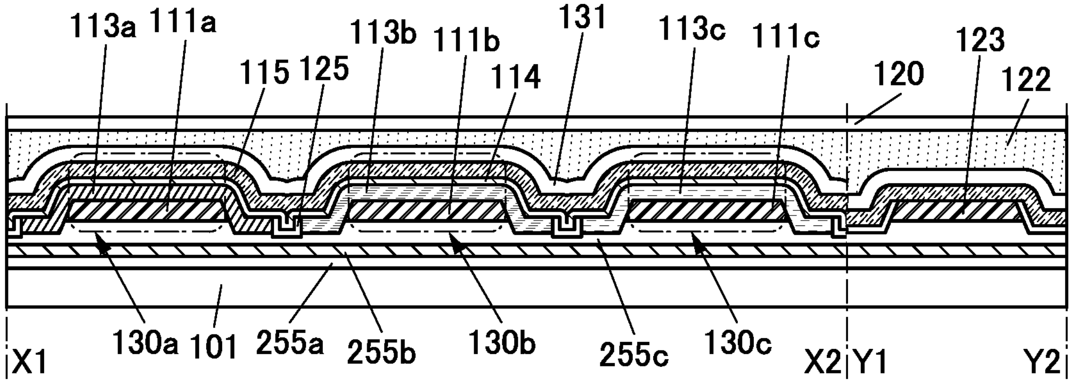

FIG. 10B illustrates an example in which the insulating layer 127 is not provided. Note that although FIG. 10B illustrates an example in which the common layer 114 is provided in the depression portion of the insulating layer 125, spaces may be formed in the regions.

The insulating layer 125 includes a region in contact with the side surface of the island-shaped EL layer and functions as a protective insulating layer of the island-shaped EL layer. With the insulating layer 125, entry of impurities (such as oxygen and moisture) from the side surface of the island-shaped EL layer into its inside can be prevented, and thus a highly reliable display panel can be obtained.

Figure 10C:
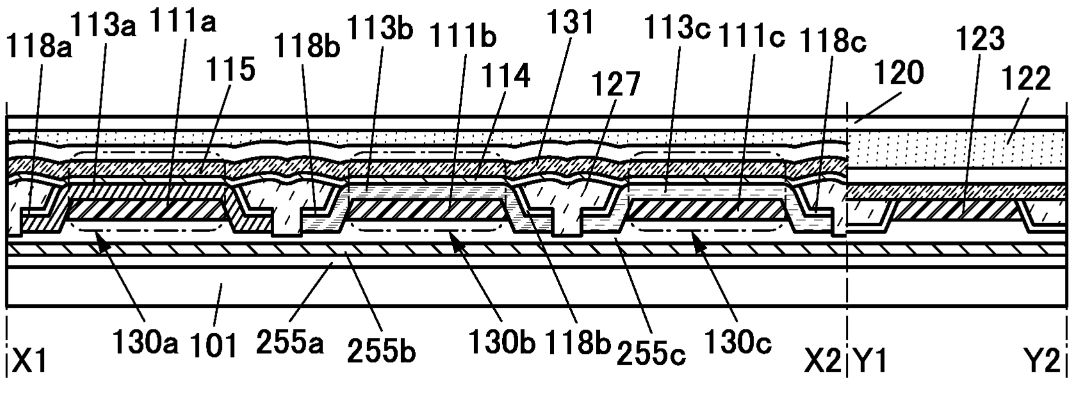

FIG. 10C illustrates an example in which the insulating layer 125 is not provided. In the case where the insulating layer 125 is not provided, the insulating layer 127 can be in contact with the side surface of the island-shaped EL layer. The insulating layer 127 can be provided to fill gaps between the island-shaped EL layers of the light-emitting devices.

At this time, it is preferable to use, for the insulating layer 127, an organic material that causes less damage to the EL layer. For example, it is preferable to use, for the insulating layer 127, an organic material such as polyvinyl alcohol (PVA), polyvinyl butyral, polyvinyl pyrrolidone, polyethylene glycol, polyglycerin, pullulan, water-soluble cellulose, or alcohol-soluble polyamide resin.

Next, an example of a material and formation method of the insulating layers 125 and 127 are described.

The insulating layer 125 can be formed using an inorganic material. As the insulating layer 125, an inorganic insulating film such as an oxide insulating film, a nitride insulating film, an oxynitride insulating film, or a nitride oxide insulating film can be used, for example. The insulating layer 125 may have a single-layer structure or a stacked-layer structure. Examples of the oxide insulating film include a silicon oxide film, an aluminum oxide film, a magnesium oxide film, an indium-gallium-zinc oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film. In particular, aluminum oxide is preferably used because it has high selectivity with respect to the EL layer in etching and has a function of protecting the EL layer when the insulating layer 127 to be described later is formed. An inorganic insulating film such as an aluminum oxide film, a hafnium oxide film, or a silicon oxide film is formed by an ALD method as the insulating layer 125, whereby the insulating layer 125 can have few pinholes and an excellent function of protecting the EL layer. The insulating layer 125 may have a stacked-layer structure of a film formed by an ALD method and a film formed by a sputtering method. The insulating layer 125 may have a stacked-layer structure of an aluminum oxide film formed by an ALD method and a silicon nitride film formed by a sputtering method, for example.

The insulating layer 125 preferably has a function of a barrier insulating film against at least one of water and oxygen. Alternatively, the insulating layer 125 preferably has a function of inhibiting the diffusion of at least one of water and oxygen. Alternatively, the insulating layer 125 preferably has a function of capturing or fixing (also referred to as gettering) at least one of water and oxygen.

When the insulating layer 125 has a function of the barrier insulating layer or a gettering function, entry of impurities (typically, at least one of water and oxygen) that would diffuse into the light-emitting devices from the outside can be suppressed. In this structure, a highly reliable light-emitting device, furthermore, a highly reliable display panel can be provided.

The insulating layer 125 preferably has a low impurity concentration. Accordingly, degradation of the EL layer, which is caused by entry of impurities into the EL layer from the insulating layer 125, can be suppressed. In addition, when the impurity concentration is reduced in the insulating layer 125, a barrier property against at least one of water and oxygen can be increased. For example, one or both of the hydrogen concentration and the carbon concentration in the insulating layer 125 are preferably low.

As the formation method of the insulating layer 125, a sputtering method, a CVD method, a pulsed laser deposition (PLD) method, an ALD method, and the like can be given. The insulating layer 125 is preferably formed by an ALD method achieving good coverage.

When the substrate temperature at the time when the insulating layer 125 is formed is increased, the formed insulating layer 125, even with a small thickness, can have a high impurity concentration and a high barrier property against at least one of water and oxygen. Therefore, the substrate temperature is preferably higher than or equal to 60° C., further preferably higher than or equal to 80° C., still further preferably higher than or equal to 100° C., yet still further preferably higher than or equal to 120° C. Meanwhile, the insulating layer 125 is formed after formation of an island-shaped EL layer, it is preferable that the insulating layer 125 be formed at a temperature lower than the allowable temperature limit of the EL layer. Therefore, the substrate temperature is preferably lower than or equal to 200° C., further preferably lower than or equal to 180° C., still further preferably lower than or equal to 160° C., still further preferably lower than or equal to 150° C., yet still further preferably lower than or equal to 140° C.

Examples of indicators of the allowable temperature limit are the glass transition point, the softening point, the melting point, the thermal decomposition temperature, and the 5% weight loss temperature. The allowable temperature limit of the EL layer can be, for example, any of the above temperatures, preferably the lowest temperature thereof.

The insulating layer 125 is preferably formed to have a thickness greater than or equal to 3 nm, greater than or equal to 5 nm, or greater than or equal to 10 nm and less than or equal to 200 nm, less than or equal to 150 nm, less than or equal to 100 nm, or less than or equal to 50 nm.

The insulating layer 127 provided over the insulating layer 125 has a function of filling the depressed portion of the insulating layer 125, which is formed between the adjacent light-emitting devices. In other words, the insulating layer 127 has an effect of improving the planarity of the formation surface of the common electrode 115. As the insulating layer 127, an insulating layer containing an organic material can be favorably used. For example, the insulating layer 127 can be formed using an acrylic resin, a polyimide resin, an epoxy resin, an imide resin, a polyamide resin, a polyimide-amide resin, a silicone resin, a siloxane resin, a benzocyclobutene-based resin, a phenol resin, precursors of these resins, or the like. The insulating layer 127 may be formed using an organic material such as polyvinyl alcohol (PVA), polyvinyl butyral, polyvinylpyrrolidone, polyethylene glycol, polyglycerin, pullulan, water-soluble cellulose, or an alcohol-soluble polyamide resin. Moreover, the insulating layer 127 can be formed using a photosensitive resin. A photoresist may be used as the photosensitive resin. The photosensitive resin can be of positive or negative type.

The insulating layer 127 may be formed using a material absorbing visible light. When the insulating layer 127 absorbs light emitted by the light-emitting device, leakage of light (stray light) from the light-emitting device to the adjacent light-emitting device through the insulating layer 127 can be inhibited. Thus, the display quality of the display panel can be improved. Since no polarizing plate is required to improve the display quality, the weight and thickness of the display panel can be reduced.

Examples of the material absorbing visible light include materials containing pigment of black or the like, materials containing dye, light-absorbing resin materials (e.g., polyimide), and resin materials that can be used for color filters (color filter materials). Using the resin material composed of stacked color filter materials of two or three or more colors is particularly preferred, in which case the effect of blocking visible light is enhanced. In particular, mixing color filter materials of three or more colors enables the formation of a black or nearly black resin layer.

For example, the insulating layer 127 can be formed by a wet film-formation method such as spin coating, dipping, spray coating, ink-jetting, dispensing, screen printing, offset printing, doctor blade coating, slit coating, roll coating, curtain coating, or knife coating. Specifically, an organic insulating film that is to be the insulating layer 127 is preferably formed by spin coating.

The insulating layer 127 is formed at a temperature lower than the allowable temperature limit of the EL layer. The typical substrate temperature in formation of layer 127 is lower than or equal to 200° C., preferably lower than or equal to 180° C., further preferably lower than or equal to 160° C., still further preferably lower than or equal to 150° C., yet still further preferably lower than or equal to 140° C.

FIGS. 11A to 11F each illustrate a cross-sectional structure of a region 139 including the insulating layer 127 and its surroundings.

Figure 11A:
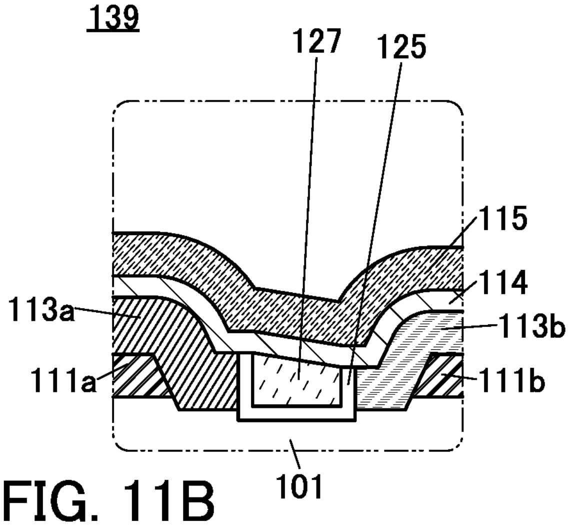
FIGS. 11A to 11F are cross-sectional views each illustrating an example of a display panel.

FIG. 11A illustrates an example in which the first layer 113*a* and the second layer 113*b* have different thicknesses. The height of the top surface of the insulating layer 125 agrees with or substantially agrees with the height of the top surface of the first layer 113*a* on the first layer 113*a* side, and agrees with or substantially agrees with the height of the top surface of the second layer 113*b* on the second layer 113*b* side. The top surface of the insulating layer 127 has a gentle slope such that the side closer to the first layer 113*a* is higher and the side closer to the second layer 113*b* is lower. In this manner, the height of the insulating layers 125 and 127 is preferably equal to the height of the top surface of the adjacent EL layer. Alternatively, the height of the insulating layers 125 and 127 may be equal to the height of the top surface of any adjacent EL layer and their top surfaces may have a flat portion.

Figure 11B:
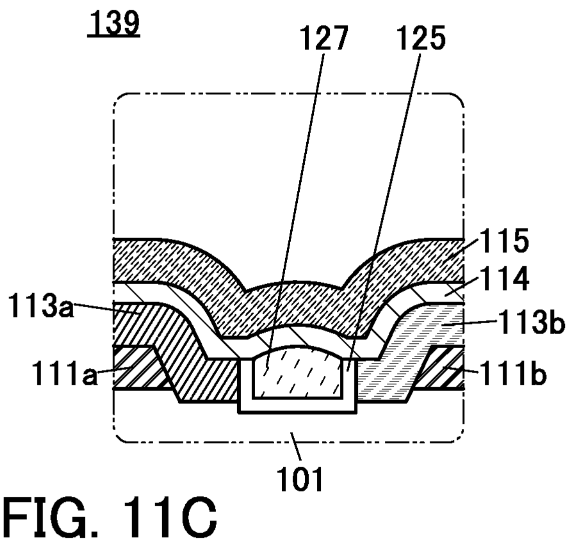

In FIG. 11B, the top surface of the insulating layer 127 includes a region higher than the top surface of the first layer 113*a* and the top surface of the second layer 113*b*. As illustrated in FIG. 11B, it can be said that the top surface of the insulating layer 127 has a shape in which its center and vicinity thereof rise, i.e., a shape including a convex surface, in the cross-sectional view.

Figure 11C:
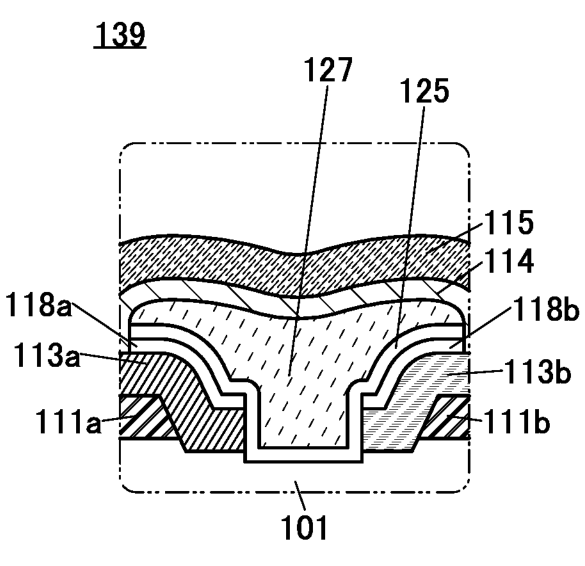

In the cross-sectional view of FIG. 11C, the top surface of the insulating layer 127 gently rises from its end portions toward the center, i.e., has convexities, and has a depression portion in the center and its vicinity, i.e., has a concavity. The insulating layer 127 includes a region higher than the top surface of the first layer 113*a* and the top surface of the second layer 113*b*. The region 139 of the display panel includes a region where the first layer 113*a*, the sacrificial layer 118*a*, the insulating layer 125, and the insulating layer 127 are stacked in this order. In the region 139 of the display panel includes a region where the first layer 113*a*, the second sacrificial layer 113*b*, the sacrificial layer 118*b*, the insulating layer 125, and the insulating layer 127 are stacked in this order.

Figure 11D:
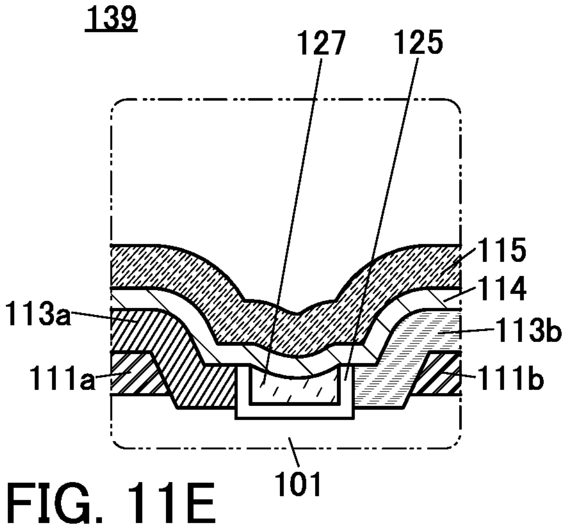

In FIG. 11D, the top surface of the insulating layer 127 includes a region whose height is lower than the height of the top surface of the first layer 113*a* and the height of the top surface of the second layer 113*b*. In the cross-sectional view, the top surface of the insulating layer 127 has a depression portion in the center and its vicinity, i.e., has a concavity.

Figure 11E:
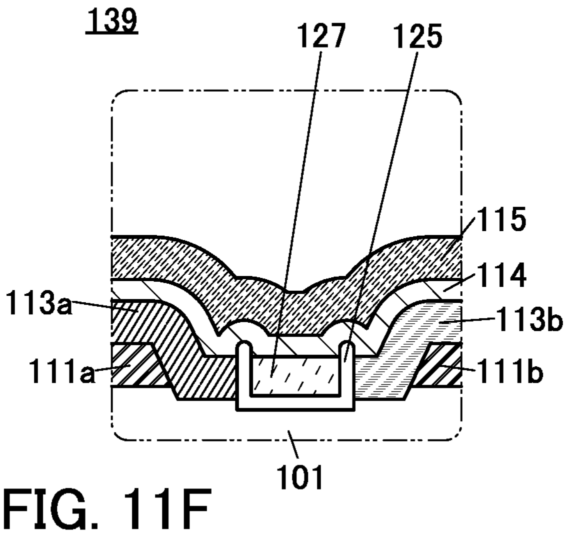

In FIG. 11E, the top surface of the insulating layer 125 includes a region whose height is greater than the height of the top surface of the first layer 113*a* and the top surface of the second layer 113*b*. That is, the insulating layer 125 protrudes from the formation surface where the common layer 114 is formed, and forms a projection.

For example, when the insulating layer 125 is formed so that its height is equal to or substantially equal to the height of the sacrificial layer, the insulating layer 125 may protrude as illustrated in FIG. 11E.

Figure 11F:
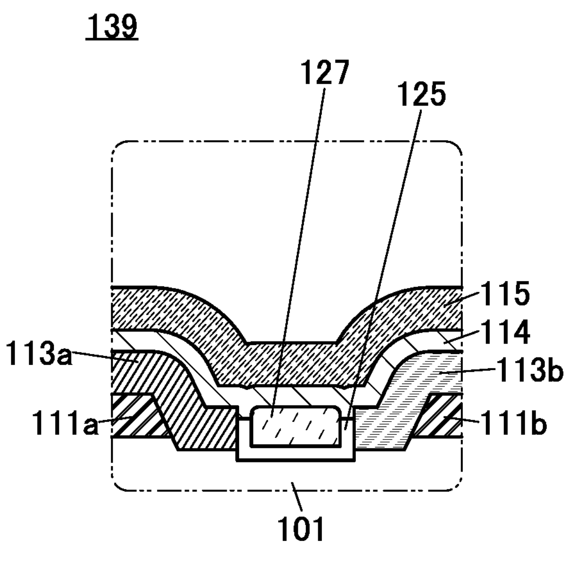

In FIG. 11F, the top surface of the insulating layer 125 includes a region whose level is lower than the levels of the top surface of the first layer 113*a* and the top surface of the second layer 113*b*. That is, the insulating layer 125 forms a depression portion on the formation surface of the common layer 114.

As described above, the insulating layers 125 and 127 can have a variety of shapes.

In the display panel of this embodiment, the distance between the light-emitting devices can be narrowed. Specifically, the distance between the light-emitting devices, the distance between the EL layers, or the distance between the pixel electrodes can be less than 10 μm, 5 μm or less, 3 μm or less, 2 μm or less, 1 μm or less, 500 nm or less, 200 nm or less, 100 nm or less, 90 nm or less, 70 nm or less, 50 nm or less, 30 nm or less, 20 nm or less, 15 nm or less, or 10 nm or less. In other words, the display panel of this embodiment includes a region where a distance between two adjacent island-shaped EL layers adjacent to each other is less than or equal to 1 μm, preferably less than or equal to 0.5 μm (500 nm), further preferably less than or equal to 100 nm.

A light-blocking layer may be provided on the surface of the substrate 120 on the resin layer 122 side. Moreover, a variety of optical members can be provided on the outer side of the substrate 120. Examples of optical members include a polarizing plate, a retardation plate, a light diffusion layer (e.g., a diffusion film), an anti-reflective layer, and a light-condensing film. Furthermore, an antistatic film preventing the attachment of dust, a water repellent film suppressing the attachment of stain, a hard coat film suppressing generation of a scratch caused by the use, an impact-absorbing layer, or the like may be provided as a surface protective layer on the outer surface of the substrate 120. For example, it is preferable to provide, as the surface protective layer, a glass layer or a silica layer ($SiO_x$ layer) because the surface contamination or damage can be prevented from being generated. The surface protective layer may be formed using diamond like carbon (DLC), aluminum oxide ($AlO_x$), a polyester-based material, a polycarbonate-based material, or the like. For the surface protective layer, a material having a high transmitting property with respect to visible light is preferably used. The surface protective layer is preferably formed using a material with high hardness.

For the substrate 120, glass, quartz, ceramic, sapphire, a resin, a metal, an alloy, a semiconductor, or the like can be used. The substrate on the side from which light from the light-emitting device is extracted is formed using a material that transmits the light. When a flexible material is used for the substrate 120, the flexibility of the display panel can be increased. Furthermore, a polarizing plate may be used as the substrate 120.

For the substrate 120, any of the following can be used, for example: polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, polyamide resins (e.g., nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, and cellulose nanofiber. Glass that is thin enough to have flexibility may be used as the substrate 120.

In the case where a circularly polarizing plate overlaps the display panel, a highly optically isotropic substrate is preferably used as the substrate included in the display panel. A highly optically isotropic substrate has a low birefringence (i.e., a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of films having high optical isotropy include a triacetyl cellulose (TAC, also referred to as cellulose triacetate) film, a cycloolefin polymer (COP) film, a cycloolefin copolymer (COC) film, and an acrylic film.

When a film used as the substrate absorbs water, the shape of the display panel might be changed, e.g., creases might be caused. Thus, as the substrate, a film with a low water absorption rate is preferably used. For example, the water absorption rate of the film is preferably 1% or lower, further preferably 0.1% or lower, still further preferably 0.01% or lower.

For the resin layer 122, a variety of curable adhesives such as a photocurable adhesive like an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. A two-component-mixture-type resin may be used. An adhesive sheet or the like may be used.

Figure 12A:
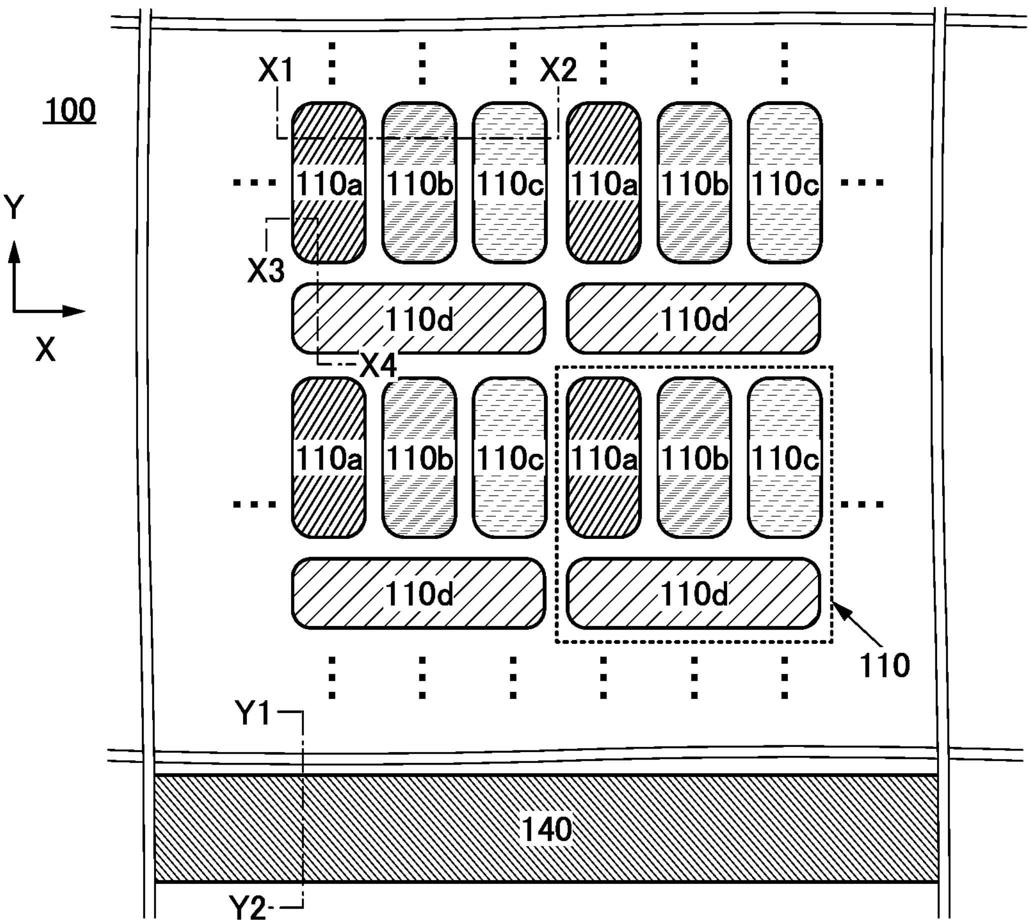
FIG. 12A is a top view illustrating an example of a display panel.

As illustrated in FIG. 12A, the pixel can include four types of subpixels.

FIG. 12A is a top view of the display panel 100. The display panel 100 includes a display portion in which a plurality of pixels 110 are arranged in a matrix, and a connection portion 140 outside the display portion.

The pixel 110 illustrated in FIG. 2A consists of four types of subpixels 110*a*, 110*b*, 110*c*, and 110*d*.

The subpixels 110*a*, 110*b*, 110*c*, and 110*d* include light-emitting device that emit light of different colors. For example, the subpixels 110*a*, 110*b*, 110*c*, and 110*d* can be of four colors of R, G, and B, and W, of three colors of R, G, and B and IR, or the like.

The display panel of one embodiment of the present invention may include a light-receiving device in the pixel.

Three of the four subpixels included in the pixel 110 in FIG. 12A may include a light-emitting device and the other one may include a light-receiving device.

As the light-receiving devices, PN photodiodes or PIN photodiodes can be used, for example. The light-receiving devices function as photoelectric conversion devices (also referred to as photoelectric conversion elements) that sense light entering the light-receiving devices and generate electric charge. The amount of electric charge generated from the light-receiving devices depends on the amount of light entering the light-receiving devices.

It is particularly preferable to use an organic photodiode including a layer containing an organic compound as the light-receiving device. An organic photodiode, which is easily made thin, lightweight, and large in area and has a high degree of freedom for shape and design, can be used in a variety of display panels.

In one embodiment of the present invention, organic EL devices are used as the light-emitting devices, and organic photodiodes are used as the light-receiving devices. The organic EL devices and the organic photodiodes can be formed over one substrate. Thus, the organic photodiodes can be incorporated in the display panel including the organic EL devices.

The light-receiving device includes at least an active layer that functions as a photoelectric conversion layer between a pair of electrodes. In this specification and the like, one of the pair of electrodes may be referred to as a pixel electrode and the other may be referred to as a common electrode.

One of the pair of electrodes included in the light-receiving device functions as an anode, and the other functions as a cathode. Hereinafter, the case where the pixel electrode functions as an anode and the common electrode functions as a cathode is described as an example. The light-receiving device is driven by application of reverse bias between the pixel electrode and the common electrode, whereby light incident on the light-receiving device can be sensed and electric charge can be generated and extracted as current. Alternatively, the pixel electrode may function as a cathode and the common electrode may function as an anode.

A manufacturing method similar to that of the light-emitting device can be employed for the light-receiving device. An island-shaped active layer (also referred to as a photoelectric conversion layer) included in the light-receiving layer is formed by processing a film that is to be the active layer and formed on the entire surface, not by patterning using a metal mask; thus, the island-shaped active layer can have a uniform thickness. In addition, a sacrificial layer provided over the active layer can reduce damage to the active layer in the manufacturing process of the display panel, increasing the reliability of the light-receiving device.

Figure 12B:
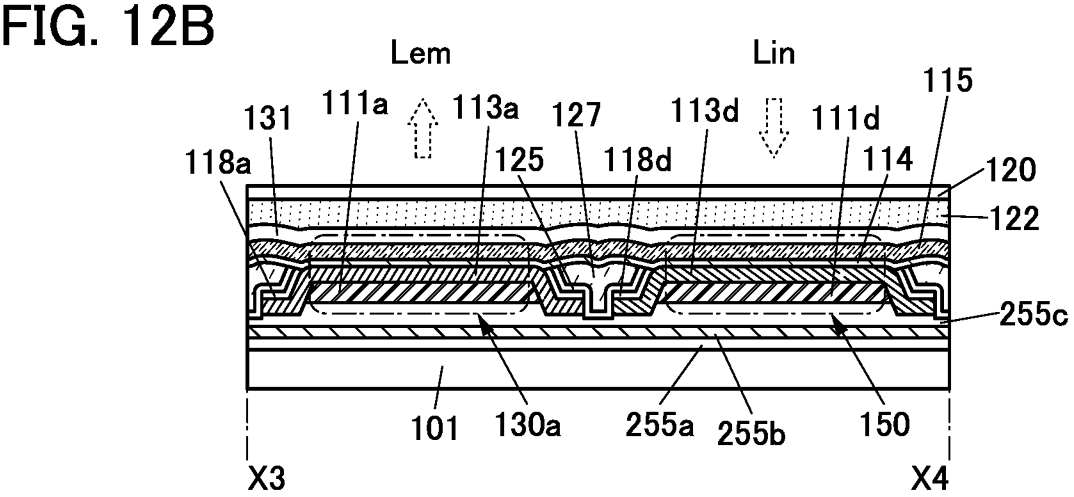
FIG. 12B is a cross-sectional view illustrating the example of a display panel.

FIG. 12B is a cross-sectional view along the dashed-dotted line X3-X4 in FIG. 12A. See FIG. 6B for a cross-sectional view along the dashed-dotted line X1-X2 in FIG. 12A, and see FIG. 7A or 7B for a cross-sectional view along the dashed-dotted line Y1-Y2 in FIG. 12A.

As illustrated in FIG. 12B, in the display panel 100, an insulating layer is provided over the layer 101 including a transistor, the light-emitting device 130*a* and the light-receiving device 150 are provided over the insulating layer, and the protective layer 131 is provided to cover the light-emitting device and the light-receiving device. The substrate 120 is bonded with the resin layer 122. In a region between the light-emitting device and the light-receiving device adjacent to each other, the insulating layer 125 and the insulating layer 127 over the insulating layer 125 are provided.

In FIG. 12B, light emitted from the light-emitting device 130*a* (light Lem) exits through the substrate 120 and light (light Lin) enters the light-receiving device 150 through the substrate 120.

The structure of the light-emitting device 130*a* is as described above.

The light-receiving device 150 includes a pixel electrode 111*d* over the insulating layer 255*c*, a fourth layer 113*d* over the pixel electrode 111*d*, the common layer 114 over the island-shaped fourth layer 113*d*, and the common electrode 115 over the common layer 114. The fourth layer 113*d* includes at least an active layer.

The fourth layer 113*d* is provided in the light-receiving device 150, not in the light-emitting devices. The common layer 114 is a continuous layer shared by the light-emitting devices and the light-receiving device.

Here, a layer shared by the light-receiving devices and the light-emitting devices may have a different function depending on which devices the layer is in. In this specification, the name of a component is based on its function in the light-emitting devices in some cases. For example, a hole-injection layer functions as a hole-injection layer in the light-emitting devices and functions as a hole-transport layer in the light-receiving devices. Similarly, an electron-injection layer functions as an electron-injection layer in the light-emitting devices and functions as an electron-transport layer in the light-receiving devices. A layer shared by the light-receiving devices and the light-emitting devices may have the same function in both the light-receiving devices and the light-emitting devices. For example, the hole-transport layer functions as a hole-transport layer in both the light-emitting devices and the light-receiving devices, and the electron-transport layer functions as an electron-transport layer in both the light-emitting devices and the light-receiving devices.

The sacrificial layer 118*a* is positioned between the third layer 113*a* and the insulating layer 125, and the sacrificial layer 118*d* is positioned between the fourth layer 113*d* and the insulating layer 125. The sacrificial layer 118*a* is a remaining portion of the sacrificial layer provided over the first layer 113*a* when the first layer 113*a* is processed. The sacrificial layer 118*d* is a remaining portion of the sacrificial layer provided over the fourth layer 113*d* which includes the active layer when the fourth layer 113*d* is processed. The sacrificial layer 118*a* and the sacrificial layer 118*d* may include the same material or different materials.

In the display panel includes a light-emitting device and a light-receiving device in a pixel, the pixel has a light-receiving function, whereby the contact or approach of an object can be sensed while an image is displayed. For example, an image can be displayed by using all the subpixels included in the display panel; or light can be emitted by some of the subpixels as a light source and an image can be displayed by using the remaining subpixels.

In the display panel of one embodiment of the present invention, the light-emitting devices are arranged in a matrix in a display portion, and an image can be displayed on the display portion. Furthermore, the light-receiving devices are arranged in a matrix in the display portion, and the display portion has one or both of an image capturing function and a sensing function in addition to an image displaying function. The display portion can be used as an image sensor or a touch sensor. That is, by sensing light at the display portion, an image can be captured or the approach or contact of an object (e.g., a finger, a hand, or a stylus) can be sensed. Furthermore, in the display panel of one embodiment of the present invention, the light-emitting devices can be used as a light source of the sensor. Accordingly, a light-receiving portion and a light source do not need to be provided separately from the display panel; hence, the number of components of an electronic device can be reduced. For example, a fingerprint authentication device provided in the electronic device, a capacitive touch panel for scroll operation, or the like is not necessarily provided separately. Thus, with the use of the display panel of one embodiment of the present invention, the electronic device can be provided at lower manufacturing costs.

In the display panel of one embodiment of the present invention, when an object reflects (or scatters) light emitted from the light-emitting device included in the display portion, the light-receiving device can sense the reflected light (or the scattered light); thus, image capturing or touch sensing is possible even in a dark place.

When the light-receiving devices are used as an image sensor, the display panel can capture an image using the light-receiving devices. For example, the display panel of this embodiment can be used as a scanner.

For example, data on biological information, such as a fingerprint and a palm print, can be obtained with the image sensor. That is, a biological authentication sensor can be incorporated in the display panel. When the display panel incorporates a biological authentication sensor, the number of components of an electronic device can be reduced as compared to the case where a biological authentication sensor is provided separately from the display panel; thus, the size and weight of the electronic device can be reduced.

When the light-receiving devices are used as the touch sensor, the display panel can sense the approach or contact of an object with the use of the light-receiving devices.

The display panel of one embodiment of the present invention can have one or both of an image capturing function and a sensing function in addition to the image display function. Thus, the display panel of one embodiment of the present invention can be regarded as highly compatible with the function other than the display function.

Next, materials that can be used for the light-emitting device will be described.

A conductive film that transmits visible light is used as the electrode through which light is extracted, which is either the pixel electrode or the common electrode. A conductive film that reflects visible light is preferably used as the electrode through which light is not extracted. In the case where a display panel includes a light-emitting device emitting infrared light, a conductive film which transmits visible light and infrared light is used as the electrode through which light is extracted, and a conductive film that reflects visible light and infrared light is preferably used as the electrode through which light is not extracted.

A conductive film that transmits visible light may be used also as the electrode through which light is not extracted. In that case, this electrode is preferably provided between the reflective layer and the EL layer. In other words, light emitted by the EL layer may be reflected by the reflective layer to be extracted from the display panel.

For the pair of electrodes (the pixel electrode and the common electrode) of the light-emitting device and the light-receiving device, a metal, an alloy, an electrically conductive compound, a mixture thereof, and the like can be used as appropriate. Specific examples include indium tin oxide (In—Sn oxide, also referred to as ITO), In—Si—Sn oxide (also referred to as ITSO), indium zinc oxide (In—Zn oxide), In—W—Zn oxide, an alloy containing aluminum (an aluminum alloy) such as an alloy of aluminum, nickel, and lanthanum (Al—Ni—La), and an alloy of silver, palladium, and copper (Ag—Pd—Cu, also referred to as APC). In addition, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. It is also possible to use a Group 1 element or a Group 2 element in the periodic table, which is not described above (e.g., lithium (Li), cesium (Cs), calcium (Ca), or strontium (Sr)), a rare earth metal such as europium (Eu) or ytterbium (Yb), an alloy containing an appropriate combination of any of these elements, graphene, or the like.

The light-emitting device preferably employs a microcavity structure. Therefore, one of the pair of electrodes of the light-emitting device is preferably an electrode having properties of transmitting and reflecting visible light (a transflective electrode), and the other is preferably an electrode having a property of reflecting visible light (a reflective electrode). When the light-emitting device has a microcavity structure, light obtained from the light-emitting layer can be resonated between the electrodes, whereby light emitted from the light-emitting device can be intensified.

The transflective electrode can have a stacked-layer structure of a reflective electrode and an electrode having a property of transmitting visible light (also referred to as a transparent electrode).

The transparent electrode has a light transmittance higher than or equal to 40%. For example, an electrode having a visible light (light at wavelengths greater than or equal to 400 nm and less than 750 nm) transmittance higher than or equal to 40% is preferably used in the light-emitting device. The visible light reflectivity of the transflective electrode is higher than or equal to 10% and less than or equal to 95%, preferably higher than or equal to 30% and lower than or equal to 80%. The visible light reflectivity of the reflective electrode is higher than or equal to 40% and lower than or equal to 100%, preferably higher than or equal to 70% and lower than or equal to 100%. These electrodes preferably have a resistivity of $1\times10^{-2}$ Ωcm or lower.

The light-emitting layer contains a light-emitting material (also referred to as a light-emitting substance). The light-emitting layer can contain one or more kinds of light-emitting substances. As the light-emitting substance, a substance whose emission color is blue, violet, bluish violet, green, yellowish green, yellow, orange, red, or the like is appropriately used. Alternatively, as the light-emitting substance, a substance that emits near-infrared light can be used.

Examples of the light-emitting substance include a fluorescent material, a phosphorescent material, a TADF material, and a quantum dot material.

Examples of a fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of a phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer may contain one or more kinds of organic compounds (e.g., a host material or an assist material) in addition to the light-emitting substance (guest material). As one or more kinds of organic compounds, one or both of a hole-transport material and an electron-transport material can be used. Alternatively, as one or more kinds of organic compounds, a bipolar material or a TADF material may be used.

The light-emitting layer preferably includes a phosphorescent material and a combination of a hole-transport material and an electron-transport material that easily forms an exciplex, for example. With such a structure, light emission can be efficiently obtained by exciplex-triplet energy transfer (ExTET), which is energy transfer from the exciplex to the light-emitting substance (phosphorescent material). When a combination of materials is selected so as to form an exciplex that emits light whose wavelength overlaps the wavelength of a lowest-energy-side absorption band of the light-emitting substance, energy can be transferred smoothly and light emission can be obtained efficiently. With the above structure, high efficiency, low-voltage driving, and a long lifetime of a light-emitting device can be achieved at the same time.

In addition to the light-emitting layer, each of the first layer 113*a*, the second layer 113*b*, and the third layer 113*c* may also include a layer containing any of a substance with a high hole-injection property, a substance with a high hole-transport property, a hole-blocking material, a substance with a high electron-transport property, a substance with a high electron-injection property, an electron-blocking material, a substance with a bipolar property (a substance with a high electron- and hole-transport property), and the like.

Either a low molecular compound or a high molecular compound can be used in the light-emitting device, and an inorganic compound may also be included. Each layer included in the light-emitting device can be formed by any of the following methods: an evaporation method (including a vacuum evaporation method), a transfer method, a printing method, an inkjet method, a coating method, and the like.

For example, the first layer 113*a*, the second layer 113*b*, and the third layer 113*c* may each include one or more of a hole-injection layer, a hole-transport layer, a hole-blocking layer, an electron-blocking layer, an electron-transport layer, and an electron-injection layer.

The common layer 114 can include one or more of a hole-injection layer, a hole-transport layer, a hole-blocking layer, an electron-blocking layer, an electron-transport layer, and an electron-injection layer. For example, a carrier-injection layer (a hole-injection layer or an electron-injection layer) may be formed as the common layer 114. Note that the light-emitting device does not necessarily include the common layer 114.

The first layer 113*a*, the second layer 113*b*, and the third layer 113*c* each preferably include a light-emitting layer and a carrier-transport layer over the light-emitting layer. Accordingly, the light-emitting layer is prevented from being exposed on the outermost surface in the process of manufacturing the display panel 100, so that damage to the light-emitting layer can be reduced. Thus, the reliability of the light-emitting device can be increased.

The hole-injection layer injects holes from the anode to the hole-transport layer and contains a material with a high hole-injection property. Examples of a material with a high hole-injection property include an aromatic amine compound and a composite material containing a hole-transport material and an acceptor material (electron-accepting material).

The hole-transport layer transports holes injected from the anode by the hole-injection layer, to the light-emitting layer. The hole-transport layer contains a hole-transport material. The hole-transport material preferably has a hole mobility of $1\times10^{-6}$ $cm^2/Vs$ or higher. Note that other substances can also be used as long as the substances have a hole-transport property higher than an electron-transport property. As the hole-transport material, materials having a high hole-transport property, such as a π-electron rich heteroaromatic compound (e.g., a carbazole derivative, a thiophene derivative, and a furan derivative) and an aromatic amine (a compound having an aromatic amine skeleton), are preferred.

The electron-transport layer transports electrons injected from the cathode by the electron-injection layer, to the light-emitting layer. The electron-transport layer contains an electron-transport material. The electron-transport material preferably has an electron mobility of $1\times10^{-6}$ $cm^2/Vs$ or higher. Note that other substances can also be used as long as the substances have an electron-transport property higher than a hole-transport property. As the electron-transport material, any of the following materials having a high electron-transport property can be used, for example: a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, and a π-electron deficient heteroaromatic compound such as a nitrogen-containing heteroaromatic compound.

The electron-injection layer injects electrons from the cathode to the electron-transport layer and contains a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used.

The electron-injection layer can be formed using an alkali metal, an alkaline earth metal, or a compound thereof, such as lithium, cesium, ytterbium, lithium fluoride (LiF), cesium fluoride (CsF), calcium fluoride ($CaF_x$, where X is a given number), 8-(quinolinolato)lithium (abbreviation: Liq), 2-(2-pyridyl)phenolatolithium (abbreviation: LiPP), 2-(2-pyridyl)-3-pyridinolato lithium (abbreviation: LiPPy), 4-phenyl-2-(2-pyridyl)phenolatolithium (abbreviation: LiPPP), lithium oxide ($LiO_x$), or cesium carbonate, for example. The electron-injection layer may have a stacked-layer structure of two or more layers. In the stacked-layer structure, for example, lithium fluoride can be used for the first layer and ytterbium can be used for the second layer.

Alternatively, the electron-injection layer may be formed using an electron-transport material. For example, a compound having an unshared electron pair and an electron deficient heteroaromatic ring can be used as the electron-transport material. Specifically, it is possible to use a compound having at least one of a pyridine ring, a diazine ring (a pyrimidine ring, a pyrazine ring, and a pyridazine ring), and a triazine ring.

Note that the lowest unoccupied molecular orbital (LUMO) level of the organic compound having an unshared electron pair is preferably greater than or equal to −3.6 eV and less than or equal to −2.3 eV. In general, the highest occupied molecular orbital (HOMO) level and the LUMO level of an organic compound can be estimated by cyclic voltammetry (CV), photoelectron spectroscopy, optical absorption spectroscopy, inverse photoelectron spectroscopy, or the like.

For example, 4,7-diphenyl-1,10-phenanthroline (abbreviation: BPhen), 2,9-di(naphthalen-2-yl)-4,7-diphenyl-1,10-phenanthroline (abbreviation: NBPhen), diquinoxalino[2,3-a:2',3'-c]phenazine (abbreviation: HATNA), 2,4,6-tris[3'-(pyridin-3-yl)biphenyl-3-yl]-1,3,5-triazine (abbreviation: TmPPPyTz), or the like can be used as the organic compound having an unshared electron pair. Note that NBPhen has a higher glass transition temperature (Tg) than BPhen and thus has high heat resistance.

In the case of manufacturing a tandem light-emitting device, a charge-generation layer (also referred to as an intermediate layer) is provided between two light-emitting units. The intermediate layer has a function of injecting electrons into one of the two light-emitting units and injecting holes to the other when voltage is applied between the pair of electrodes.

For example, the charge-generation layer can be favorably formed using a material that can be used for the electron-injection layer, such as lithium. As another example, the charge-generation layer can be favorably formed using a material that can be used for the hole-injection layer. Moreover, the charge-generation layer can be a layer containing a hole-transport material and an acceptor material (electron-accepting material). The charge-generation layer can be a layer containing an electron-transport material and a donor material. Forming such a charge-generation layer can suppress an increase in the driving voltage that would be caused when the light-emitting units are stacked.

Thin films included in the display panel (e.g., insulating films, semiconductor films, and conductive films) can be formed by a sputtering method, a chemical vapor deposition (CVD) method, a vacuum evaporation method, a pulsed laser deposition (PLD) method, an atomic layer deposition (ALD) method, or the like. Examples of a CVD method include a plasma-enhanced CVD (PECVD) method and a thermal CVD method. An example of a thermal CVD method is a metal organic CVD (MOCVD) method.

Alternatively, thin films included in the display panel (e.g., insulating films, semiconductor films, and conductive films) can be formed by a method such as spin coating, dipping, spray coating, ink-jetting, dispensing, screen printing, or offset printing or with a doctor knife, a slit coater, a roll coater, a curtain coater, or a knife coater.

Specifically, for fabrication of the light-emitting device, a vacuum process such as an evaporation method and a solution process such as a spin coating method or an inkjet method can be used. Examples of an evaporation method include physical vapor deposition methods (PVD methods) such as a sputtering method, an ion plating method, an ion beam evaporation method, a molecular beam evaporation method, and a vacuum evaporation method, and a chemical vapor deposition method (CVD method).

Specifically, functional layers (e.g., a hole-injection layer, a hole-transport layer, a light-emitting layer, an electron-transport layer, and an electron-injection layer) included in the EL layer can be formed by an evaporation method (e.g., a vacuum evaporation method), a coating method (e.g., a dip coating method, a die coating method, a bar coating method, a spin coating method, or a spray coating method), a printing method (e.g., an inkjet method, screen printing (stencil), offset printing (planography), flexography (relief printing), gravure printing, or micro-contact printing), or the like.

Thin films included in the display panel can be processed by a photolithography method or the like. Alternatively, thin films may be processed by a nanoimprinting method, a sandblasting method, a lift-off method, or the like. Alternatively, island-shaped thin films may be directly formed by a film formation method using a shielding mask such as a metal mask.

There are two typical examples of photolithography methods. In one of the methods, a resist mask is formed over a thin film that is to be processed, the thin film is processed by etching or the like, and then the resist mask is removed. In the other method, a photosensitive thin film is formed and then processed into a desired shape by light exposure and development.

As light for exposure in a photolithography method, it is possible to use light with the i-line (wavelength: 365 nm), light with the g-line (wavelength: 436 nm), light with the h-line (wavelength: 405 nm), or light in which the i-line, the g-line, and the K-line are mixed. Alternatively, ultraviolet light, KrF laser light, ArF laser light, or the like can be used. Exposure may be performed by liquid immersion exposure technique.

As the light for exposure, extreme ultraviolet (EUV) light or X-rays may also be used. Furthermore, instead of the light used for the exposure, an electron beam can also be used. It is preferable to use EUV light, X-rays, or an electron beam because they can perform extremely minute processing. Note that a photomask is not needed when exposure is performed by scanning with a beam such as an electron beam.

For etching of thin films, a dry etching method, a wet etching method, a sandblast method, or the like can be used.

As described above, in the method for manufacturing a display panel of one embodiment of the present invention, an island-shaped EL layer is formed by processing an EL layer formed on the entire surface, not by using a metal mask having a fine pattern. Consequently, the size of the island-shaped EL layer or even the size of the subpixel can be smaller than that obtained through the formation with a metal mask. Accordingly, a high-resolution display panel or a display panel having a high aperture ratio, which had been difficult to achieve, can be manufactured.

In the display panel of one embodiment of the present invention, since the light-emitting devices of different colors were separately formed, the carrier balance can be more easily adjusted and the emission color at a low luminance is less different from that at a high luminance. Each subpixel includes an island-shaped EL layer, which can inhibit generation of leakage current between the subpixels. Accordingly, degradation of the display quality of the display panel can be inhibited. In addition, both the higher definition and higher display quality of the display panel can be achieved.

This embodiment can be combined with any of the other embodiments as appropriate.

Embodiment 3

In this embodiment, a display panel of one embodiment of the present invention will be described with reference to FIGS. 13A to 13F, FIGS. 14A to 14H, FIGS. 15A to 15J, and FIGS. 16A to 16G

[Pixel Layout]

In this embodiment, pixel layouts different from those in FIG. 6A will be described. There is no particular limitation on the arrangement of subpixels, and a variety of methods can be employed. Examples of the arrangement of subpixels include stripe arrangement, S-stripe arrangement, matrix arrangement, delta arrangement, Bayer arrangement, and pentile arrangement.

Examples of a top surface shape of the subpixel include polygons such as a triangle, a tetragon (including a rectangle and a square), and a pentagon; polygons with rounded corners; an ellipse; and a circle. Here, a top surface shape of the subpixel corresponds to a top surface shape of a light-emitting region of the light-emitting device.

Figure 13A:
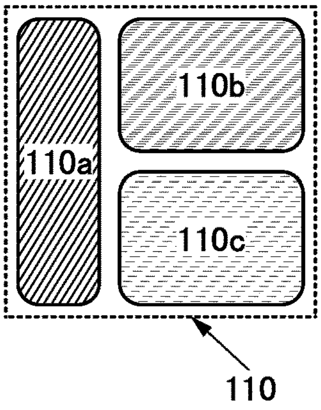
FIGS. 13A to 13F are top views illustrating examples of pixels.
Figure 15A:
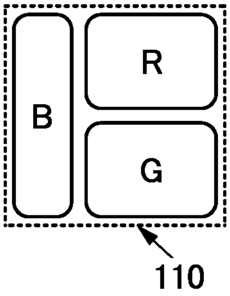
FIGS. 15A to 15J are top views illustrating examples of pixels.

The pixel 110 illustrated in FIG. 13A employs S-stripe arrangement. The pixel 110 in FIG. 13A consists of three subpixels 110*a*, 110*b*, and 110*c*. For example, as illustrated in FIG. 15A, the subpixel 110*a* may be a blue subpixel B, the subpixel 110*b* may be a red subpixel R, and the subpixel 110*c* may be a green subpixel G.

Figure 13B:
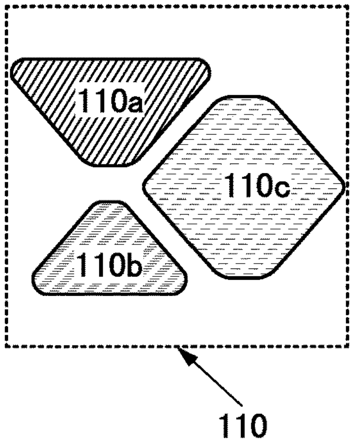
Figure 15B:
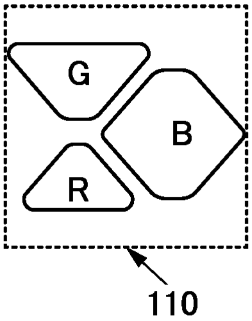

The pixel 110 illustrated in FIG. 13B includes the subpixel 110*a* whose top surface has a rough trapezoidal shape with rounded corners, the subpixel 110*b* whose top surface has a rough triangle shape with rounded corners, and the subpixel 110*c* whose top surface has a rough tetragonal or rough hexagonal shape with rounded corners. The subpixel 110*a* has a larger light-emitting area than the subpixel 110*b*. In this manner, the shapes and sizes of the subpixels can be determined independently. For example, as illustrated in FIG. 15B, the size of a subpixel including a light-emitting device with higher reliability can be smaller. For example, the subpixel 110*a* may be a green subpixel G, the subpixel 110*b* may be a red subpixel R, and the subpixel 110*c* may be a blue subpixel B.

Figure 13C:
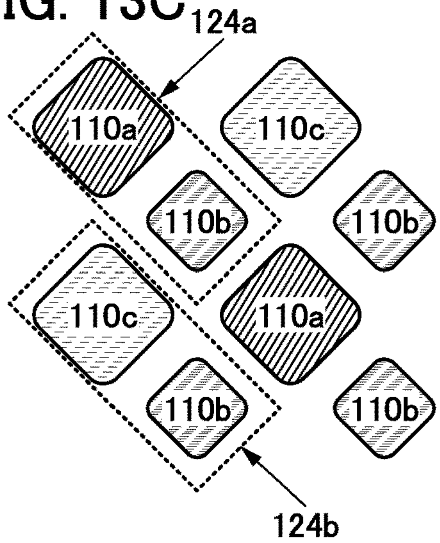
Figure 15C:
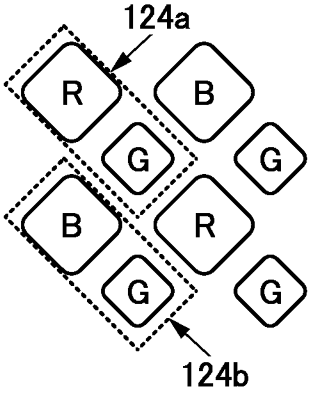

Pixels 124*a* and 124*b* illustrated in FIG. 13C employ pentile arrangement. FIG. 13C illustrates an example in which the pixels 124*a* including the subpixels 110*a* and 110*b* and the pixels 124*b* including the subpixels 110*b* and 110*c* are alternately arranged. For example, as illustrated in FIG. 15C, the subpixel 110*a* may be a red subpixel R, the subpixel 110*b* may be a green subpixel G, and the subpixel 110*c* may be a blue subpixel B.

Figure 13D:
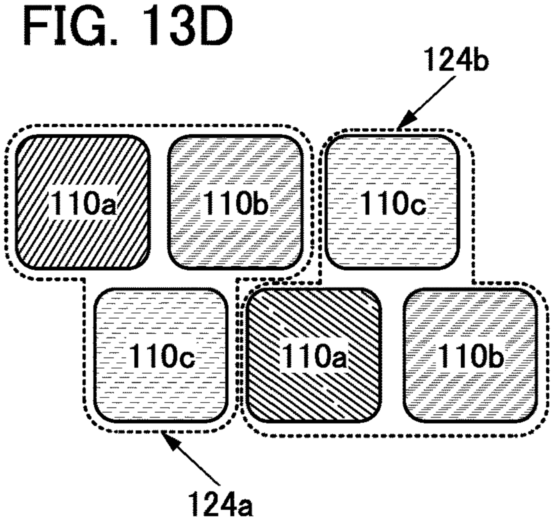
Figure 13E:
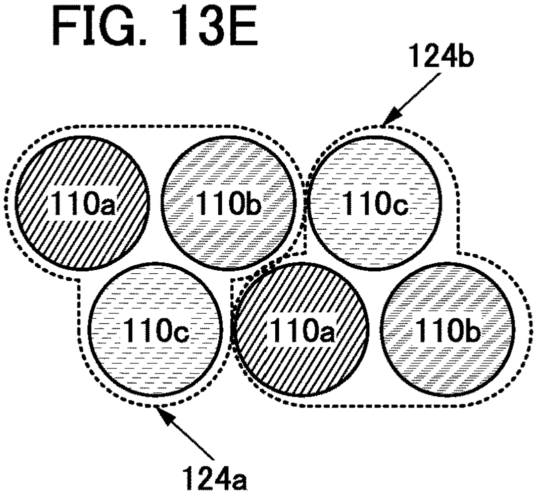
Figure 15D:
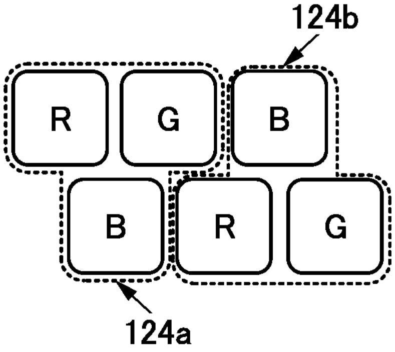

The pixels 124*a* and 124*b* illustrated in FIGS. 13D and 13E employ delta arrangement. The pixel 124*a* includes two subpixels (the subpixels 110*a* and 110*b*) in the upper row (first row) and one subpixel (the subpixel 110*c*) in the lower row (second row). The pixel 124*b* includes one subpixel (the subpixel 110*c*) in the upper row (first row) and two subpixels (the subpixels 110*a* and 110*b*) in the lower row (second row). For example, as illustrated in FIG. 15D, the subpixel 110*a* may be a red subpixel R, the subpixel 110*b* may be a green subpixel G, and the subpixel 110*c* may be a blue subpixel B.

FIG. 13D shows an example where the top surface of each subpixel has a rough tetragonal shape with rounded corners, and FIG. 13E shows an example where the top surface of each subpixel is circular.

Figure 13F:
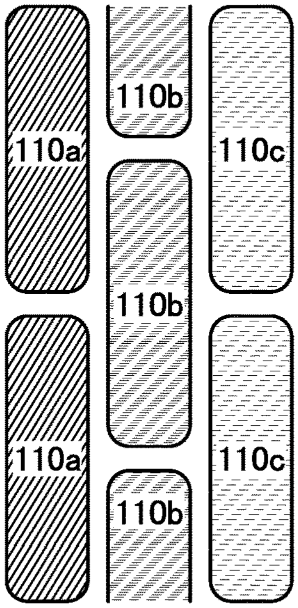
Figure 15E:
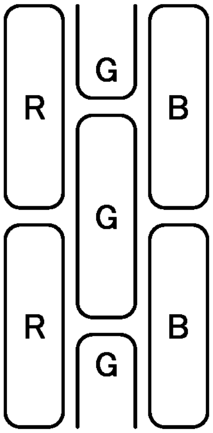

FIG. 13F shows an example where subpixels of different colors are arranged in a zigzag manner. Specifically, the positions of the top sides of two subpixels arranged in the column direction (e.g., the subpixel 110*a* and the subpixel 110*b* or the subpixel 110*b* and the subpixel 110*c*) are not aligned in the top view. For example, as illustrated in FIG. 15E, the subpixel 110*a* may be a red subpixel R, the subpixel 110*b* may be a green subpixel G, and the subpixel 110*c* may be a blue subpixel B.

In a photolithography method, as a pattern to be processed becomes finer, the influence of light diffraction becomes more difficult to ignore; therefore, the fidelity in transferring a photomask pattern by light exposure is degraded, and it becomes difficult to process a resist mask into a desired shape. Thus, a pattern with rounded corners is likely to be formed even with a rectangular photomask pattern. Consequently, the top surface of a subpixel can have a polygonal shape with rounded corners, an elliptical shape, a circular shape, or the like.

Furthermore, in the method for manufacturing the display panel of one embodiment of the present invention, the EL layer is processed into an island shape with the use of a resist mask. A resist film formed over the EL layer needs to be cured at a temperature lower than the upper temperature limit of the EL layer. Therefore, the resist film is insufficiently cured in some cases depending on the upper temperature limit of the material of the EL layer and the curing temperature of the resist material. An insufficiently cured resist film may have a shape different from a desired shape by processing. As a result, the top surface of the EL layer may have a polygonal shape with rounded corners, an elliptical shape, a circular shape, or the like. For example, when a resist mask with a square top surface is intended to be formed, a resist mask with a circular top surface may be formed, and the top surface of the EL layer may be circular.

To obtain a desired top surface shape of the EL layer, a technique of correcting a mask pattern in advance so that a transferred pattern agrees with a design pattern (an optical proximity correction (OPC) technique) may be used. Specifically, with the OPC technique, a pattern for correction is added to a corner portion or the like of a figure on a mask pattern.

Figure 15F:
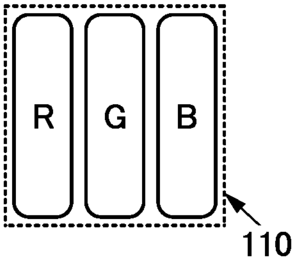
Figure 15G:
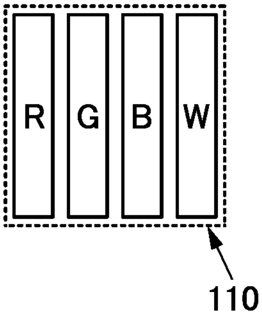
Figure 15H:
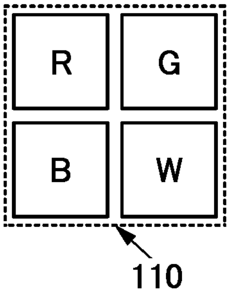
Figure 15I:
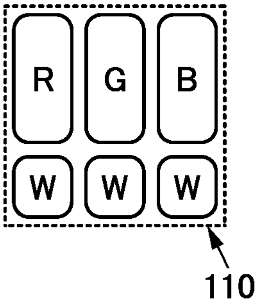
Figure 15J:
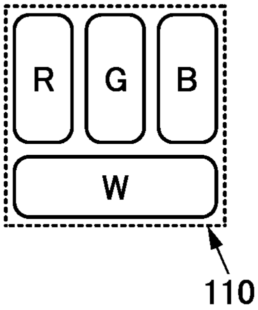

Also in the pixel 110 illustrated in FIG. 6A, which employs stripe arrangement, the subpixel 110*a* may be a red subpixel R, the subpixel 110*b* may be a green subpixel G, and the subpixel 110*c* may be a blue subpixel B as illustrated in FIG. 15F, for example.

As illustrated in FIGS. 14A to 14H, the pixel can include four types of subpixels.

Figure 14A:
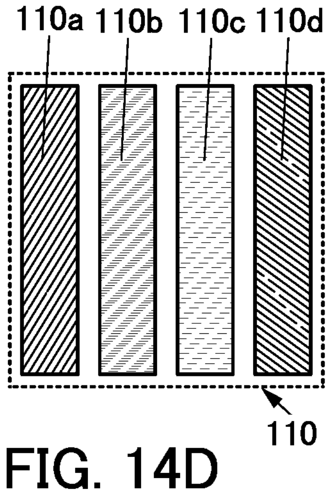
FIGS. 14A to 14H are top views illustrating examples of pixels.
Figure 14B:
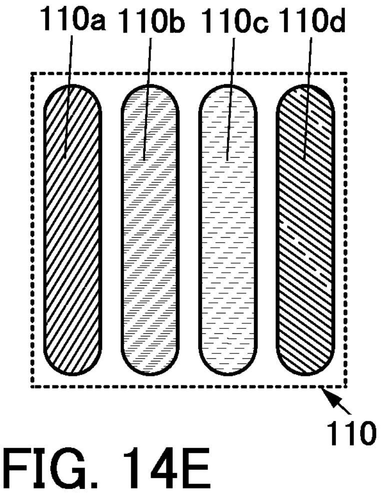
Figure 14C:
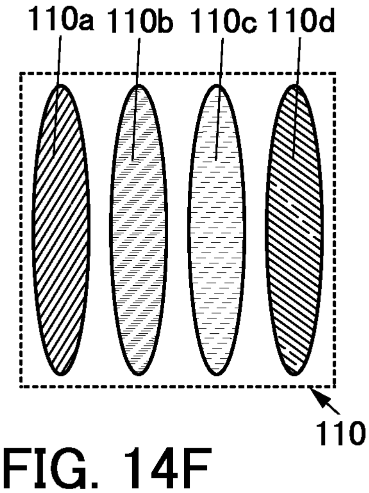

The pixel 110 illustrated in FIGS. 14A to 14C employs S-stripe arrangement.

FIG. 14A illustrates an example in which each subpixel has a rectangular top surface shape, FIG. 14B illustrates an example in which each subpixel has a top surface shape formed by combining two half circles and a rectangle, and FIG. 14C illustrates an example in which each subpixel has an elliptical top surface shape.

Figure 14D:
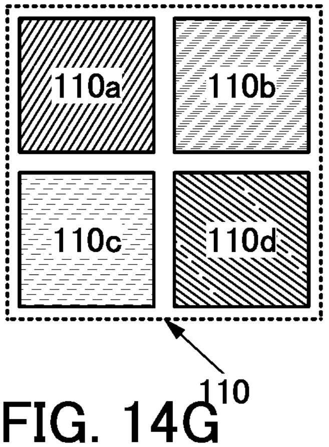
Figure 14E:
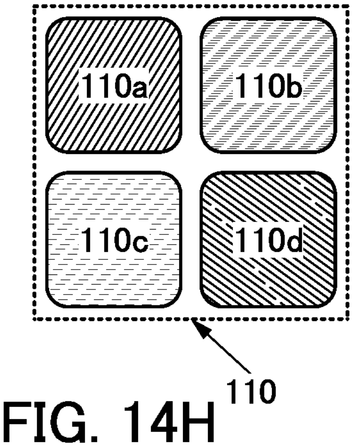
Figure 14F:
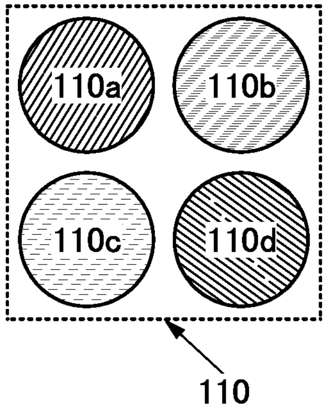

The pixel 110 illustrated in FIGS. 14D to 14F employs matrix arrangement.

FIG. 14D illustrates an example in which each subpixel has a square top surface shape, FIG. 14E illustrates an example in which each subpixel has a substantially square top surface shape with rounded corners, and FIG. 14F illustrates an example in which each subpixel has a circular top surface shape.

Figure 14G:
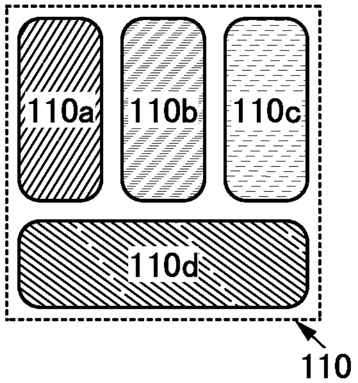
Figure 14H:
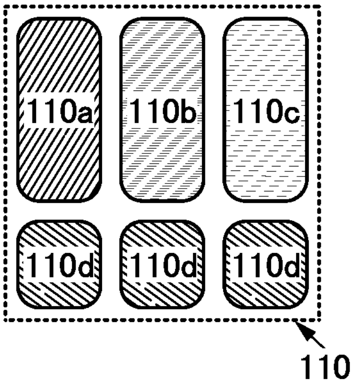

FIGS. 14G and 14H each illustrate an example in which one pixel 110 is composed of two rows and three columns.

The pixel 110 illustrated in FIG. 14G includes three subpixels (the subpixels 110*a*, 110*b*, and 110*c*) in the upper row (first row) and one subpixel (subpixel 110*d*) in the lower row (second row). In other words, the pixel 110 includes the subpixel 110*a* in the left column (first column), the subpixel 110*b* and another subpixel 110*d* in the center column (second column), the subpixel 110*c* in the right column (third column), and the subpixel 110*d* across these three columns.

The pixel 110 illustrated in FIG. 14H includes three subpixels (the subpixels 110*a*, 110*b*, and 110*c*) in the upper row (first row) and three subpixels 110*d* in the lower row (second row). In other words, the pixel 110 includes the subpixel 110*a* and the subpixel 110*d* in the left column (first column), the subpixel 110*b* and another subpixel 110*d* in the center column (second column), and the subpixel 110*c* and another subpixel 110*d* in the right column (third column). Matching the positions of the subpixels in the upper row and the lower row as illustrated in FIG. 14H enables dust and the like that would be produced in the manufacturing process to be removed efficiently. Thus, a display panel having high display quality can be provided.

The pixel 110 illustrated in FIG. 14A to 14H includes four types of subpixels 110*a*, 110*b*, 110*c*, and 110*d*. The subpixels 110*a*, 110*b*, 110*c*, and 110*d* each include light-emitting devices that emit light of different colors from each other. The subpixels 110*a*, 110*b*, 110*c*, and 110*d* can be of four colors of R, G, B, and white (W), four colors of R, G, B, and Y, of R, G, B and infrared light (IR), or the like. For example, the subpixels 110*a*, 110*b*, 110*c*, and 110*d* can be red, green, blue, and white subpixels, respectively, as illustrated in FIGS. 15G to 15J.

The display panel of one embodiment of the present invention may include a light-receiving device in the pixel.

Three of the four subpixels included in the pixel 110 in FIGS. 15G to 15J may include a light-emitting device and the other one may include a light-receiving device.

For example, the subpixels 110*a*, 110*b*, and 110*c* may be subpixels for three colors of R, G, and B, and the subpixel 110*d* may be a subpixel including the light-receiving device.

Figure 16A:
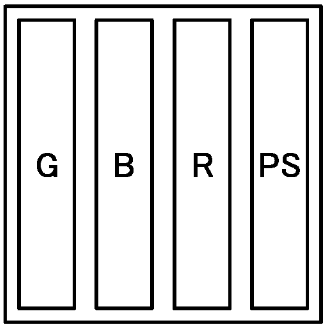
FIGS. 16A to 16D are top views illustrating examples of pixels.
Figure 16B:
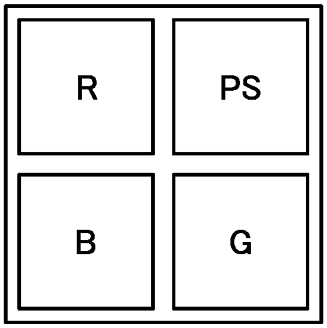

The pixels illustrated in FIGS. 16A and 16B each include the subpixels G, B, and R and a subpixel PS. Note that the arrangement order of the subpixels is not limited to the structures illustrated in the drawings and can be determined as appropriate. For example, the positions of the subpixels G and R may be reversed.

The pixel illustrated in FIG. 16A employs S-stripe arrangement. The pixel illustrated in FIG. 16B employs matrix arrangement.

The subpixel R includes a light-emitting device that emits red light. The subpixel G includes a light-emitting device that emits green light. The subpixel B includes a light-emitting device that emits blue light.

The subpixel PS includes the light-receiving device. The wavelength of light detected by the subpixel PS is not particularly limited. The subpixel PS can have a structure in which one or both of infrared light and visible light can be sensed.

Figure 16C:
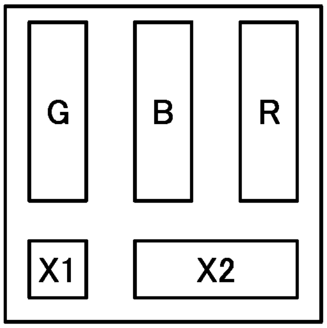
Figure 16D:
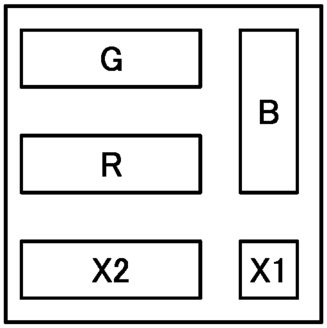

The pixels illustrated in FIGS. 16C and 16D each include the subpixels G, B, and R, a subpixel X1, and a subpixel X2. Note that the arrangement order of the subpixels is not limited to the structures illustrated in the drawings and can be determined as appropriate. For example, the positions of the subpixels G and R may be reversed.

FIG. 16C illustrates an example in which one pixel is provided in two rows and three columns. Three subpixels (the subpixels G, B, and R) are provided in the upper row (first row). In FIG. 16C, two subpixels (subpixels X1 and X2) are provided in the lower row (second row).

FIG. 16D illustrates an example in which one pixel is composed of three rows and two columns. In FIG. 16D, the pixel includes the subpixel G in the first row, the subpixel R in the second row, and the subpixel B in the first and second rows. In addition, two subpixels (the subpixels X1 and X2) are provided in the third row. In other words, the pixel illustrated in FIG. 16D includes three subpixels (the subpixels G, B, and X2) in the left column (first column) and two subpixels (the subpixels B and X1) in the right column (second column).

The layout of the subpixels R, G, and B in FIG. 16C is stripe arrangement. The layout of the subpixels R, G, and B in FIG. 16D is what is called S stripe arrangement. Thus, high display quality can be achieved.

At least one of the subpixels X1 and X2 preferably includes the light-receiving device (i.e., the subpixel PS).

Note that the layout of the pixel including the subpixel PS is not limited to the structures illustrated in FIGS. 16A to 16D.

The subpixel X1 or X2 may include a light-emitting device that emits infrared light (IR), for example. In this case, the subpixel PS preferably senses infrared light. For example, while an image is displayed using the subpixels R, G, and B, reflected light of the light emitted from one of the subpixels X1 and X2 as a light source can be sensed by the other of the subpixels X1 and X2.

Both the subpixels X1 and X2 may be configured to include the light-receiving device. In this case, the wavelength ranges of the light sensed by the subpixels X1 and X2 may be the same, different, or partially the same. For example, one of the subpixels X1 and X2 mainly senses visible light while the other mainly senses infrared light.

The light-receiving area of the subpixel X1 is smaller than that of the subpixel X2. A smaller light-receiving area leads to a narrower image-capturing range, prevents a blur in a captured image, and improves the definition. Thus, the use of the subpixel X1 enables higher-resolution or higher-definition image capturing than the use of the light-receiving device of the subpixel X2. For example, image capturing for personal authentication with the use of a fingerprint, a palm print, the iris, the shape of a blood vessel (including the shape of a vein and the shape of an artery), a face, or the like is possible by using the subpixel X1.

The light-receiving device included in the subpixel PS preferably senses visible light, and preferably senses at least one of blue, violet, bluish violet, green, greenish yellow, yellow, orange, red, and the like. The light-receiving device included in the subpixel PS may sense infrared light.

When the subpixel X2 includes the light-receiving device, the subpixel X2 can be used in a touch sensor (also referred to as a direct touch sensor), a near touch sensor (also referred to as a hover sensor, a hover touch sensor, a contactless sensor, or a touchless sensor), or the like. The wavelength of light that the subpixel X2 senses can be determined depending on the application. For example, the subpixel X2 preferably senses infrared light to allow touch sensing even in a dark place.

Here, the touch sensor or the near touch sensor can detect an approach or contact of an object (e.g., a finger, a hand, or a pen).

The touch sensor can detect the object when the display panel and the object come in direct contact with each other. Furthermore, the near touch sensor can detect the object even when the object is not in contact with the display panel. For example, the display panel is preferably capable of sensing an object positioned in the range of 0.1 mm to 300 mm inclusive, further preferably 3 mm to 50 mm inclusive from the display panel. This structure enables the display panel to be operated without direct contact of an object. In other words, the display panel can be operated in a contactless (touchless) manner. With the above-described structure, the display panel can be controlled with a reduced risk of making the display panel dirty or damaging the display panel or without the object directly touching a dirt (e.g., dust, bacteria, or a virus) attached to the display panel.

The refresh rate can be variable in the display panel of one embodiment of the present invention. For example, the refresh rate can be adjusted in accordance with the contents displayed on the display panel (e.g., adjusted in the range from 1 Hz to 240 Hz), whereby power consumption can be reduced. The driving frequency of the touch sensor or the near touch sensor may be changed in accordance with the refresh rate. For example, when the refresh rate of the display panel is 120 Hz, the driving frequency of the touch sensor or the near touch sensor can be higher than 120 Hz (can typically be 240 Hz). With this structure, low power consumption can be achieved, and the response speed of the touch sensor or the near touch sensor can be increased.

Figure 16E:
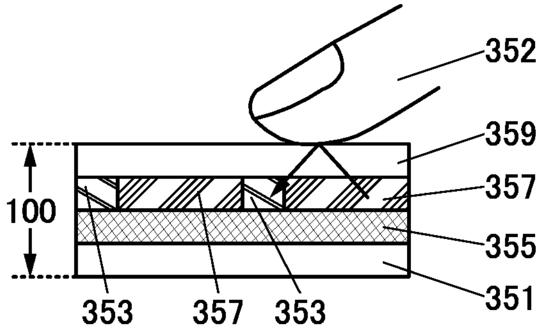
FIGS. 16E to 16G are cross-sectional views illustrating examples of a display panel.
Figure 16F:
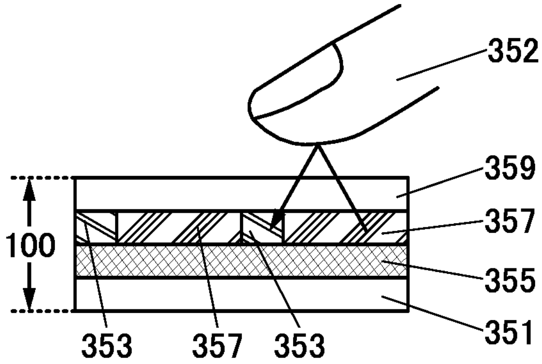
Figure 16G:
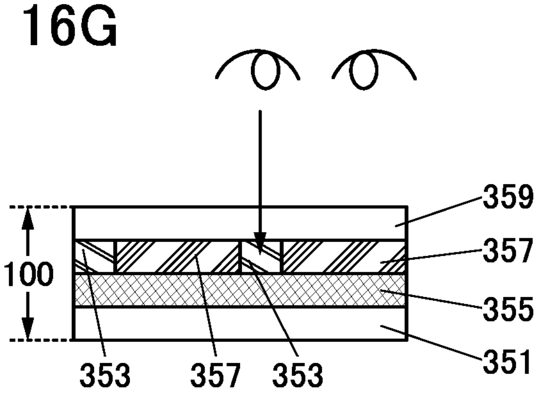

The display panel 100 illustrated in FIGS. 16E to 16G includes, between a substrate 351 and a substrate 359, a layer 353 including a light-receiving device, a functional layer 355, and a layer 357 including a light-emitting device.

The functional layer 355 includes a circuit for driving a light-receiving device and a circuit for driving a light-emitting device. A switch, a transistor, a capacitor, a resistor, a wiring, a terminal, or the like can be provided in the functional layer 355. Note that in the case where the light-emitting device and the light-receiving device are driven by a passive-matrix method, a structure not provided with a switch and a transistor may be employed.

For example, light emitted by the light-emitting device in the layer 357 including a light-emitting device is reflected by a finger 352 that is touching the display panel 100 as illustrated in FIG. 16E; then, the light-receiving device in the layer 353 including a light-receiving device detects the reflected light. Thus, the touch of the finger 352 on the display panel 100 can be detected.

The display panel may have a function of detecting an object that is approaching (but is not touching) the display panel or capturing an image of such an object, as illustrated in FIGS. 16F and 16G. FIG. 16F illustrates an example in which a human finger is detected, and FIG. 16G illustrates an example in which information on the surroundings, surface, or inside of the human eye (e.g., the number of blinks, the movement of an eyeball, and the movement of an eyelid) is detected.

In the display panel in this embodiment, an image of the periphery, surface, or inside (e.g., fundus) of an eye of a user of a wearable device can be captured with the use of the light-receiving device. Therefore, the wearable device can have a function of sensing one or more selected from blinking, movement of an iris, and movement of an eyelid of the user.

As described above, the pixel composed of the subpixels each including the light-emitting device can employ any of a variety of layouts in the display panel of one embodiment of the present invention. The pixel including both the light-emitting device and the light-receiving device can also be used in the display panel of one embodiment of the present invention; this structure can also employ any of a variety of layouts.

This embodiment can be combined with any of the other embodiments as appropriate.

Embodiment 4

In this embodiment, the display panel of one embodiment of the present invention will be described with reference to FIGS. 17A and 17B, FIGS. 18A and 18B, FIG. 19, FIG. 20, FIG. 21, FIG. 22, FIG. 23, FIG. 24, FIGS. 25A to 25C, FIGS. 26A to 26D, and FIG. 27.

The display panel of this embodiment can be a high-resolution display panel. Accordingly, the display panel of this embodiment can be used for display portions of information terminals (wearable devices) such as watch-type and bracelet-type information terminals and display portions of wearable devices capable of being worn on the head, such as a VR device like a head-mounted display and a glasses-type AR device.

The display panel of this embodiment can be a high-definition display panel or a large-sized display panel. Accordingly, the display panel of this embodiment can be used for display portions of electronic devices such as a digital camera, a digital video camera, a digital photo frame, a mobile phone, a portable game console, a portable information terminal, and an audio reproducing device, in addition to display portions of electronic devices with a relatively large screen, such as a television device, a desktop or laptop personal computer, a monitor of a computer or the like, digital signage, and a large game machine such as a pachinko machine.

In the display panel of this embodiment, since the light-emitting devices of different colors are separately formed, the difference between the chromaticity at low luminance emission and that at high luminance emission is small. Furthermore, since the EL layers of the respective light-emitting devices are separated from each other, crosstalk generated between adjacent subpixels can be prevented while the display panel of this embodiment has high resolution. Accordingly, the display panel can have high resolution and high display quality.

Thus, the display panel of this embodiment can be used for one or both of the wearable display apparatus and the terminal in the display system of one embodiment of the present invention.

[Display Module]

Figure 17A:
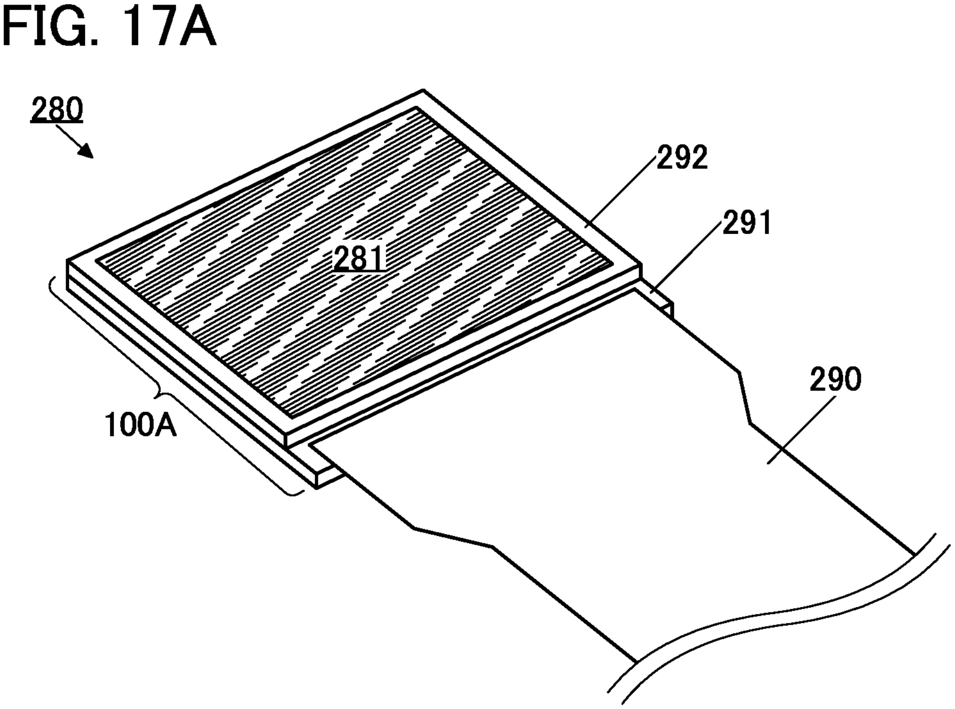
FIGS. 17A and 17B are perspective views illustrating an example of a display panel.

FIG. 17A is a perspective view of a display module 280. The display module 280 includes a display panel 100A and an FPC 290. Note that the display panel included in the display module 280 is not limited to the display panel 100A and may be any of display panels 100B to 100F described later.

The display module 280 includes a substrate 291 and a substrate 292. The display module 280 includes a display portion 281. The display portion 281 is a region of the display module 280 where an image is displayed, and is a region where light emitted from pixels provided in a pixel portion 284 described later can be seen.

Figure 17B:
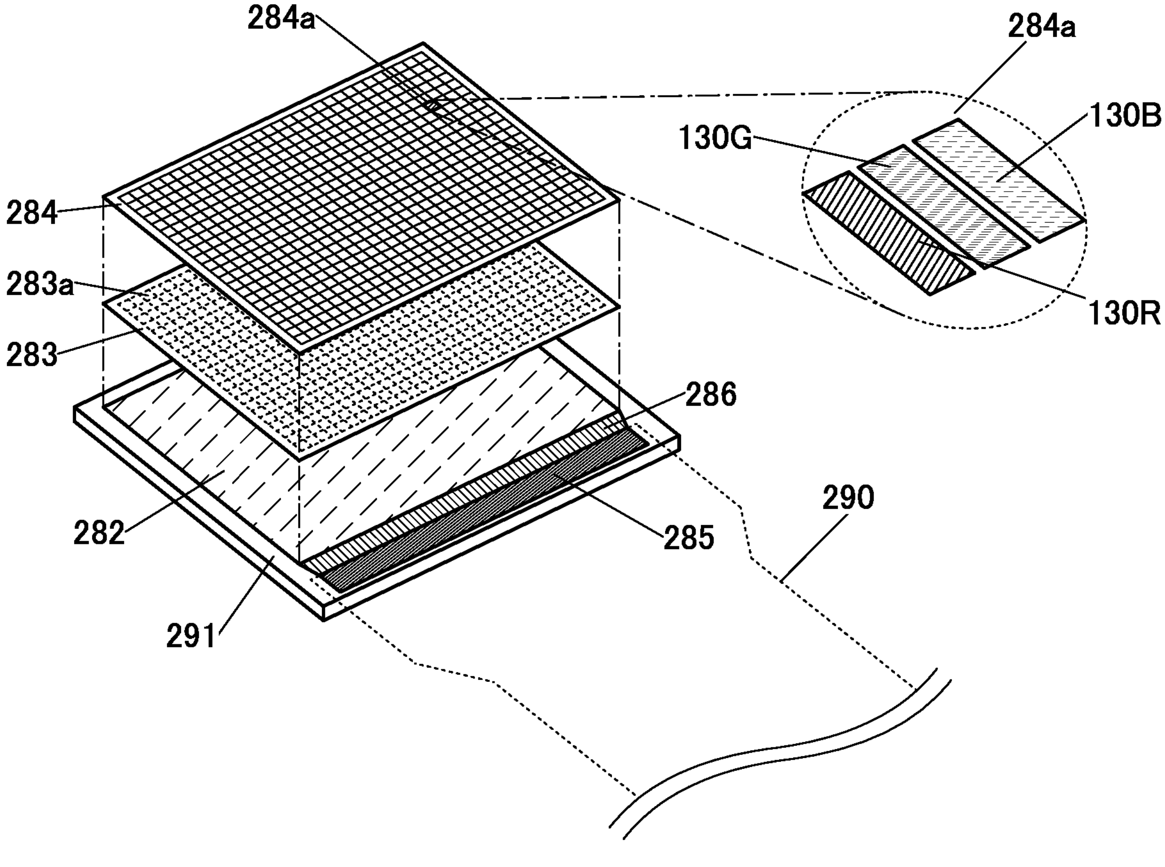

FIG. 17B is a perspective view schematically illustrating a structure on the substrate 291 side. Over the substrate 291, a circuit portion 282, a pixel circuit portion 283 over the circuit portion 282, and the pixel portion 284 over the pixel circuit portion 283 are stacked. A terminal portion 285 to be connected to the FPC 290 is provided in a portion over the substrate 291 that does not overlap with the pixel portion 284. The terminal portion 285 and the circuit portion 282 are electrically connected to each other through a wiring portion 286 formed of a plurality of wirings.

The pixel portion 284 includes a plurality of pixels 284*a* arranged periodically. An enlarged view of one pixel 284*a* is illustrated on the right side in FIG. 17B. The pixel 284*a* includes the light-emitting device 130R emitting red light, the light-emitting device 130G emitting green light, and the light-emitting device 130B emitting blue light.

The pixel circuit portion 283 includes a plurality of pixel circuits 283*a* arranged periodically.

One pixel circuit 283*a* is a circuit that controls light emission of three light-emitting devices included in one pixel 284*a*. One pixel circuit 283*a* may be provided with three circuits each of which controls light emission of one light-emitting device. For example, the pixel circuit 283*a* can include at least one selection transistor, one current control transistor (driving transistor), and a capacitor for one light-emitting device. In this case, a gate signal is input to a gate of the selection transistor, and a source signal is input to a source of the selection transistor. Thus, an active-matrix display panel is achieved.

The circuit portion 282 includes a circuit for driving the pixel circuits 283*a* in the pixel circuit portion 283. For example, the circuit portion 282 preferably includes one or both of a gate line driver circuit and a source line driver circuit. The circuit portion 282 may also include at least one of an arithmetic circuit, a memory circuit, a power supply circuit, and the like.

The FPC 290 functions as a wiring for supplying a video signal, a power supply potential, or the like to the circuit portion 282 from the outside. An IC may be mounted on the FPC 290.

The display module 280 can have a structure in which one or both of the pixel circuit portion 283 and the circuit portion 282 are stacked below the pixel portion 284; hence, the aperture ratio (effective emission ratio) of the display portion 281 can be significantly high. For example, the aperture ratio of the display portion 281 can be greater than or equal to 40% and less than 100%, preferably greater than or equal to 50% and less than or equal to 95%, further preferably greater than or equal to 60% and less than or equal to 95%. Furthermore, the pixels 284*a* can be arranged extremely densely and thus the display portion 281 can have extremely high resolution. For example, the pixels 284*a* are preferably arranged in the display portion 281 with a resolution greater than or equal to 2000 ppi, preferably greater than or equal to 3000 ppi, further preferably greater than or equal to 5000 ppi, still further preferably greater than or equal to 6000 ppi, and less than or equal to 20000 ppi or less than or equal to 30000 ppi.

Such a display module 280 has extremely high resolution, and thus can be suitably used for a VR device such as a head-mounted display or a glasses-type AR device. For example, even with a structure in which the display portion of the display module 280 is seen through a lens, pixels of the extremely-high-resolution display portion 281 included in the display module 280 are prevented from being perceived when the display portion is enlarged by the lens, so that display providing a high level of immersion can be performed. Without being limited thereto, the display module 280 can be suitably used for electronic devices including a relatively small display portion. For example, the display module 280 can be favorably used in a display portion of a wearable electronic device, such as a wrist watch.

[Display Panel 100A]

Figure 18A:
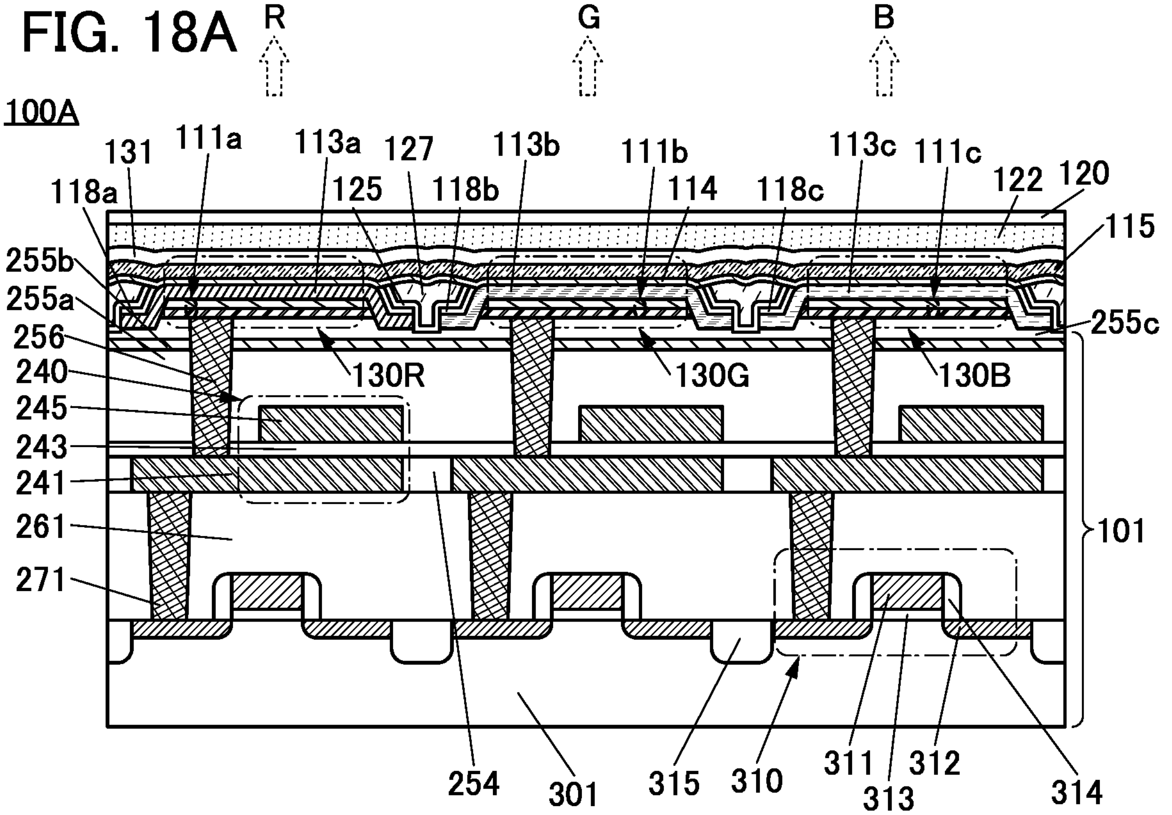
FIGS. 18A and 18B are cross-sectional views each illustrating an example of a display panel.

The display panel 100A illustrated in FIG. 18A includes a substrate 301, the light-emitting devices 130R, 130G, and 130B, a capacitor 240, and a transistor 310.

The substrate 301 corresponds to the substrate 291 illustrated in FIGS. 17A and 17B. A stacked-layer structure including the substrate 301 and the components thereover up to an insulating layer 255*c* corresponds to the layer 101 including a transistor in Embodiment 2.

The transistor 310 includes a channel formation region in the substrate 301. As the substrate 301, a semiconductor substrate such as a single crystal silicon substrate can be used, for example. The transistor 310 includes part of the substrate 301, a conductive layer 311, low-resistance regions 312, an insulating layer 313, and an insulating layer 314. The conductive layer 311 functions as a gate electrode. The insulating layer 313 is positioned between the substrate 301 and the conductive layer 311 and functions as a gate insulating layer. The low-resistance regions 312 are regions where the substrate 301 is doped with an impurity, and function as a source and a drain. The insulating layer 314 is provided to cover the side surface of the conductive layer 311.

An element isolation layer 315 is provided between two adjacent transistors 310 to be embedded in the substrate 301.

An insulating layer 261 is provided to cover the transistor 310, and the capacitor 240 is provided over the insulating layer 261.

The capacitor 240 includes a conductive layer 241, a conductive layer 245, and an insulating layer 243 between the conductive layers 241 and 245. The conductive layer 241 functions as one electrode of the capacitor 240, the conductive layer 245 functions as the other electrode of the capacitor 240, and the insulating layer 243 functions as a dielectric of the capacitor 240.

The conductive layer 241 is provided over the insulating layer 261 and is embedded in an insulating layer 254. The conductive layer 241 is electrically connected to one of the source and the drain of the transistor 310 through a plug 271 embedded in the insulating layer 261. The insulating layer 243 is provided to cover the conductive layer 241. The conductive layer 245 is provided in a region overlapping the conductive layer 241 with the insulating layer 243 therebetween.

The insulating layer 255*a* is provided to cover the capacitor 240, the insulating layer 255*b* is provided over the insulating layer 255*a*, and the insulating layer 255*c* is provided over the insulating layer 255*b*.

As each of the insulating layers 255*a*, 255*b*, and 255*c*, a variety of inorganic insulating films such as an oxide insulating film, a nitride insulating film, an oxynitride insulating film, and a nitride oxide insulating film can be suitably used. As the insulating layers 255*a* and 255*c*, an oxide insulating film or an oxynitride insulating film, such as a silicon oxide film, a silicon oxynitride film, or an aluminum oxide film, is preferably used. As the insulating layer 255*b*, a nitride insulating film or a nitride oxide insulating film, such as a silicon nitride film or a silicon nitride oxide film, is preferably used. Specifically, it is preferred that a silicon oxide film be used as the insulating layer layers 255*a* and 255*c* and a silicon nitride film be used as the insulating layer 255*b*. The insulating layer 255*b* preferably has a function of an etching protective film. Although this embodiment shows an example in which a depression portion is provided in the insulating layer 255*c*, a depression portion is not necessarily provided in the insulating layer 255*c*.

The light-emitting device 130R, the light-emitting device 130G, and the light-emitting device 130B are provided over the insulating layer 255*c*. FIG. 18A illustrates an example in which the light-emitting device 130R, the light-emitting device 130G, and the light-emitting device 130B each have a structure similar to the stacked-layer structure illustrated in FIG. 6B.

In the display panel 100A, since the light-emitting devices of different colors are separately formed, the difference between the chromaticity at low luminance emission and that at high luminance emission is small. Furthermore, since the first layer 113*a*, the second layer 113*b*, and the third layer 113*c* are separated from each other, crosstalk generated between adjacent subpixels can be prevented while the display panel 100A has high resolution. Accordingly, the display panel can have high resolution and high display quality.

An insulator is provided in a region between adjacent light-emitting devices. In FIG. 18A and the like, the insulating layer 125 and the insulating layer 127 over the insulating layer 125 are provided in those regions.

The sacrificial layer 118*a* is positioned over the first layer 113*a* in the light-emitting device 130R, the sacrificial layer 118*b* is positioned over the second layer 113*b* in the light-emitting device 130G, and the sacrificial layer 118*c* is positioned over the third layer 113*c* in the light-emitting device 130B.

The pixel electrodes 111*a*, 111*b*, and 111*c* of each of the light-emitting devices are electrically connected to one of the source and the drain of the transistor 310 through a plug 256 embedded in the insulating layers 255*a*, 255*b*, and 255*c*, the conductive layer 241 embedded in the insulating layer 254, and the plug 271 embedded in the insulating layer 261. The top surface of the insulating layer 255*c* and the top surface of the plug 256 are level with or substantially level with each other. A variety of conductive materials can be used for the plugs. In this example, the pixel electrodes 111*a*, 111*b*, and 111*c* each have a stacked-layer structure. In each stacked-layer structure, a conductive film that reflects visible light can be used for the layer in contact with the plug 256, and a conductive film that transmits visible light can be used for the portion in contact with the first layer 113*a* and the like.

The protective layer 131 is provided over the light-emitting devices 130R, 130G, and 130B. The substrate 120 is bonded to the protective layer 131 with the resin layer 122. Embodiment 2 can be referred to for the details of the light-emitting devices and the components thereover up to the substrate 120. The substrate 120 corresponds to the substrate 292 in FIG. 17A.

An insulating layer covering an end portion of the top surface of the pixel electrode 111*a* is not provided between the pixel electrode 111*a* and the first layer 113*a*. An insulating layer covering an end portion of the top surface of the pixel electrode 111*b* is not provided between the pixel electrode 111*b* and the second layer 113*b*. Thus, the distance between adjacent light-emitting devices can be extremely shortened. Accordingly, the display panel can have high resolution or high definition.

Although the display panel 100A includes the light-emitting devices 130R, 130G, and 130B in this example, the display panel of this embodiment may further include the light-receiving device.

Figure 18B:
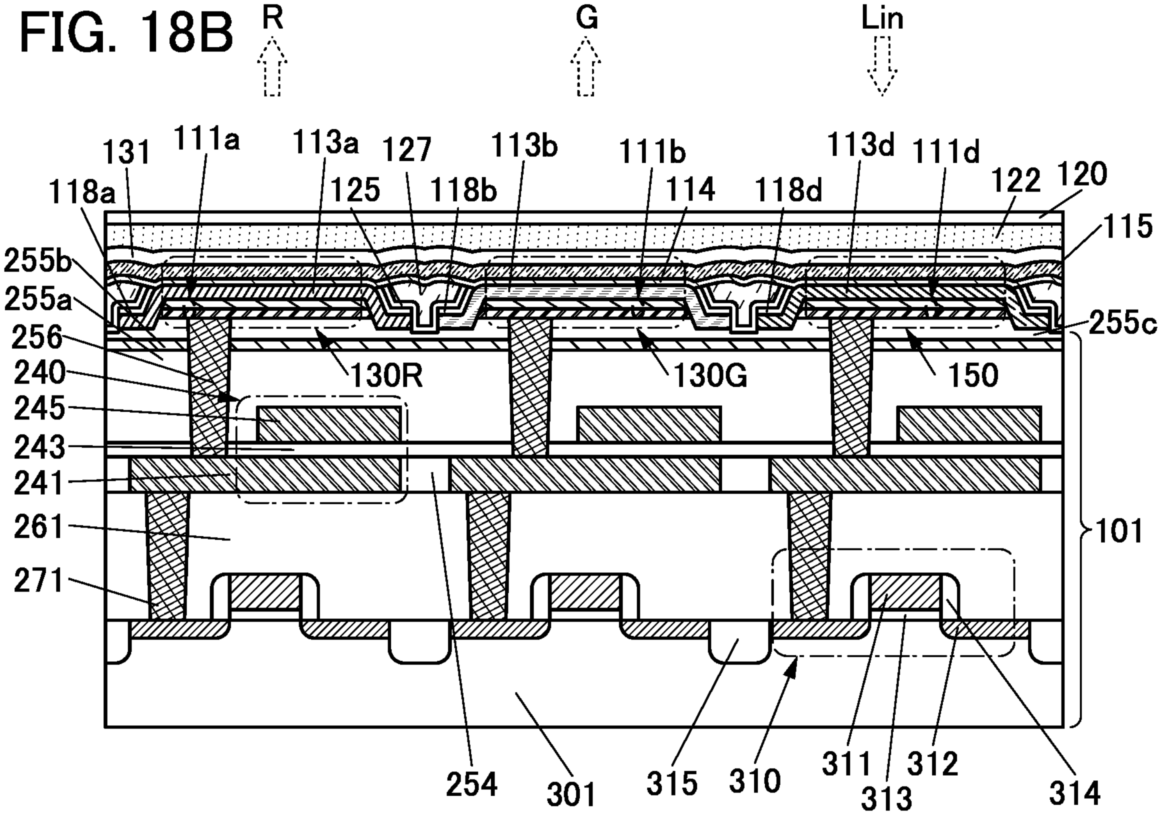

The display panel illustrated in FIG. 18B includes the light-emitting devices 130R and 130G and the light-receiving device 150. The light-receiving device 150 includes the pixel electrode 111*d*, the fourth layer 113*d*, the common layer 114, and the common electrode 115 which are stacked. Embodiment 2 can be referred to for the details of the components of the light-receiving device 150.

[Display Panel 100B]

Figure 19:
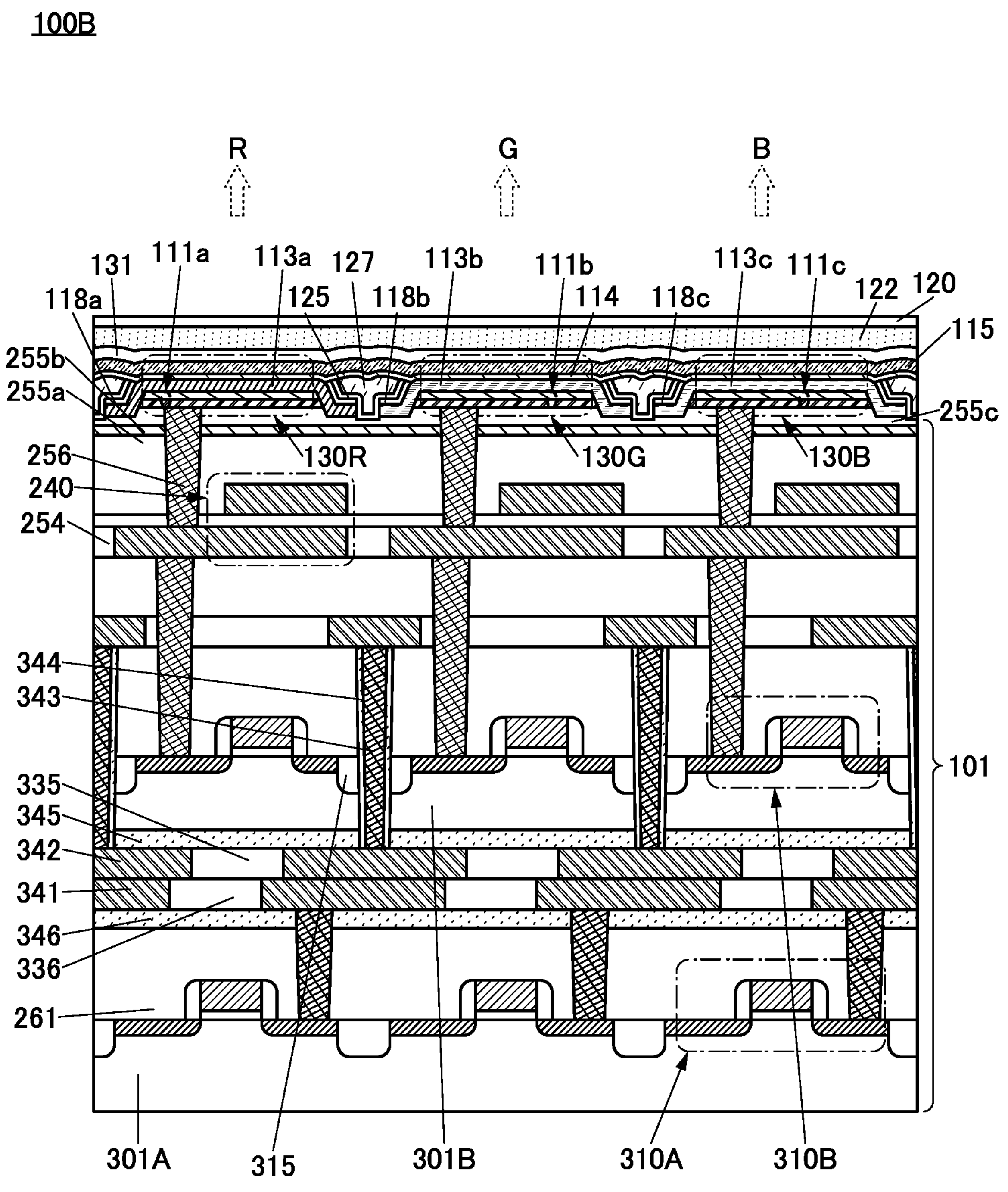
FIG. 19 is a cross-sectional view illustrating an example of a display panel.

The display panel 100B illustrated in FIG. 19 has a structure in which a transistor 310A and a transistor 310B each having a channel formed in a semiconductor substrate are stacked. Note that in the following description of display panels, the description of portions similar to those of the above-described display panels may be omitted.

In the display panel 100B, a substrate 301B provided with the transistor 310B, the capacitor 240, and the light-emitting devices is attached to a substrate 301A provided with the transistor 310A.

Here, an insulating layer 345 is preferably provided on the bottom surface of the substrate 301B. An insulating layer 346 is preferably provided over the insulating layer 261 over the substrate 301A. The insulating layers 345 and 346 function as protective layers and can inhibit diffusion of impurities into the substrate 301B and the substrate 301A. As the insulating layers 345 and 346, an inorganic insulating film that can be used as the protective layer 131 or an insulating layer 332 can be used.

The substrate 301B is provided with a plug 343 that penetrates the substrate 301B and the insulating layer 345. An insulating layer 344 is preferably provided to cover the side surface of the plug 343. The insulating layer 344 functions as a protective layer and can inhibit diffusion of impurities into the substrate 301B. As the insulating layer 344, an inorganic insulating film that can be used as the protective layer 131 can be used.

A conductive layer 342 is provided under the insulating layer 345 on the rear surface of the substrate 301B (the surface opposite to the substrate 120). The conductive layer 342 is preferably provided to be embedded in the insulating layer 335. The bottom surfaces of the conductive layer 342 and the insulating layer 335 are preferably planarized. Here, the conductive layer 342 is electrically connected to the plug 343.

A conductive layer 341 is provided over the insulating layer 346 over the substrate 301A. The conductive layer 341 is preferably provided to be embedded in the insulating layer 336. The top surfaces of the conductive layer 341 and the insulating layer 336 are preferably planarized.

The conductive layer 341 and the conductive layer 342 are bonded to each other, whereby the substrate 301A and the substrate 301B are electrically connected to each other. Here, improving the flatness of a plane formed by the conductive layer 342 and the insulating layer 335 and a plane formed by the conductive layer 341 and the insulating layer 336 allows the conductive layers 341 and 342 to be bonded to each other favorably.

The conductive layers 341 and 342 are preferably formed using the same conductive material. For example, it is possible to use a metal film containing an element selected from Al, Cr, Cu, Ta, Ti, Mo, and W, or a metal nitride film containing any of the above elements as a component (a titanium nitride film, a molybdenum nitride film, or a tungsten nitride film). Copper is particularly preferably used for the conductive layers 341 and 342. In that case, it is possible to employ copper-to-copper (Cu-to-Cu) direct bonding (a technique for achieving electrical continuity by connecting copper (Cu) pads).

[Display Panel 100C]

Figure 20:
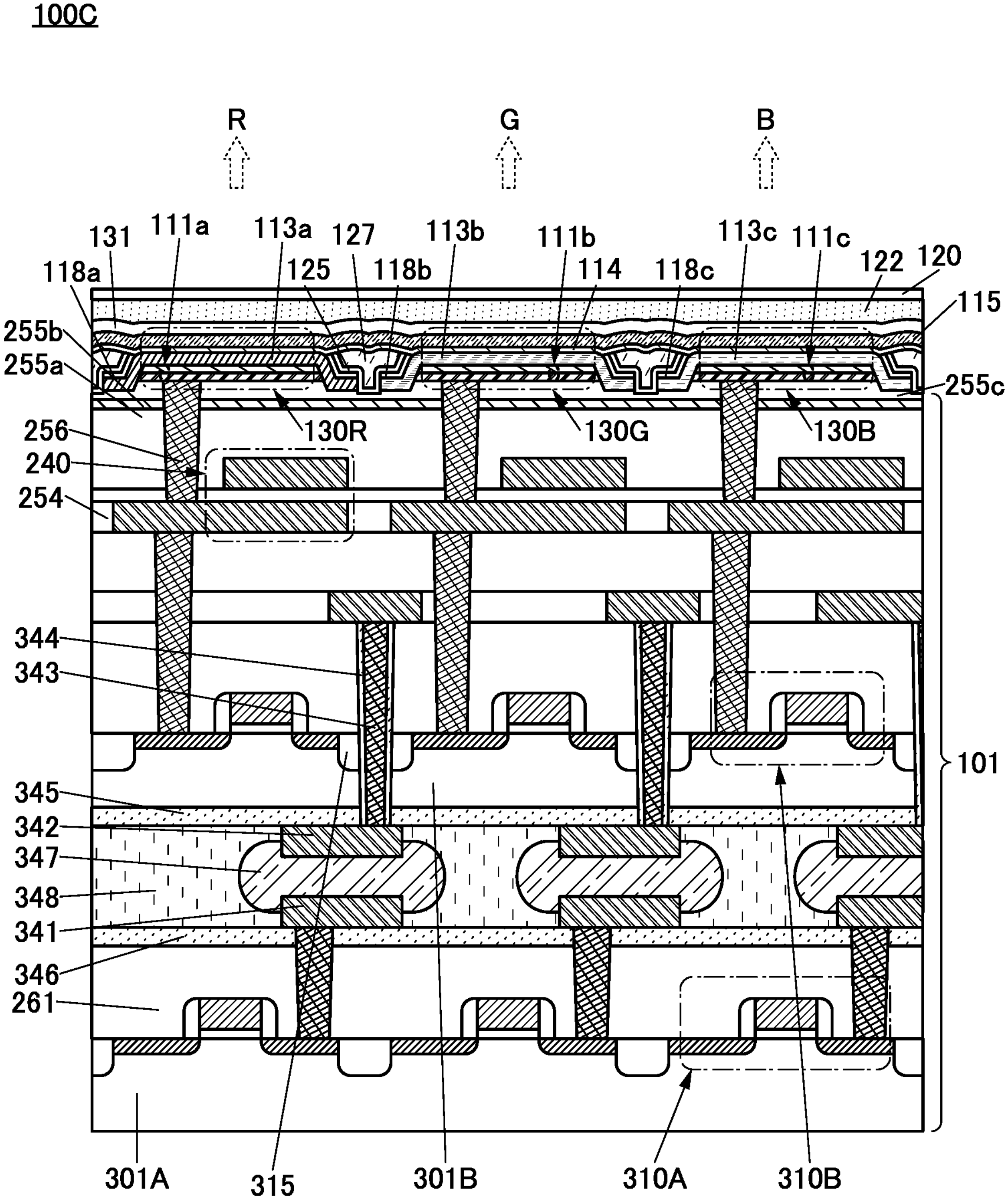
FIG. 20 is a cross-sectional view illustrating an example of a display panel.

The display panel 100C illustrated in FIG. 20 has a structure in which the conductive layer 341 and the conductive layer 342 are bonded to each other with a bump 347.

As illustrated in FIG. 20, providing the bump 347 between the conductive layer 341 and the conductive layer 342 enables the conductive layers 341 and 342 to be electrically connected to each other. The bump 347 can be formed using a conductive material containing gold (Au), nickel (Ni), indium (In), tin (Sn), or the like, for example. As another example, solder may be used for the bump 347. An adhesive layer 348 may be provided between the insulating layer 345 and the insulating layer 346. In the case where the bump 347 is provided, the insulating layer 335 and the insulating layer 336 may be omitted.

[Display Panel 100D]

Figure 21:
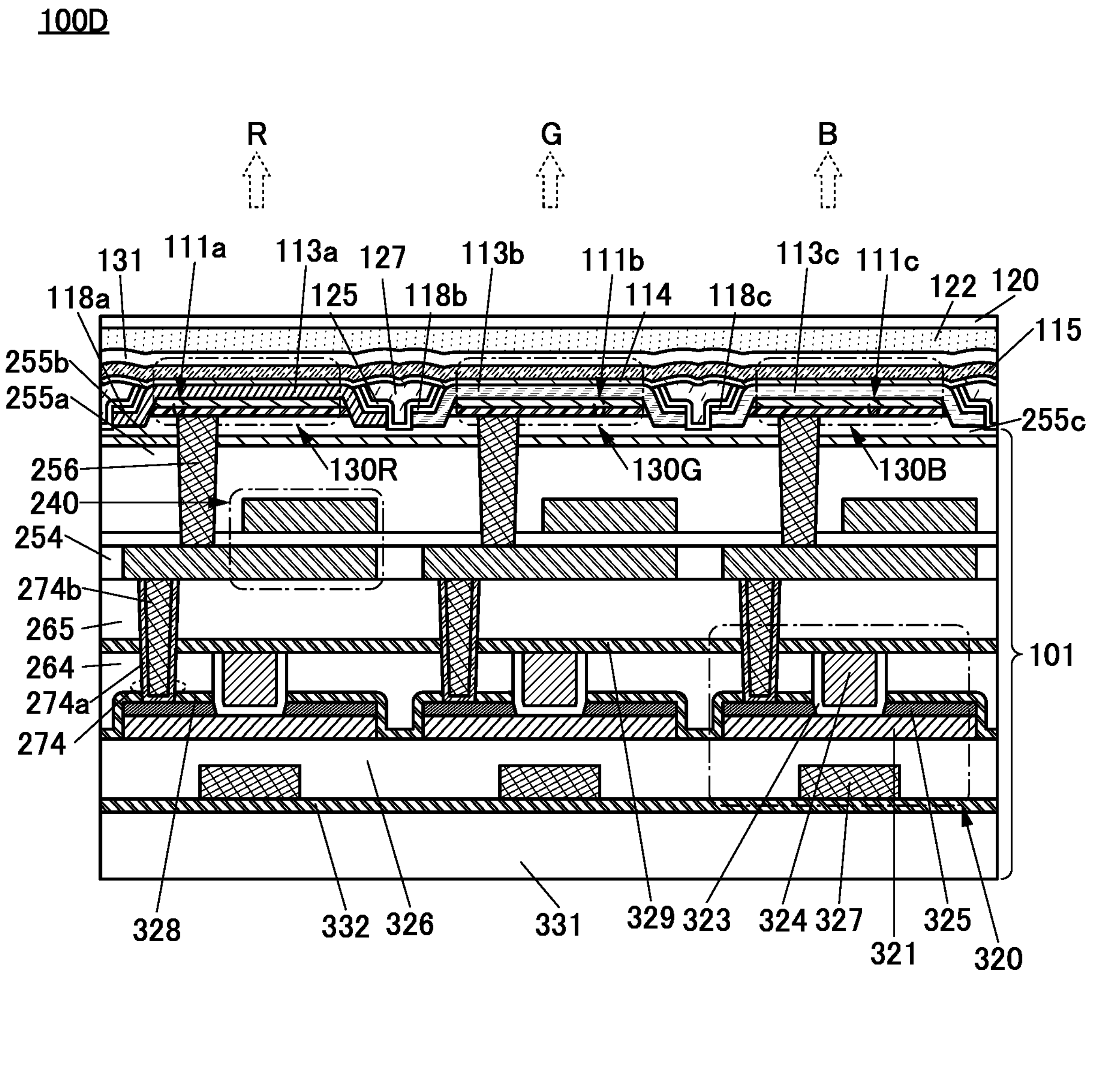
FIG. 21 is a cross-sectional view illustrating an example of a display panel.

The display panel 100D illustrated in FIG. 21 differs from the display panel 100A mainly in a structure of a transistor.

A transistor 320 is a transistor that contains a metal oxide (also referred to as an oxide semiconductor) in a semiconductor layer where a channel is formed (i.e., an OS transistor).

The transistor 320 includes a semiconductor layer 321, an insulating layer 323, a conductive layer 324, a pair of conductive layers 325, an insulating layer 326, and a conductive layer 327.

A substrate 331 corresponds to the substrate 291 in FIGS. 17A and 17B. A stacked-layer structure including the substrate 331 and the components thereover up to the insulating layer 255*b* corresponds to the layer 101 including a transistor in Embodiment 2. As the substrate 331, an insulating substrate or a semiconductor substrate can be used.

The insulating layer 332 is provided over the substrate 331. The insulating layer 332 functions as a barrier layer that prevents diffusion of impurities such as water or hydrogen from the substrate 331 into the transistor 320 and release of oxygen from the semiconductor layer 321 to the insulating layer 332 side. As the insulating layer 332, it is possible to use, for example, a film in which hydrogen or oxygen is less likely to diffuse than in a silicon oxide film, such as an aluminum oxide film, a hafnium oxide film, or a silicon nitride film.

The conductive layer 327 is provided over the insulating layer 332, and the insulating layer 326 is provided to cover the conductive layer 327. The conductive layer 327 functions as a first gate electrode of the transistor 320, and part of the insulating layer 326 functions as a first gate insulating layer. An oxide insulating film such as a silicon oxide film is preferably used as at least part of the insulating layer 326 that is in contact with the semiconductor layer 321. The top surface of the insulating layer 326 is preferably planarized.

The semiconductor layer 321 is provided over the insulating layer 326. A metal oxide film having semiconductor characteristics (also referred to as an oxide semiconductor film) is preferably used as the semiconductor layer 321. The pair of conductive layers 325 is provided on and in contact with the semiconductor layer 321, and functions as a source electrode and a drain electrode.

An insulating layer 328 is provided to cover the top and side surfaces of the pair of conductive layers 325, the side surface of the semiconductor layer 321, and the like, and an insulating layer 264 is provided over the insulating layer 328. The insulating layer 328 functions as a barrier layer that prevents diffusion of impurities such as water or hydrogen from the insulating layer 264 and the like into the semiconductor layer 321 and release of oxygen from the semiconductor layer 321. As the insulating layer 328, an insulating film similar to the insulating layer 332 can be used.

An opening reaching the semiconductor layer 321 is provided in the insulating layers 328 and 264. The insulating layer 323 that is in contact with the side surfaces of the insulating layers 264 and 328, the side surface of the conductive layer 325, and the top surface of the semiconductor layer 321 and the conductive layer 324 are embedded in the opening. The conductive layer 324 functions as a second gate electrode, and the insulating layer 323 functions as a second gate insulating layer.

The top surface of the conductive layer 324, the top surface of the insulating layer 323, and the top surface of the insulating layer 264 are planarized so that they are level with or substantially level with each other, and insulating layers 329 and 265 are provided to cover these layers.

The insulating layers 264 and 265 each function as an interlayer insulating layer. The insulating layer 329 functions as a barrier layer that prevents diffusion of impurities such as water or hydrogen from the insulating layer 265 or the like into the transistor 320. As the insulating layer 329, an insulating film similar to the insulating layers 328 and 332 can be used.

A plug 274 electrically connected to one of the pair of conductive layers 325 is provided to be embedded in the insulating layers 265, 329, and 264. Here, the plug 274 preferably includes a conductive layer 274*a* that covers the side surface of an opening formed in the insulating layers 265, 329, 264, and 328 and part of the top surface of the conductive layer 325, and a conductive layer 274*b* in contact with the top surface of the conductive layer 274*a*. For the conductive layer 274*a*, a conductive material in which hydrogen and oxygen are less likely to diffuse is preferably used.

[Display Panel 100E]

Figure 22:
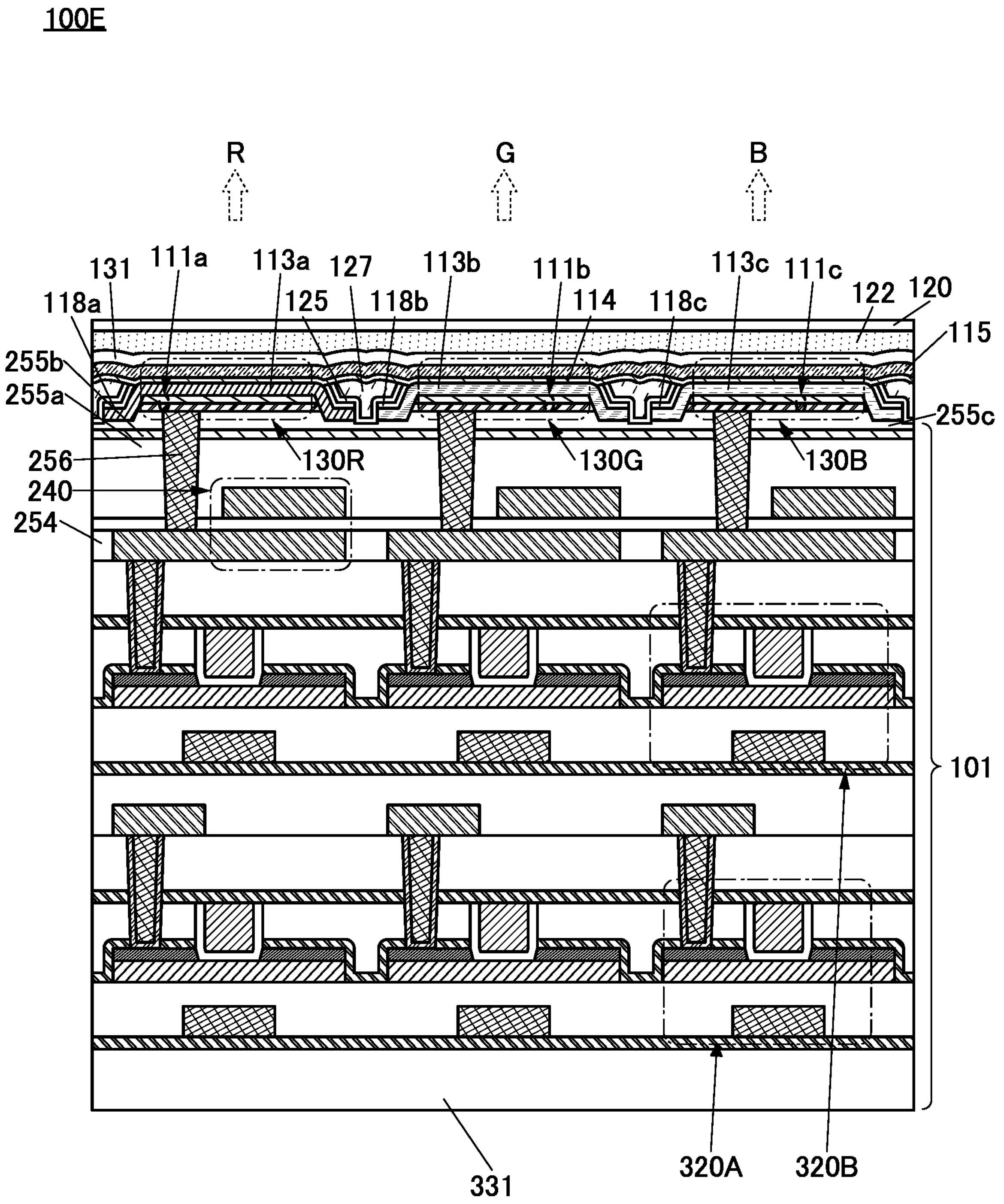
FIG. 22 is a cross-sectional view illustrating an example of a display panel.

The display panel 100E illustrated in FIG. 22 has a structure in which a transistor 320A and a transistor 320B each including an oxide semiconductor in a semiconductor where a channel is formed are stacked.

The description of the display panel 100D can be referred to for the transistor 320A, the transistor 320B, and other peripheral structures.

Although the structure in which two transistors including an oxide semiconductor are stacked is described, the present invention is not limited thereto. For example, three or more transistors may be stacked.

[Display Panel 100F]

Figure 23:
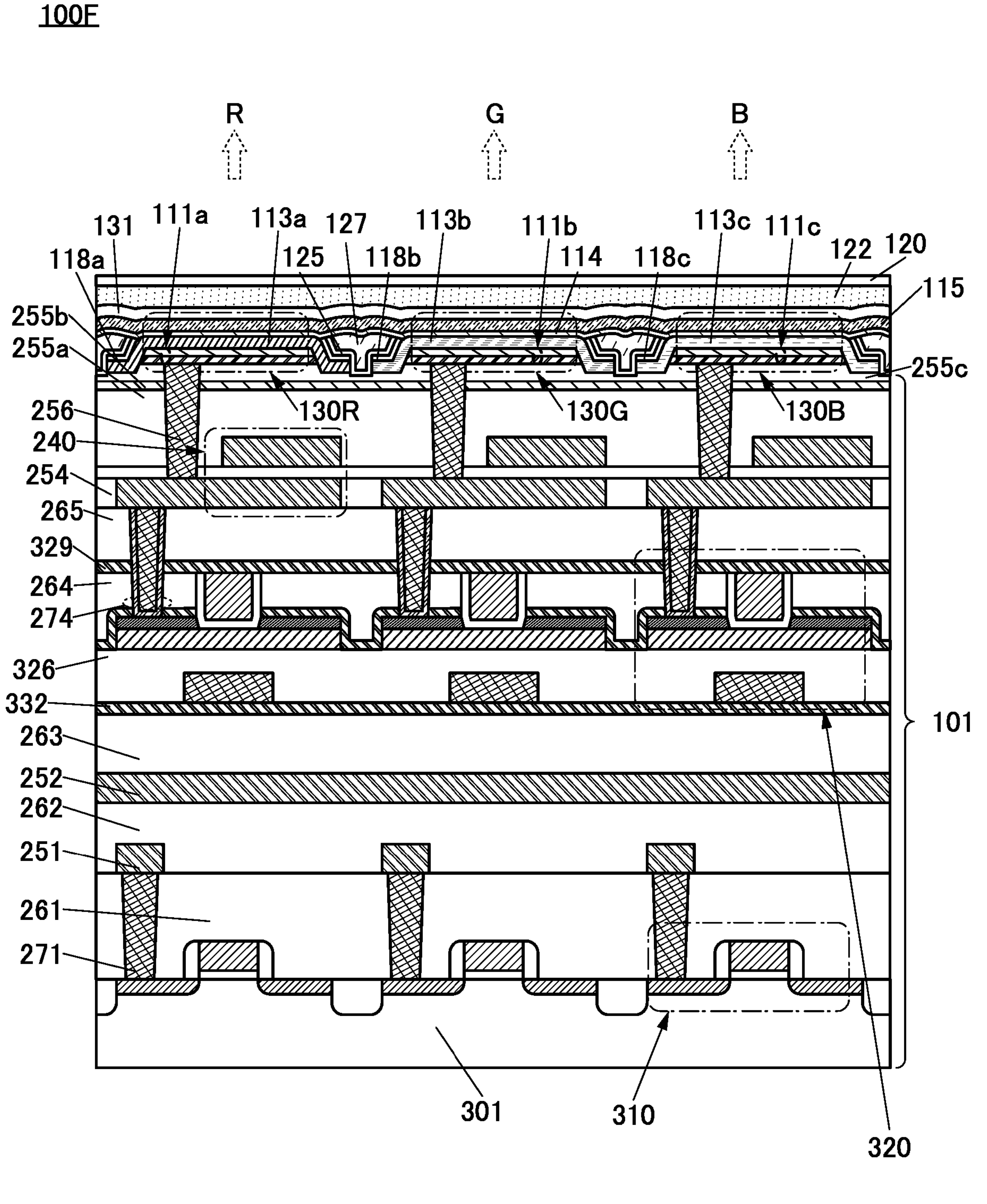
FIG. 23 is a cross-sectional view illustrating an example of a display panel.

The display panel 100F illustrated in FIG. 23 has a structure in which the transistor 310 having a channel formed in the substrate 301 and the transistor 320 including a metal oxide in a semiconductor layer where a channel is formed are stacked.

The insulating layer 261 is provided to cover the transistor 310, and a conductive layer 251 is provided over the insulating layer 261. An insulating layer 262 is provided to cover the conductive layer 251, and a conductive layer 252 is provided over the insulating layer 262. The conductive layer 251 and the conductive layer 252 each function as a wiring. An insulating layer 263 and the insulating layer 332 are provided to cover the conductive layer 252, and the transistor 320 is provided over the insulating layer 332. The insulating layer 265 is provided to cover the transistor 320, and the capacitor 240 is provided over the insulating layer 265. The capacitor 240 and the transistor 320 are electrically connected to each other through the plug 274.

The transistor 320 can be used as a transistor included in the pixel circuit. The transistor 310 can be used as a transistor included in the pixel circuit or a transistor included in a driver circuit for driving the pixel circuit (a gate line driver circuit or a source line driver circuit). The transistor 310 and the transistor 320 can also be used as transistors included in a variety of circuits such as an arithmetic circuit and a memory circuit.

With such a structure, not only the pixel circuit but also the driver circuit and the like can be formed directly under the light-emitting devices; thus, the display panel can be downsized as compared with the case where a driver circuit is provided around a display region.

[Display Panel 100G]

Figure 24:
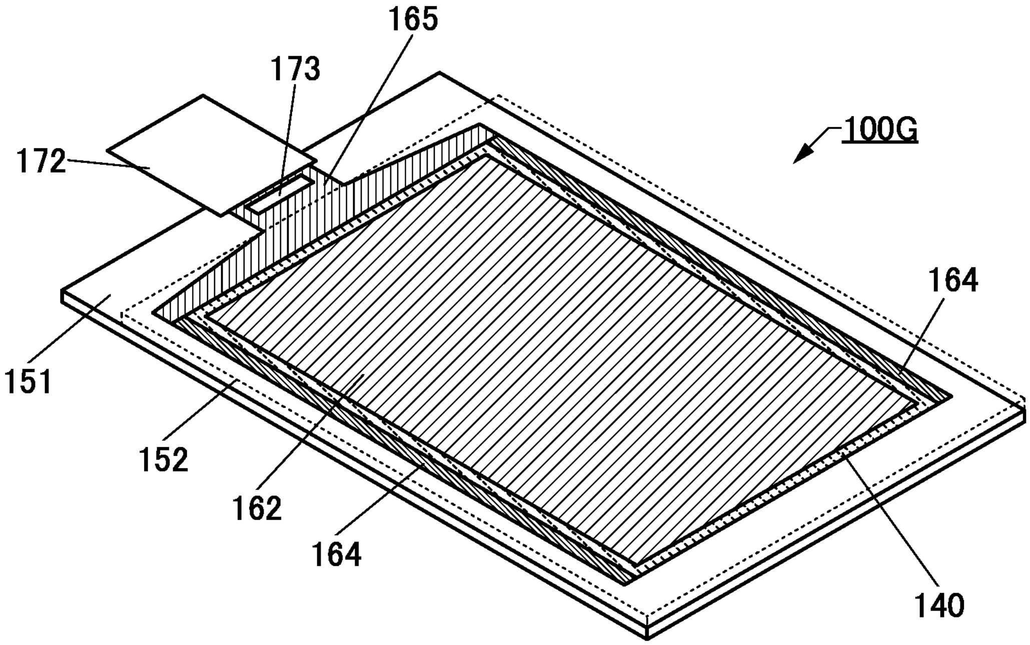
FIG. 24 is a perspective view illustrating an example of a display panel.
Figures 25A, 25B, 25C:
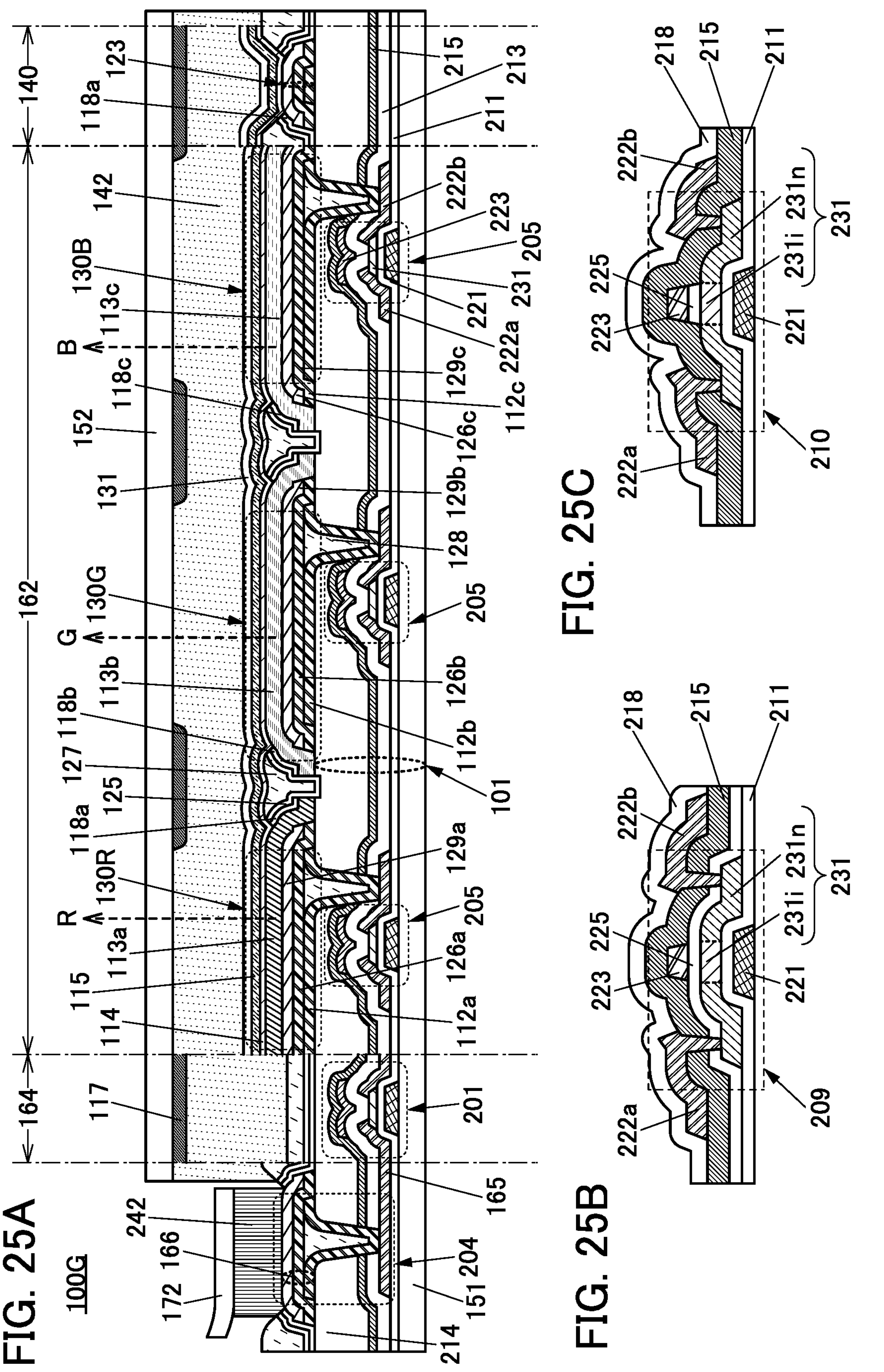
FIG. 25A is a cross-sectional view illustrating an example of a display panel.
FIGS. 25B and 25C are cross-sectional views each illustrating an example of a transistor.

FIG. 24 is a perspective view of a display panel 100G, and FIG. 25A is a cross-sectional view of the display panel 100G.

In the display panel 100G, a substrate 152 and a substrate 151 are bonded to each other. In FIG. 24, the substrate 152 is denoted by a dashed line.

The display panel 100G includes a display portion 162, the connection portion 140, circuits 164, a wiring 165, and the like. FIG. 24 illustrates an example in which an IC (integrated circuit) 173 and an FPC 172 are mounted on the display panel 100G. Thus, the structure illustrated in FIG. 24 can be regarded as a display module including the display panel 100G, the IC, and the FPC.

The connection portion 140 is provided outside the display portion 162. The connection portion 140 can be provided along one or more sides of the display portion 162. The number of the connection portions 140 may be one or more. FIG. 24 illustrates an example in which the connection portion 140 is provided to surround the four sides of the display portion. The common electrode of the light-emitting device is electrically connected to a conductive layer in the connection portion 140, and thus a potential can be supplied to the common electrode.

As the circuit 164, a scan line driver circuit can be used, for example.

The wiring 165 has a function of supplying a signal and power to the display portion 162 and the circuits 164. The signal and power are input to the wiring 165 from the outside through the FPC 172 or from the IC 173.

FIG. 24 illustrates an example in which the IC 173 is provided over the substrate 151 by a chip on glass (COG) method, a chip on film (COF) method, or the like. An IC including a scan line driver circuit, a signal line driver circuit, or the like can be used as the IC 173, for example. Note that the display panel 100G and the display module are not necessarily provided with an IC. The IC may be mounted on the FPC by a COF method or the like.

FIG. 25A illustrates an example of cross sections of part of a region including the FPC 172, part of the circuit 164, part of the display portion 162, part of the connection portion 140, and part of a region including an end portion of the display panel 100G.

The display panel 100G illustrated in FIG. 25A includes a transistor 201, transistors 205, the light-emitting device 130R that emits red light, the light-emitting device 130G that emits green light, the light-emitting device 130B that emits blue light, and the like between the substrate 151 and the substrate 152.

Other than a difference in the structure of pixel electrode, the light-emitting devices 130R, 130G, 130B each have a structure similar to the stacked structure illustrated in FIG. 6B. Embodiment 2 can be referred to for the details of the light-emitting devices.

In the display panel 100G, since the light-emitting devices of different colors are separately formed, the difference between the chromaticity at low luminance emission and that at high luminance emission is small. Furthermore, since the first layer 113*a*, the second layer 113*b*, and the third layer 113*c* are separated from each other, crosstalk generated between adjacent subpixels can be prevented while the display panel 100 has high resolution. Accordingly, the display panel can have high resolution and high display quality.

The light-emitting device 130R includes the conductive layer 112*a*, a conductive layer 126*a* over the conductive layer 112*a*, and a conductive layer 129*a* over the conductive layer 126*a*. All of the conductive layers 112*a*, 126*a*, and

129*a* can be referred to as pixel electrodes, or one or two of them can be referred to as pixel electrodes.

The light-emitting device 130G includes the conductive layer 112*b*, a conductive layer 126*b* over the conductive layer 112*b*, and a conductive layer 129*b* over the conductive layer 126*b*.

The light-emitting device 130B includes the conductive layer 112*c*, a conductive layer 126*c* over the conductive layer 112*c*, and a conductive layer 129*c* over the conductive layer 126*c*.

The conductive layer 112*a* is connected to a conductive layer 222*b* included in the transistor 205 through an opening provided in the insulating layer 214. The end portion of the conductive layer 126*a* is positioned on an outer side than the end portion of the conductive layer 112*a*. The end portion of the conductive layer 126*a* and the end portion of the conductive layer 129*a* are aligned or substantially aligned with each other. For example, a conductive layer functioning as a reflective electrode can be used as the conductive layer 112*a* and the conductive layer 126*a*, and a conductive layer functioning as a transparent electrode can be used as the conductive layer 129*a*.

Since the conductive layers 112*b*, 126*b*, and 129*b* of the light-emitting device 130G and the conductive layers 112*c*, 126*c*, and 129*c* of the light-emitting device 130B are similar to the conductive layers 112*a*, 126*a*, and 129*a* of the light-emitting device 130R, detailed description of those layers is omitted.

Depression portions are formed in the conductive layers 112*a*, 112*b*, and 112*c* to cover the openings provided in the insulating layer 214. A layer 128 is embedded in the depression portions.

The layer 128 has a function of filling the depression portions of the conductive layers 112*a*, 112*b*, and 112*c*. The conductive layers 126*a*, 126*b*, and 126*c* electrically connected to the conductive layers 112*a*, 112*b*, and 112*c*, respectively, are provided over the conductive layers 112*a*, 112*b*, and 112*c* and the layer 128. Thus, regions overlapping with the depression portions of the conductive layers 112*a*, 112*b*, and 112*c* can also be used as the light-emitting regions, increasing the aperture ratio of the pixels.

The layer 128 may be an insulating layer or a conductive layer. Any of a variety of inorganic insulating materials, organic insulating materials, and conductive materials can be used for the layer 128 as appropriate. In particular, the layer 128 is preferably formed using an insulating material.

An insulating layer including an organic material can be favorably used as the layer 128. For example, an acrylic resin, a polyimide resin, an epoxy resin, a polyamide resin, a polyimide-amide resin, a siloxane resin, a benzocyclobutene-based resin, a phenol resin, and precursors of these resins can be used for the layer 128. A photosensitive resin can also be used for the layer 128. Examples of the photosensitive resin include positive-type materials and negative-type materials.

When a photosensitive resin is used, the layer 128 can be formed through only light-exposure and development steps, reducing the influence of dry etching, wet etching, or the like on the surfaces of the conductive layers 112*a*, 112*b*, and 112*c*. When the layer 128 is formed using a negative photosensitive resin, the layer 128 can sometimes be formed using the same photomask (light-exposure mask) as the photomask used for forming the opening in the insulating layer 214.

The top surface and the side surface of the conductive layer 126*a* and the top surface and the side surface of the conductive layer 129*a* are covered with the first layer 113*a*. Similarly, the top surface and the side surface of the conductive layer 126*b* and the top surface and the side surface of the conductive layer 129*b* are covered with the second layer 113*b*. Moreover, the top surface and the side surface of the conductive layer 126*c* and the top surface and the side surface of the conductive layer 129*c* are covered with the third layer 113*c*. Accordingly, regions provided with the conductive layers 126*a*, 126*b*, and 126*c* can be entirely used as the light-emitting regions of the light-emitting devices 130R, 130G, and 130B, increasing the aperture ratio of the pixels.

Side surfaces of the first layer 113*a*, the second layer 113*b*, and the third layer 113*c* are covered with the insulating layers 125 and 127. The sacrificial layer 118*a* is positioned between the first layer 113*a* and the insulating layer 125. The sacrificial layer 118*b* is positioned between the second layer 113*b* and the insulating layer 125, and the sacrificial layer 118*c* is positioned between the third layer 113*c* and the insulating layer 125. The common layer 114 is provided over the first layer 113*a*, the second layer 113*b*, the third layer 113*c*, and the insulating layers 125 and 127. The common electrode 115 is provided over the common layer 114. The common layer 114 and the common electrode 115 are each one continuous film shared by the plurality of light-emitting devices.

The protective layer 131 is provided over the light-emitting devices 130R, 130G, and 130B. Providing the protective layer 131 that covers the light-emitting device can inhibit entry of impurities such as water into the light-emitting device, thereby increasing the reliability of the light-emitting device.

The protective layer 131 and the substrate 152 are bonded to each other with an adhesive layer 142. A solid sealing structure, a hollow sealing structure, or the like can be employed to seal the light-emitting devices. In FIG. 25A, a solid sealing structure is employed, in which a space between the substrate 152 and the substrate 151 is filled with the adhesive layer 142. Alternatively, a hollow sealing structure may be employed, in which the space is filled with an inert gas (e.g., nitrogen or argon). In this case, the adhesive layer 142 may be provided not to overlap with the light-emitting devices. Alternatively, the space may be filled with a resin other than the frame-like adhesive layer 142.

The conductive layer 123 is provided over the insulating layer 214 in the connection portion 140. An example is illustrated in which the conductive layer 123 has a stacked-layer structure of a conductive film obtained by processing the same conductive film as the conductive layers 112*a*, 112*b*, and 112*c*; a conductive film obtained by processing the same conductive film as the conductive layers 126*a*, 126*b*, and 126*c*; and a conductive film obtained by processing the same conductive film as the conductive layers 129*a*, 129*b*, and 129*c*. The end portion of the conductive layer 123 is covered with the sacrifice layer 118*a*, the insulating layer 125, and the insulating layer 127. The common layer 114 is provided over the conductive layer 123, and the common electrode 115 is provided over the common layer 114. The conductive layer 123 and the common electrode 115 are electrically connected to each other through the common layer 114. Note that the common layer 114 is not necessarily formed in the connection portion 140. In this case, the conductive layer 123 and the common electrode 115 are directly and electrically connected to each other.

The display panel 100G is a top-emission display panel. Light emitted from the light-emitting devices is emitted toward the substrate 152. For the substrate 152, a material having a high visible-light-transmitting property is preferably used. The pixel electrode contains a material that reflects visible light, and the counter electrode (the common electrode 115) contains a material that transmits visible light.

A stacked-layer structure including the substrate 151 and the components thereover up to the insulating layer 214 corresponds to the layer 101 including a transistor in Embodiment 2.

The transistor 201 and the transistor 205 are formed over the substrate 151. These transistors can be fabricated using the same materials in the same step.

An insulating layer 211, an insulating layer 213, an insulating layer 215, and the insulating layer 214 are provided in this order over the substrate 151. Part of the insulating layer 211 functions as a gate insulating layer of each transistor. Part of the insulating layer 213 functions as a gate insulating layer of each transistor. The insulating layer 215 is provided to cover the transistors. The insulating layer 214 is provided to cover the transistors and has a function of a planarization layer. Note that the number of gate insulating layers and the number of insulating layers covering the transistors are not limited and may each be one or two or more.

A material through which impurities such as water and hydrogen do not easily diffuse is preferably used for at least one of the insulating layers covering the transistors. This is because such an insulating layer can function as a barrier layer. Such a structure can effectively inhibit diffusion of impurities into the transistors from the outside and increase the reliability of the display panel.

An inorganic insulating film is preferably used as each of the insulating layers 211, 213, and 215. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used.

An organic insulating layer is suitable as the insulating layer 214 functioning as a planarization layer. Examples of materials that can be used for the organic insulating layer include an acrylic resin, a polyimide resin, an epoxy resin, a polyamide resin, a polyimide-amide resin, a siloxane resin, a benzocyclobutene-based resin, a phenol resin, and precursors of these resins. Alternatively, the insulating layer 214 may have a stacked-layer structure of an organic insulating layer and an inorganic insulating layer. The outermost layer of the insulating layer 214 preferably functions as an etching protective layer. Thus, the formation of a depression portion in the insulating layer 214 can be inhibited in processing the conductive layer 112*a*, the conductive layer 126*a*, the conductive layer 129*a*, or the like. Alternatively, a depression portion may be formed in the insulating layer 214 in processing the conductive layer 112*a*, the conductive layer 126*a*, the conductive layer 129*a*, or the like.

Each of the transistors 201 and 205 includes a conductive layer 221 functioning as a gate, the insulating layer 211 functioning as a gate insulating layer, a conductive layer 222*a* and a conductive layer 222*b* functioning as a source and a drain, a semiconductor layer 231, the insulating layer 213 functioning as a gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display panel of this embodiment. For example, a planar transistor, a staggered transistor, or an inverted staggered transistor can be used. A top-gate transistor or a bottom-gate transistor can be used. Alternatively, gates may be provided above and below a semiconductor layer where a channel is formed.

The structure in which the semiconductor layer where a channel is formed is provided between two gates is used for the transistors 201 and 205. The two gates may be connected to each other and supplied with the same signal to operate the transistor. Alternatively, the threshold voltage of the transistor may be controlled by applying a potential for controlling the threshold voltage to one of the two gates and a potential for driving to the other of the two gates.

There is no particular limitation on the crystallinity of a semiconductor material used for the transistors, and any of an amorphous semiconductor, a single crystal semiconductor, and a semiconductor having crystallinity other than single crystal (a microcrystalline semiconductor, a polycrystalline semiconductor, or a semiconductor partly including crystal regions) may be used. It is preferable to use a single crystal semiconductor or a semiconductor having crystallinity because degradation of transistor characteristics can be inhibited.

It is preferable that a semiconductor layer of a transistor contain a metal oxide (also referred to as an oxide semiconductor). That is, a transistor including a metal oxide in its channel formation region (hereinafter, also referred to as an OS transistor) is preferably used for the display panel of this embodiment.

As the oxide semiconductor having crystallinity, a c-axis aligned crystalline oxide semiconductor (CAAC-OS), a nanocrystalline oxide semiconductor (nc-OS), and the like are given.

Alternatively, a transistor using silicon in a channel formation region (a Si transistor) may be used. Examples of silicon include single crystal silicon, polycrystalline silicon, and amorphous silicon. In particular, a transistor containing low-temperature polysilicon (LTPS) in a semiconductor layer (such a transistor is referred to as an LTPS transistor below) can be used. The LTPS transistor has high field-effect mobility and excellent frequency characteristics.

With the use of the Si transistor such as the LTPS transistor, a circuit required to drive at a high frequency (e.g., a source driver circuit) can be formed on the same substrate as the display portion. This allows simplification of an external circuit mounted on the display panel and a reduction in costs of parts and mounting costs.

The OS transistor has much higher field-effect mobility than a transistor containing amorphous silicon. In addition, the OS transistor has an extremely low leakage current between a source and a drain in an off state (the leakage current is also referred to as an off-state current below), and charge accumulated in a capacitor that is connected in series to the transistor can be held for a long period. Furthermore, the power consumption of the display panel can be reduced with the OS transistor.

The off-state current per micrometer of channel width the OS transistor at room temperature can be lower than or equal to 1 aA ($1\times10^{-18}$ A), lower than or equal to 1 zA ($1\times10^{-21}$ A), or lower than or equal to 1 yA ($1\times10^{-24}$ A). Note that the off-state current per micrometer of channel width of a Si transistor at room temperature is higher than or equal to 1 fA ($1\times10^{-15}$ A) and lower than or equal to 1 pA ($1\times10^{-12}$ A). That is, the off-state current of the OS transistor is lower than the off-state current of the Si transistor by approximately 10 digits.

To increase the emission luminance of the light-emitting device included in a pixel circuit, it is necessary to increase the amount of current flowing through the light-emitting device. For this, it is necessary to increase the source-drain voltage of a driving transistor included in the pixel circuit. Since the OS transistor has a higher withstand voltage between the source and the drain than a Si transistor, a high voltage can be applied between the source and the drain of the OS transistor. Thus, with use of an OS transistor as a driving transistor included in the pixel circuit, the amount of current flowing through the light-emitting device can be increased, resulting in an increase in emission luminance of the light-emitting device.

Assuming that the transistor operates in a saturation region, a change in the amount of current between the source and the drain, with respect to a fluctuation in the gate-source voltage, in the OS transistor can be smaller than that in the Si transistor. Thus, with use of an OS transistor as a driving transistor included in the pixel circuit, the amount of current flowing between the source and the drain can be accurately specified based on a fluctuation of the gate-source voltage, which enables the amount of current flowing through the light-emitting device to be controlled. Accordingly, the gray level in the pixel circuit can be increased.

As saturation characteristics of current flowing when the transistor operates in a saturation region, the OS transistor can make current (saturation current) flow more stably than the Si transistor even when the source-drain voltage gradually increases. Thus, with use of an OS transistor as a driving transistor, current can be made flow stably through the light-emitting device, for example, even when a variation in current-voltage characteristics of the EL device occurs. In other words, the amount of current between the source and the drain is less changed in the OS transistor operating in the saturation region even when the sourcedrain voltage is made higher. As a result, the emission luminance of the light-emitting device can be stabilized.

As described above, with use of an OS transistor as a driving transistor included in the pixel circuit, it is possible to achieve "inhibition of black floating", "increase in emission luminance", "increase in gray level", "inhibition of variation in light-emitting devices", and the like.

The semiconductor layer preferably contains indium, M (M is one or more of gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more of aluminum, gallium, yttrium, and tin.

It is particularly preferable that an oxide containing indium (In), gallium (Ga), and zinc (Zn) (also referred to as IGZO) be used for the semiconductor layer. Alternatively, it is preferable to use an oxide containing indium, tin, and zinc. Further alternatively, it is preferable to use an oxide containing indium, gallium, tin, and zinc. Further alternatively, it is preferable to use an oxide containing indium (In), aluminum (Al), and zinc (Zn) (also referred to as IAZO). Further alternatively, it is preferable to use an oxide containing indium (In), aluminum (Al), gallium (Ga), and zinc (Zn) (also referred to as IAGZO).

When the semiconductor layer is an In-M-Zn oxide, the atomic ratio of In is preferably greater than or equal to the atomic ratio of M in the In-M-Zn oxide. Examples of the atomic ratio of the metal elements in such an In-M-Zn oxide are In:M:Zn=1:1:1, 1:1:1.2, 1:3:2, 1:3:4, 2:1:3, 3:1:2, 4:2:3, 4:2:4.1, 5:1:3, 5:1:6, 5:1:7, 5:1:8, 6:1:6, and 5:2:5 and a composition in the vicinity of any of the above atomic ratios. Note that the vicinity of the atomic ratio includes ±30% of an intended atomic ratio.

For example, when the atomic ratio is described as In:Ga:Zn=4:2:3 or a composition in the vicinity thereof, the case is included where the atomic proportion of Ga is greater than or equal to 1 and less than or equal to 3 and the atomic proportion of Zn is greater than or equal to 2 and less than or equal to 4 with the atomic proportion of In being 4. In addition, when the atomic ratio is described as In:Ga:Zn=5:1:6 or a composition in the vicinity thereof, the case is included where the atomic proportion of Ga is greater than 0.1 and less than or equal to 2 and the atomic proportion of Zn is greater than or equal to 5 and less than or equal to 7 with the atomic proportion of In being 5. Furthermore, when the atomic ratio is described as In:Ga:Zn=1:1:1 or a composition in the vicinity thereof, the case is included where the atomic proportion of Ga is greater than 0.1 and less than or equal to 2 and the atomic proportion of Zn is greater than 0.1 and less than or equal to 2 with the atomic proportion of In being 1.

The transistors included in the circuit 164 and the transistors included in the display portion 162 may have the same structure or different structures. One structure or two or more kinds of structures may be employed for a plurality of transistors included in the circuit 164. Similarly, one structure or two or more kinds of structures may be employed for a plurality of transistors included in the display portion 162.

All of the transistors included in the display portion 162 may be OS transistors or Si transistors. Alternatively, some of the transistors included in the display portion 162 may be OS transistors and the others may be Si transistors.

For example, when both the LTPS transistor and the OS transistor are used in the display portion 162, the display panel can have low power consumption and high drive capability. Note that a structure in which the LTPS transistor and the OS transistor are combined is referred to as LTPO in some cases. As a favorable example, it is preferable that the OS transistor be used as a transistor functioning as a switch for controlling conduction or non-conduction between wirings and the LTPS transistor be used as a transistor for controlling current.

For example, one transistor included in the display portion 162 may function as a transistor for controlling current flowing through the light-emitting device and be referred to as a driving transistor. One of a source and a drain of the driving transistor is electrically connected to the pixel electrode of the light-emitting device. The LTPS transistor is preferably used as the driving transistor. Thus, current flowing through the light-emitting device in the pixel circuit can be increased.

By contrast, another transistor included in the display portion 162 may function as a switch for controlling selection or non-selection of a pixel and be referred to as a selection transistor. A gate of the selection transistor is electrically connected to a gate line, and one of a source and a drain thereof is electrically connected to a source line (signal line). The OS transistor is preferably used as the selection transistor. Thus, the gray level of the pixel can be maintained even when the frame frequency is extremely reduced (e.g., 1 fps or lower), whereby power consumption can be reduced by stopping the driver in displaying a still image.

As described above, the display panel of one embodiment of the present invention can have all of a high aperture ratio, high resolution, high display quality, and low power consumption.

Note that the display panel of one embodiment of the present invention has a structure including the OS transistor and the light-emitting device having a metal maskless (MML) structure. This structure can extremely reduce the leakage current that might flow through a transistor, and the leakage current that might flow between adjacent light-emitting devices (also referred to as side leakage current or the like). In addition, when an image is displayed on the display panel having this structure, the user can notice one or more of crispness, sharpness, a high chroma, and a high contrast ratio of an image. Note that when the leakage current that might flow through a transistor and the side leakage current between light-emitting devices are extremely low, light leakage or the like that might occur in black display can be reduced as much as possible.

FIGS. 25B and 25C illustrate other structure examples of the transistor.

Transistors 209 and 210 each include the conductive layer 221 functioning as a gate, the insulating layer 211 functioning as a gate insulating layer, the semiconductor layer 231 including a channel formation region 231*i* and a pair of low-resistance regions 231*n*, the conductive layer 222*a* connected to one of the pair of low-resistance regions 231*n*, the conductive layer 222*b* connected to the other of the pair of low-resistance regions 231*n*, an insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231*i*. The insulating layer 225 is positioned between at least the conductive layer 223 and the channel formation region 231*i*. Furthermore, an insulating layer 218 covering the transistor may be provided.

FIG. 25B illustrates an example of the transistor 209 in which the insulating layer 225 covers the top surface and the side surface of the semiconductor layer 231. The conductive layer 222*a* and the conductive layer 222*b* are connected to the corresponding low-resistance regions 231*n* through openings provided in the insulating layer 225 and the insulating layer 215. One of the conductive layers 222*a* and 222*b* functions as a source, and the other functions as a drain.

In the transistor 210 illustrated in FIG. 25C, the insulating layer 225 overlaps with the channel formation region 231*i* of the semiconductor layer 231 and does not overlap with the low-resistance regions 231*n*. The structure illustrated in FIG. 25C is obtained by processing the insulating layer 225 with the conductive layer 223 as a mask, for example. In FIG. 25C, the insulating layer 215 is provided to cover the insulating layer 225 and the conductive layer 223, and the conductive layer 222*a* and the conductive layer 222*b* are connected to the corresponding low-resistance regions 231*n* through the openings in the insulating layer 215.

A connection portion 204 is provided in a region of the substrate 151 where the substrate 152 does not overlap. In the connection portion 204, the wiring 165 is electrically connected to the FPC 172 through a conductive layer 166 and a connection layer 242. An example is illustrated in which the conductive layer 166 has a stacked-layer structure of a conductive film obtained by processing the same conductive film as the conductive layers 112*a*, 112*b*, and 112*c*; a conductive film obtained by processing the same conductive film as the conductive layers 126*a*, 126*b*, and 126*c*; and a conductive film obtained by processing the same conductive film as the conductive layers 129*a*, 129*b*, and 129*c*. On the top surface of the connection portion 204, the conductive layer 166 is exposed. Thus, the connection portion 204 and the FPC 172 can be electrically connected to each other through the connection layer 242.

A light-blocking layer 117 is preferably provided on the surface of the substrate 152 on the substrate 151 side. The light-blocking layer 117 can be positioned over a region between adjacent light-emitting devices, in the connection portion 140, in the circuit 164, and the like. A variety of optical members can be arranged on the outer surface of the substrate 152.

A material that can be used for the substrate 120 can be used for each of the substrates 151 and 152.

A material that can be used for the resin layer 122 can be used for the bonding layer 142.

As the connection layer 242, an anisotropic conductive film (ACF), an anisotropic conductive paste (ACP), or the like can be used.

[Display Panel 100H]

Figures 26A, 26B, 26C, 26D:
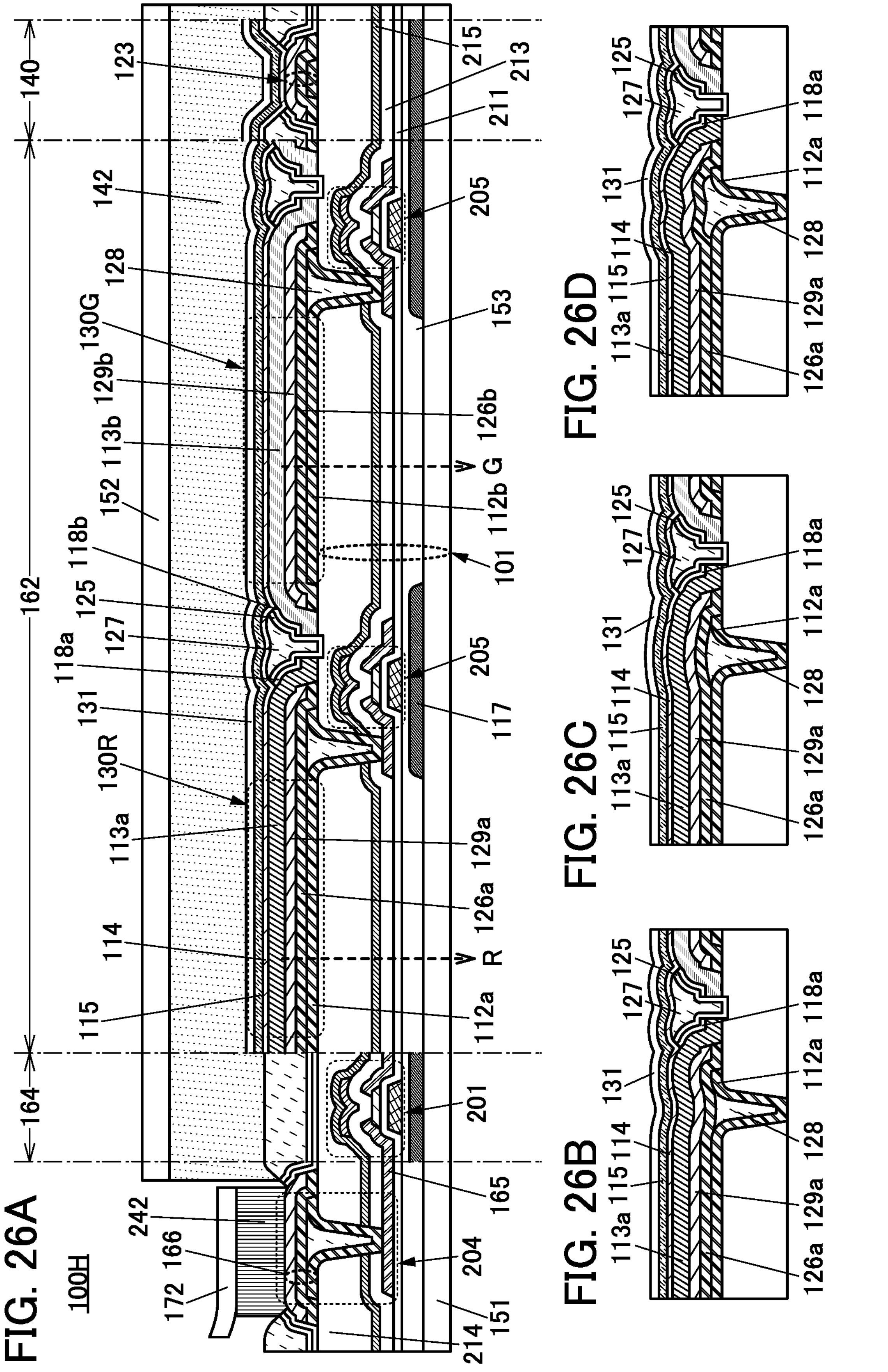
FIGS. 26A to 26D are cross-sectional views illustrating examples of a display panel.

A display panel 100H illustrated in FIG. 26A differs from the display panel 100G mainly in having a bottom-emission structure.

Light emitted from the light-emitting device is emitted toward the substrate 151. For the substrate 151, a material having a high visible-light-transmitting property is preferably used. By contrast, there is no limitation on the light-transmitting property of a material used for the substrate 152.

The light-blocking layer 117 is preferably formed between the substrate 151 and the transistor 201 and between the substrate 151 and the transistor 205. FIG. 26A illustrates an example in which the light-blocking layer 117 is provided over the substrate 151, an insulating layer 153 is provided over the light-blocking layer 117, and the transistors 201 and 205 and the like are provided over the insulating layer 153.

The light-emitting device 130R includes the conductive layer 112*a*, the conductive layer 126*a* over the conductive layer 112*a*, and the conductive layer 129*a* over the conductive layer 126*a*.

The light-emitting device 130G includes the conductive layer 112*b*, the conductive layer 126*b* over the conductive layer 112*b*, and the conductive layer 129*b* over the conductive layer 126*b*.

A material having a high visible-light-transmitting property is used for each of the conductive layers 112*a*, 112*b*, and 112*c* (not illustrated), 126*a*, 126*b*, and 126*c* (not illustrated), and 129*a*, 129*b*, and 129*c* (not illustrated). A material that reflects visible light is preferably used for the common electrode 115.

Although FIG. 25A, FIG. 26A, and the like illustrate an example in which the top surface of the layer 128 is flat, the shape of the layer 128 is not particularly limited. FIGS. 26B to 26D illustrate modification examples of the layer 128.

As illustrated in FIGS. 26B and 26D, the top surface of the layer 128 can have a shape in which its center and vicinity thereof fall, i.e., a shape including a concave surface, in the cross-sectional view.

As illustrated in FIG. 26C, the top surface of the layer 128 can have a shape in which its center and vicinity thereof rise, i.e., a shape including a convex surface, in the cross-sectional view.

The top surface of the layer 128 may include one or both of a convex surface and a concave surface. The number of convex surfaces and the number of concave surfaces included in the top surface of the layer 128 are not limited and can each be one or more.

The level of the top surface of the layer 128 and the level of the top surface of the conductive layer 112*a* may be the same or substantially the same, or may be different from each other. For example, the level of the top surface of the layer 128 may be either lower or higher than the level of the top surface of the conductive layer 112*a*.

FIG. 26B can be said as an example in which the layer 128 fits in the depression portion formed in the conductive layer 112*a*. By contrast, as illustrated in FIG. 26D, the layer 128 may exist also outside the depression portion formed in the conductive layer 112*a*, that is, the top surface of the layer 128 may extend beyond the depression portion.

[Display Panel 100J]

Figure 27:
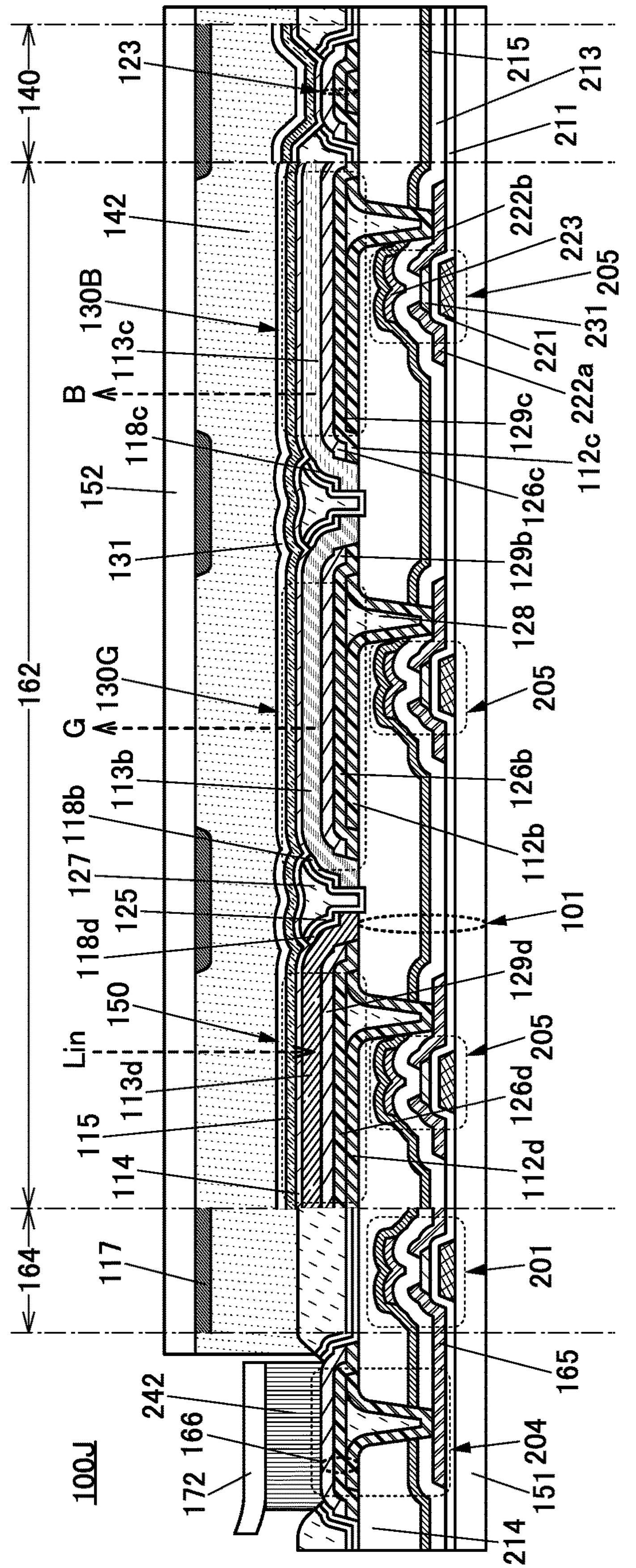
FIG. 27 is a cross-sectional view illustrating an example of a display panel.

A display panel 100J illustrated in FIG. 27 differs from the display panel 100G mainly in including the light-receiving device 150.

The light-receiving device 150 includes the conductive layer 112*d*, the conductive layer 126*d* over the conductive layer 112*d*, and the conductive layer 129*d* over the conductive layer 126*d*.

The conductive layer 112*d* is connected to the conductive layer 222*b* included in the transistor 205 through the opening provided in the insulating layer 214.

The top surface and the side surface of the conductive layer 126*d* and the top surface and the side surface of the conductive layer 129*d* are covered with the fourth layer 113*d*. The fourth layer 113*d* includes at least an active layer.

The side surface of the fourth layer 113*d* is covered with the insulating layers 125 and 127. A sacrifice layer 118*d* is positioned between the fourth layer 113*d* and the insulating layer 125. The common layer 114 is provided over the fourth layer 113*d* and the insulating layers 125 and 127, and the common electrode 115 is provided over the common layer 114. The common layer 114 is a continuous film shared by the light-receiving device and the light-emitting devices.

For example, the display panel 100J can employ the pixel layout described in Embodiment 2 with reference to FIG. 12A or the pixel layout described in Embodiment 3 with reference to FIGS. 16A to 16D. The light-receiving device 150 can be provided in at least one of the subpixels PS, X1, and X2, for example. Embodiment 2 can be referred to for the details of the display panel including the light-receiving device.

This embodiment can be combined with any of the other embodiments as appropriate.

Embodiment 5

In this embodiment, structure examples of a transistor that can be used in the display panel of one embodiment of the present invention will be described. Specifically, the case of using a transistor including silicon as a semiconductor where a channel is formed will be described.

One embodiment of the present invention is a display panel including light-emitting devices and pixel circuits. The display panel includes, for example, can perform full-color display by including three types of light-emitting devices that emit red (R) light, green (G) light, and blue (B) light.

Transistors containing silicon in their semiconductor layers where a channel is formed are preferably used as all transistors included in the pixel circuit for driving the light-emitting device. Examples of silicon include single crystal silicon, polycrystalline silicon, and amorphous silicon. In particular, transistors containing low-temperature polysilicon (LTPS) in their semiconductor layers (such transistors are referred to as LTPS transistors below) are preferably used. The LTPS transistor has high field-effect mobility and excellent frequency characteristics.

With the use of the transistors using silicon, such as the LTPS transistors, a circuit required to drive at a high frequency (e.g., a source driver circuit) can be formed on the same substrate as a display portion. This allows simplification of an external circuit mounted on the display panel and a reduction in costs of parts and mounting costs.

It is preferable to use a transistor containing a metal oxide (hereinafter also referred to as an oxide semiconductor) in a semiconductor layer where a channel is formed (hereinafter such a transistor is also referred to as an OS transistor) as at least one of the transistors included in the pixel circuit. The OS transistor has much higher field-effect mobility than a transistor containing amorphous silicon. In addition, the OS transistor has an extremely low leakage current between a source and a drain in an off state (hereinafter also referred to as off-state current), and charge accumulated in a capacitor that is connected in series to the transistor can be held for a long period. Furthermore, the power consumption of the display panel can be reduced with the OS transistor.

When an LTPS transistor is used as one or more of the transistors included in the pixel circuit and an OS transistor is used as the rest, the display panel can have low power consumption and high driving capability. As a favorable example, it is preferable that an OS transistor be used as a transistor functioning as a switch for controlling electrical continuity between wirings and an LTPS transistor be used as a transistor for controlling current, for instance.

For example, one of the transistors included in the pixel circuit functions as a transistor for controlling a current flowing through the light-emitting device and can be referred to as a driving transistor. One of a source and a drain of the driving transistor is electrically connected to the pixel electrode of the light-emitting device. An LTPS transistor is preferably used as the driving transistor. Accordingly, the amount of current flowing through the light-emitting device can be increased in the pixel circuit.

Another transistor included in the pixel circuit functions as a switch for controlling selection and non-selection of the pixel and can be referred to as a selection transistor. A gate of the selection transistor is electrically connected to a gate line, and one of a source and a drain thereof is electrically connected to a source line (signal line). An OS transistor is preferably used as the selection transistor. Accordingly, the gray level of the pixel can be maintained even with an extremely low frame frequency (e.g., 1 fps or less); thus, power consumption can be reduced by stopping the driver in displaying a still image.

More specific structure examples will be described below with reference to drawings.

Structure Example 2 of Display Panel

Figure 28A:
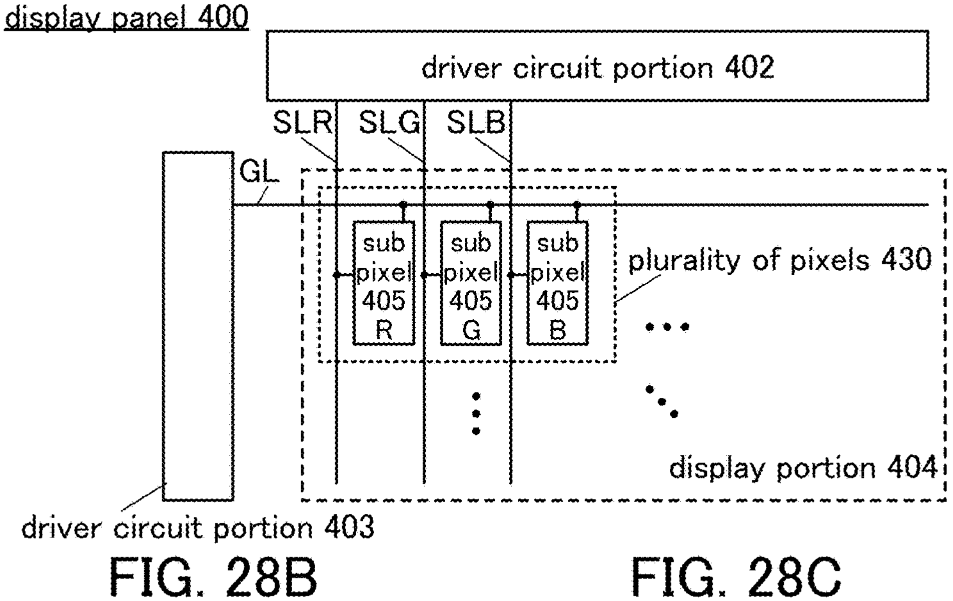
FIG. 28A is a block diagram illustrating an example of a display panel.

FIG. 28A is a block diagram of a display panel 400. The display panel 400 includes a display portion 404, a driver circuit portion 402, a driver circuit portion 403, and the like.

The display portion 404 includes a plurality of pixels 430 arranged in a matrix. The pixels 430 each include a subpixel 405R, a subpixel 405G, and a subpixel 405B. The subpixel 405R, the subpixel 405G, and the subpixel 405B each include a light-emitting device functioning as a display device The pixel 430 is electrically connected to a wiring GL, a wiring SLR, a wiring SLG, and a wiring SLB. The wirings SLR, SLG, and SLB are electrically connected to the driver circuit portion 402. The wiring GL is electrically connected to the driver circuit portion 403. The driver circuit portion 402 functions as a source line driver circuit (also referred to as a source driver), and the driver circuit portion 403 functions as a gate line driver circuit (also referred to as a gate driver). The wiring GL functions as a gate line, and the wirings SLR, SLG, and SLB function as source lines.

The subpixel 405R includes a light-emitting device that emits red light. The subpixel 405G includes a light-emitting device that emits green light. The subpixel 405B includes a light-emitting device that emits blue light. Thus, the display panel 400 can perform full-color display. Note that the pixel 430 may include a subpixel that emits light of another color. For example, the pixel 430 may include, in addition to the three subpixels, a subpixel including a light-emitting element emitting white light or a subpixel including a light-emitting element emitting yellow light.

The wiring GL is electrically connected to the subpixel 405R, the subpixel 405G, and the subpixel 405B arranged in the row direction (the extending direction of the wiring GL). The wiring SLR, the wiring SLG, and the wiring SLB are respectively electrically connected to the subpixels 405R, the subpixels 405G, and the subpixels 405B (not illustrated) arranged in the column direction (the extending direction of the wiring SLR and the like).

Figure 28B:
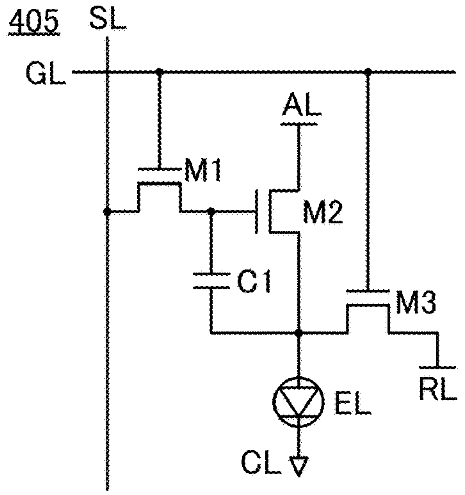
FIGS. 28B to 28D illustrate examples of a pixel circuit.

FIG. 28B illustrates an example of a circuit diagram of a pixel 405 that can be used as the subpixel 405R, the subpixel 405G, and the subpixel 405B. The pixel 405 includes a transistor M1, a transistor M2, a transistor M3, a capacitor C1, and a light-emitting device EL. The wiring GL and a wiring SL are electrically connected to the pixel 405. The wiring SL corresponds to any of the wiring SLR, the wiring SLG, and the wiring SLB illustrated in FIG. 28A.

A gate of the transistor M1 is electrically connected to the wiring GL, one of a source and a drain of the transistor M1 is electrically connected to the wiring SL, and the other of the source and the drain of the transistor M1 is electrically connected to one electrode of the capacitor C1 and a gate of the transistor M2. One of a source and a drain of the transistor M2 is electrically connected to a wiring AL, and the other of the source and the drain of the transistor M2 is electrically connected to one electrode of the light-emitting device EL, the other electrode of the capacitor C1, and one of a source and a drain of the transistor M3. A gate of the transistor M3 is electrically connected to the wiring GL, and the other of the source and the drain of the transistor M3 is electrically connected to a wiring RL. The other electrode of the light-emitting device EL is electrically connected to a wiring CL.

A data potential D is supplied to the wiring SL. A selection signal is supplied to the wiring GL. The selection signal includes a potential for turning on a transistor and a potential for turning off the transistor.

A reset potential is supplied to the wiring RL. An anode potential is supplied to the wiring AL. A cathode potential is supplied to the wiring CL. In the pixel 405, the anode potential is higher than the cathode potential. The reset potential supplied to the wiring RL can be set such that a potential difference between the reset potential and the cathode potential is lower than the threshold voltage of the light-emitting device EL. The reset potential can be a potential higher than the cathode potential, a potential equal to the cathode potential, or a potential lower than the cathode potential.

The transistor M1 and the transistor M3 function as switches. The transistor M2 functions as a transistor for controlling a current flowing through the light-emitting device EL. For example, the transistor M1 can be regarded as functioning as a selection transistor and the transistor M2 as a driving transistor.

Here, it is preferable to use LTPS transistors as all of the transistors M1 to M3. Alternatively, it is preferable to use OS transistors as the transistor M1 and the transistor M3 and to use an LTPS transistor as the transistor M2.

Alternatively, OS transistors may be used as all the transistors M1 to M3. In that case, an LTPS transistor can be used as at least one of a plurality of transistors included in the driver circuit portion 402 and a plurality of transistors included in the driver circuit portion 403, and OS transistors can be used as the other transistors. For example, OS transistors can be used as the transistor provided in the display portion 404, and LTPS transistors can be used as the transistors provided in the driver circuit portions 402 and 403.

A transistor in which an oxide semiconductor is used for a semiconductor layer where a channel is formed can be used as the OS transistor. The semiconductor layer preferably contains indium, M (M is one or more of gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more of aluminum, gallium, yttrium, and tin. It is particularly preferable to use an oxide containing indium, gallium, and zinc (also referred to as IGZO) for the semiconductor layer of the OS transistor. Alternatively, it is preferable to use an oxide containing indium, tin, and zinc. Further alternatively, it is preferable to use an oxide containing indium, gallium, tin, and zinc.

A transistor using an oxide semiconductor having a wider band gap and a lower carrier density than silicon can achieve an extremely low off-state current. Therefore, owing to the low off-state current, charge accumulated in a capacitor that is connected in series to the transistor can be retained for a long time. Hence, it is particularly preferable to use transistors containing an oxide semiconductor as the transistors M1 and M3 connected in series to the capacitor C1. The use of the transistors containing an oxide semiconductor as the transistors M1 and M3 can prevent leakage of charge held in the capacitor C1 through the transistor M1 or the transistor M3. Furthermore, since charge held in the capacitor C1 can be held for a long period, a still image can be displayed for a long period without rewriting data in the pixel 405.

Although all the transistors are n-channel transistors in FIG. 28B, a p-channel transistor can also be used.

The transistors included in the pixel 405 are preferably formed to be arranged over one substrate.

A transistor including a pair of gates overlapping with a semiconductor layer therebetween can be used as the transistor included in the pixel 405.

In the transistor including a pair of gates, the same potential is supplied to the pair of gates electrically connected to each other, whereby the on-state current of the transistor can be increased and the saturation characteristics can be improved. A potential for controlling the threshold voltage of the transistor may be supplied to one of the pair of gates. Furthermore, when a constant potential is supplied to one of the pair of gates, the stability of the electrical characteristics of the transistor can be improved. For example, one of the gates of the transistor may be electrically connected to a wiring to which a constant potential is supplied or may be electrically connected to a source or a drain of the transistor.

Figure 28C:
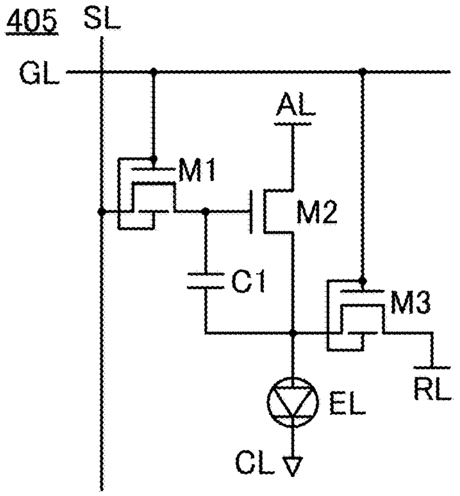

FIG. 28C shows an example of the pixel 405 in which a transistor including a pair of gates is used as each of the transistors M1 and M3. The gates are electrically connected to each other in each of the transistors M1 and M3. Such a structure makes it possible to shorten the period in which data is written to the pixel 405.

Figure 28D:
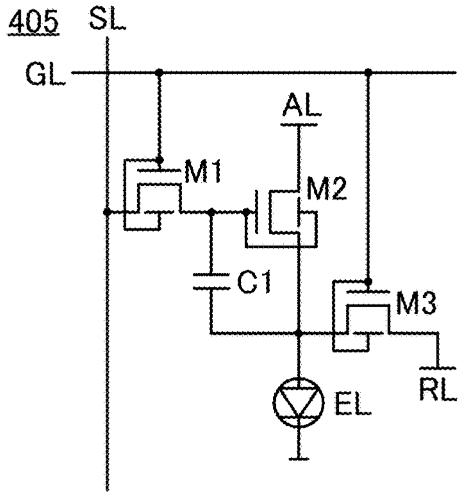

FIG. 28D shows an example of the pixel 405 in which a transistor including a pair of gates is used as the transistor M2 in addition to the transistors M1 and M3. The gates of the transistor M2 are electrically connected to each other. The transistor M2 having such a structure enables the saturation characteristics to be improved, whereby the luminance of the light-emitting device EL can be easily controlled and the display quality can be increased.

[Structure Examples of Transistor]

Cross-sectional structure examples of a transistor that can be used in the above display panel will be described below.

Structure Example 1

Figure 29A:
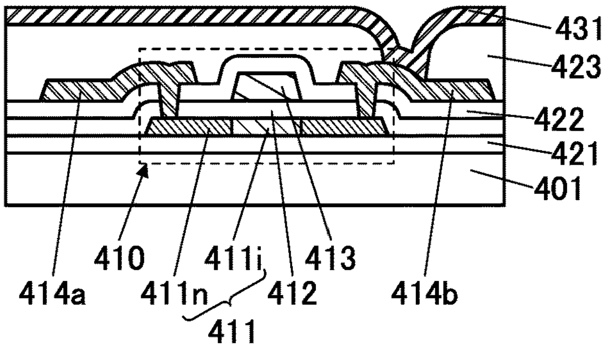
FIGS. 29A to 29D each illustrate an example of a transistor.

FIG. 29A is a cross-sectional view including a transistor 410.

The transistor 410 is provided over a substrate 401 and contains polycrystalline silicon in its semiconductor layer. For example, the transistor 410 corresponds to the transistor M2 in the pixel 405. In other words, FIG. 29A illustrates an example in which one of a source and a drain of the transistor 410 is electrically connected to a conductive layer 431 of the light-emitting device.

The transistor 410 includes a semiconductor layer 411, an insulating layer 412, a conductive layer 413, and the like. The semiconductor layer 411 includes a channel formation region 411*i* and low-resistance regions 411*n*. The semiconductor layer 411 contains silicon. The semiconductor layer 411 preferably contains polycrystalline silicon. Part of the insulating layer 412 functions as a gate insulating layer. Part of the conductive layer 413 functions as a gate electrode.

Note that the semiconductor layer 411 can alternatively contain a metal oxide exhibiting semiconductor characteristics (also referred to as an oxide semiconductor). In this case, the transistor 410 can be referred to as an OS transistor.

The low-resistance regions 411*n* contain an impurity element. For example, to form an n-channel transistor 410, phosphorus, arsenic, or the like is added to the low-resistance regions 411*n*. Meanwhile, to form a p-channel transistor 410, boron, aluminum, or the like is added to the low-resistance regions 411*n*. Moreover, in order to control the threshold voltage of the transistor 410, the above-described impurity may be added to the channel formation region 411*i*.

An insulating layer 421 is provided over the substrate 401. The semiconductor layer 411 is provided over the insulating layer 421. The insulating layer 412 is provided to cover the semiconductor layer 411 and the insulating layer 421. The conductive layer 413 is provided over the insulating layer 412 to overlap the semiconductor layer 411.

An insulating layer 422 is provided to cover the conductive layer 413 and the insulating layer 412. A conductive layer 414*a* and a conductive layer 414*b* are provided over the insulating layer 422. The conductive layer 414*a* and the conductive layer 414*b* are electrically connected to the low-resistance regions 411*n* in openings provided in the insulating layer 422 and the insulating layer 412. Part of the conductive layer 414*a* functions as one of the source electrode and the drain electrode, and part of the conductive layer 414*b* functions as the other of the source electrode and the drain electrode. An insulating layer 423 is provided to cover the conductive layer 414*a*, the conductive layer 414*b*, and the insulating layer 422.

The conductive layer 431 functioning as a pixel electrode is provided over the insulating layer 423. The conductive layer 431 is provided over the insulating layer 423 and is electrically connected to the conductive layer 414*b* through an opening provided in the insulating layer 423. Although not shown here, an EL layer and a common electrode can be stacked over the conductive layer 431.

Structure Example 2

Figure 29B:
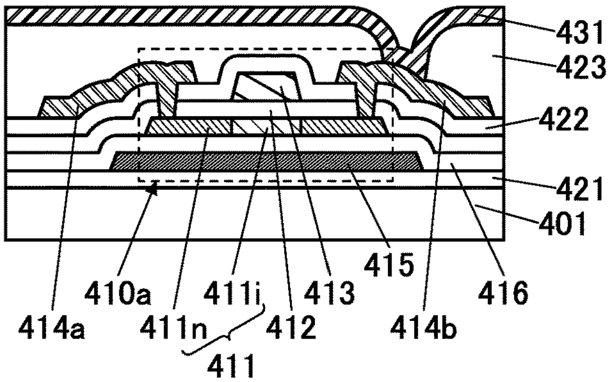

FIG. 29B illustrates a transistor 410*a* including a pair of gate electrodes. The transistor 410*a* in FIG. 29B is different from the transistor in FIG. 29A mainly in that a conductive layer 415 and an insulating layer 416 are provided.

The conductive layer 415 is provided over the insulating layer 421. The insulating layer 416 is provided to cover the conductive layer 415 and the insulating layer 421. The semiconductor layer 411 is provided such that at least the channel formation region 411*i* overlaps the conductive layer 415 with the insulating layer 416 therebetween.

In the transistor 410*a* in FIG. 29B, part of the conductive layer 413 functions as a first gate electrode, and part of the conductive layer 415 functions as a second gate electrode. In this case, part of the insulating layer 412 functions as a first gate insulating layer, and part of the insulating layer 416 functions as a second gate insulating layer.

To electrically connect the first gate electrode to the second gate electrode, the conductive layer 413 is electrically connected to the conductive layer 415 through an opening provided in the insulating layers 412 and 416 in a region not illustrated. To electrically connect the second gate electrode to a source or a drain, the conductive layer 415 is electrically connected to the conductive layer 414*a* or the conductive layer 414*b* through an opening provided in the insulating layers 422, 412, and 416 in a region not illustrated.

In the case where all of the transistors included in the pixel 405 are LTPS transistors, the transistor 410 illustrated in FIG. 29A or the transistor 410*a* illustrated in FIG. 29B can be used. In this case, the transistors included in the pixels 405 may all be the transistors 410*a* or the transistors 410 or may be a combination of the transistors 410*a* and the transistors 410.

Structure Example 3

Described below is an example of a structure including both a transistor containing silicon in its semiconductor layer and a transistor containing a metal oxide in its semiconductor layer.

Figure 29C:
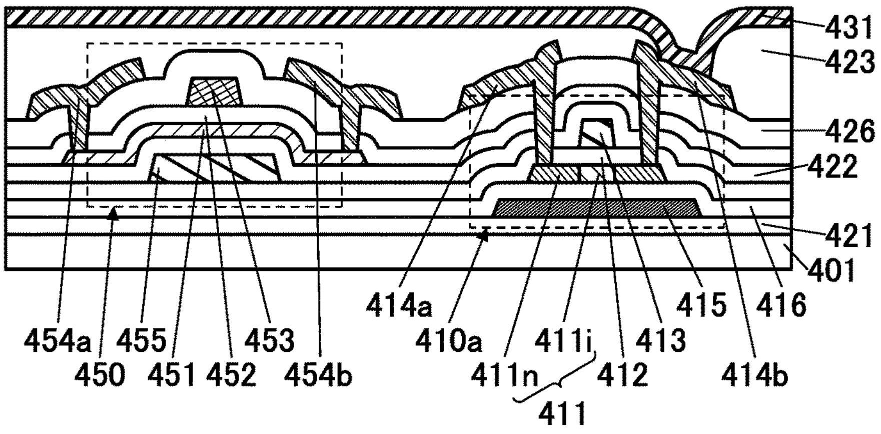

FIG. 29C is a schematic cross-sectional view including the transistor 410*a* and a transistor 450.

Structure example 1 described above can be referred to for the transistor 410*a*. Although an example using the transistor 410*a* is shown here, a structure including the transistor 410 and the transistor 450 or a structure including all the transistors 410, 410*a*, and 450 may alternatively be employed.

The transistor 450 contains a metal oxide in its semiconductor layer. The structure in FIG. 29C shows an example in which the transistor 450 and the transistor 410*a* correspond to the transistor M1 and the transistor M2, respectively, in the pixel 405. That is, FIG. 29C illustrates an example in which one of the source and the drain of the transistor 410*a* is electrically connected to the conductive layer 431.

Moreover, FIG. 29C illustrates an example in which the transistor 450 includes a pair of gates.

The transistor 450 includes a conductive layer 455, the insulating layer 422, a semiconductor layer 451, an insulating layer 452, a conductive layer 453, and the like. Part of the conductive layer 453 functions as a first gate of the transistor 450, and part of the conductive layer 455 functions as a second gate of the transistor 450. In this case, part of the insulating layer 452 functions as a first gate insulating layer of the transistor 450, and part of the insulating layer 422 functions as a second gate insulating layer of the transistor 450.

The conductive layer 455 is provided over the insulating layer 412. The insulating layer 422 is provided to cover the conductive layer 455. The semiconductor layer 451 is provided over the insulating layer 422. The insulating layer 452 is provided to cover the semiconductor layer 451 and the insulating layer 422. The conductive layer 453 is provided over the insulating layer 452 and includes a region overlapping the semiconductor layer 451 and the conductive layer 455.

An insulating layer 426 is provided to cover the insulating layer 452 and the conductive layer 453. A conductive layer 454*a* and a conductive layer 454*b* are provided over the insulating layer 426. The conductive layer 454*a* and the conductive layer 454*b* are electrically connected to the semiconductor layer 451 in openings provided in the insulating layer 426 and the insulating layer 452. Part of the conductive layer 454*a* functions as one of a source electrode and a drain electrode, and part of the conductive layer 454*b* functions as the other of the source electrode and the drain electrode. The insulating layer 423 is provided to cover the conductive layer 454*a*, the conductive layer 454*b*, and the insulating layer 426.

Here, the conductive layers 414*a* and 414*b* electrically connected to the transistor 410*a* are preferably formed by processing the same conductive film as the conductive layers 454*a* and 454*b*. In FIG. 29C, the conductive layer 414*a*, the conductive layer 414*b*, the conductive layer 454*a*, and the conductive layer 454*b* are formed on the same plane (i.e., in contact with the top surface of the insulating layer 426) and contain the same metal element. In this case, the conductive layer 414*a* and the conductive layer 414*b* are electrically connected to the low-resistance regions 411*n* through openings provided in the insulating layers 426, 452, 422, and 412. This is preferable because the manufacturing process can be simplified.

Moreover, the conductive layer 413 functioning as the first gate electrode of the transistor 410*a* and the conductive layer 455 functioning as the second gate electrode of the transistor 450 are preferably formed by processing the same conductive film. In FIG. 29C, the conductive layer 413 and the conductive layer 455 are formed on the same plane (i.e., in contact with the top surface of the insulating layer 412) and contain the same metal element. This is preferable because the manufacturing process can be simplified.

Figure 29D:
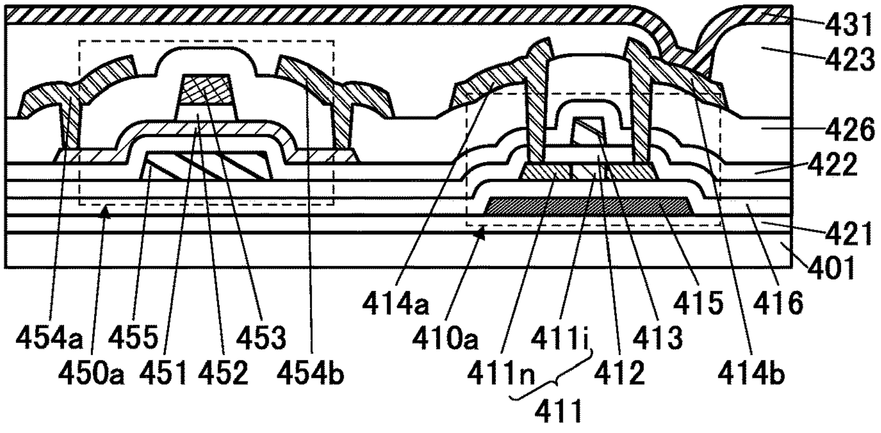

In FIG. 29C, the insulating layer 452 functioning as the first gate insulating layer of the transistor 450 covers an end portion of the semiconductor layer 451. Alternatively, as in a transistor 450*a* illustrated in FIG. 29D, the insulating layer 452 may be processed to have the same or substantially the same top surface shape as that of the conductive layer 453.

Note that in this specification and the like, the expression "having substantially the same top surface shapes" means that at least outlines of stacked layers partly overlap each other. For example, the case of patterning or partly patterning an upper layer and a lower layer with the use of the same mask pattern is included in the expression. The expression "having substantially the same top surface shapes" also includes the case where the outlines do not completely overlap each other; for instance, the edge of the upper layer may be positioned on the inner side or the outer side of the edge of the lower layer.

Although the example in which the transistor 410*a* corresponds to the transistor M2 and is electrically connected to the pixel electrode is shown here, one embodiment of the present invention is not limited thereto. For example, a structure where the transistor 450 or the transistor 450*a* corresponds to the transistor M2 may be employed. In that case, the transistor 410*a* corresponds to the transistor M1, the transistor M3, or another transistor.

This embodiment can be combined with any of the other embodiments as appropriate.

Embodiment 6

In this embodiment, a light-emitting device that can be used in the display panel of one embodiment of the present invention will be described.

Figure 30A:
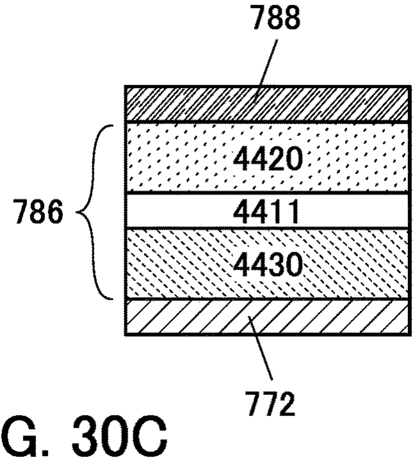
FIGS. 30A to 30F each illustrate a structure example of a light-emitting device.

As illustrated in FIG. 30A, the light-emitting device includes an EL layer 786 between a pair of electrodes (a lower electrode 772 and an upper electrode 788). The EL layer 786 can be formed of a plurality of layers such as a layer 4420, a light-emitting layer 4411, and a layer 4430. The layer 4420 can include, for example, a layer containing a substance with a high electron-injection property (an electron-injection layer) and a layer containing a substance with a high electron-transport property (an electron-transport layer). The light-emitting layer 4411 contains a light-emitting compound, for example. The layer 4430 can include, for example, a layer containing a substance with a high hole-injection property (a hole-injection layer) and a layer containing a substance with a high hole-transport property (a hole-transport layer).

The structure including the layer 4420, the light-emitting layer 4411, and the layer 4430, which is provided between a pair of electrodes, can function as a single light-emitting unit, and the structure in FIG. 30A is referred to as a single structure in this specification.

Figure 30B:
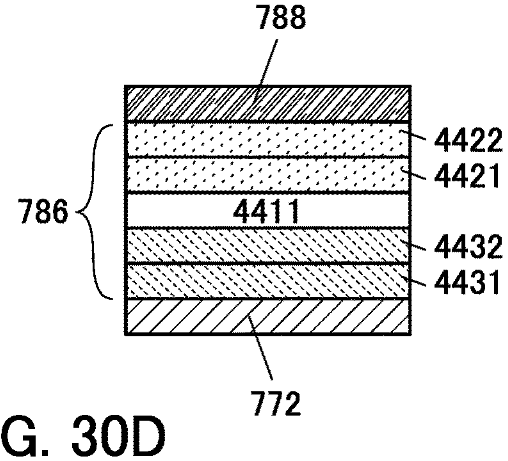

FIG. 30B is a modification example of the EL layer 786 included in the light-emitting device illustrated in FIG. 30A. Specifically, the light-emitting device illustrated in FIG. 30B includes a layer 4431 over the lower electrode 772, a layer 4432 over the layer 4431, the light-emitting layer 4411 over the layer 4432, a layer 4421 over the light-emitting layer 4411, a layer 4422 over the layer 4421, and the upper electrode 788 over the layer 4422. For example, when the lower electrode 772 functions as an anode and the upper electrode 788 functions as a cathode, the layer 4431 functions as a hole-injection layer, the layer 4432 functions as a hole-transport layer, the layer 4421 functions as an electron-transport layer, and the layer 4422 functions as an electron-injection layer. Alternatively, when the lower electrode 772 functions as a cathode and the upper electrode 788 functions as an anode, the layer 4431 functions as an electron-injection layer, the layer 4432 functions as an electron-transport layer, the layer 4421 functions as a hole-transport layer, and the layer 4422 functions as the hole-injection layer. With such a layered structure, carriers can be efficiently injected to the light-emitting layer 4411, and the efficiency of the recombination of carriers in the light-emitting layer 4411 can be enhanced.

Figure 30C:
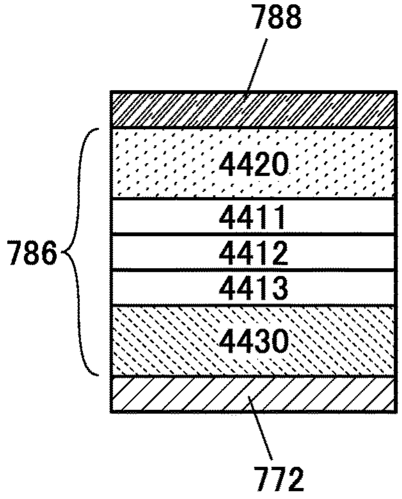
Figure 30D:
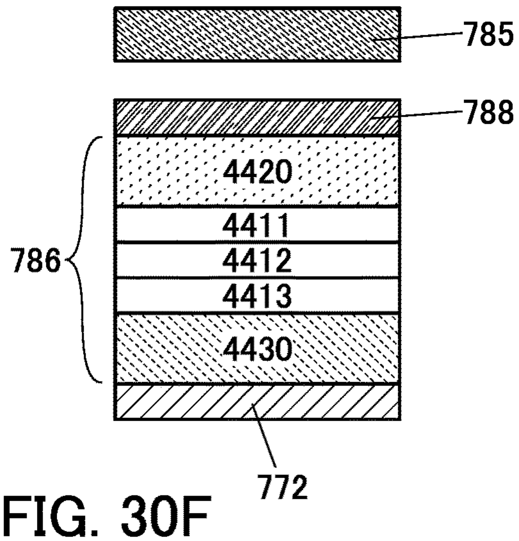

Note that structures in which a plurality of light-emitting layers (light-emitting layers 4411, 4412, and 4413) are provided between the layer 4420 and the layer 4430 as illustrated in FIG. 30C and FIG. 30D are other variations of the single structure.

Figure 30E:
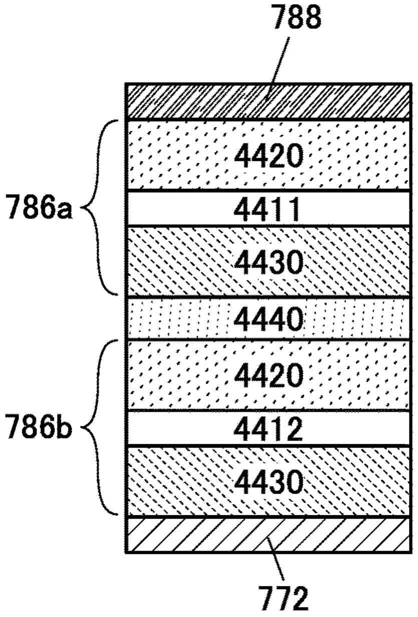
Figure 30F:
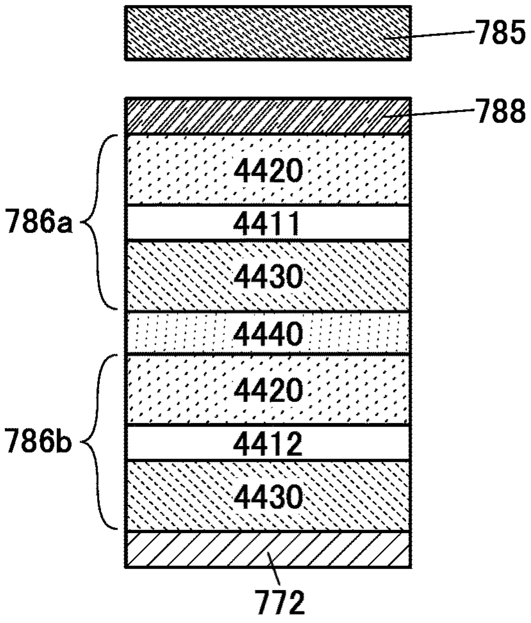

Structures in which a plurality of light-emitting units (EL layers 786*a* and 786*b*) are connected in series with a charge-generation layer 4440 therebetween as illustrated in FIG. 30E and FIG. 30F are referred to as a tandem structure in this specification. A tandem structure may be referred to as a stack structure. The tandem structure enables a light-emitting device capable of high luminance light emission.

In FIG. 30C and FIG. 30D, light-emitting materials that emit light of the same color, or moreover, the same light-emitting material may be used for the light-emitting layer 4411, the light-emitting layer 4412, and the light-emitting layer 4413. For example, a light-emitting material that emits blue light may be used for the light-emitting layer 4411, the light-emitting layer 4412, and the light-emitting layer 4413. A color conversion layer may be provided as a layer 785 illustrated in FIG. 30D.

Alternatively, light-emitting materials that emit light of different colors may be used for the light-emitting layer 4411, the light-emitting layer 4412, and the light-emitting layer 4413. White light can be obtained when the light-emitting layer 4411, the light-emitting layer 4412, and the light-emitting layer 4413 emit light of complementary colors. A color filter (also referred to as a coloring layer) may be provided as the layer 785 illustrated in FIG. 30D. When white light passes through a color filter, light of a desired color can be obtained.

In FIGS. 30E and 30F, light-emitting materials that emit light of the same color, or moreover, the same light-emitting material may be used for the light-emitting layer 4411 and the light-emitting layer 4412. Alternatively, light-emitting materials that emit light of different colors may be used for the light-emitting layer 4411 and the light-emitting layer 4412. White light can be obtained when the light-emitting layer 4411 and the light-emitting layer 4412 emit light of complementary colors. FIG. 30F illustrates an example in which the layer 785 is further provided. One or both of a color conversion layer and a color filter (coloring layer) can be used as the layer 785.

In FIGS. 30C to 30F, the layers 4420 and 4430 may each have a layered structure of two or more layers as in FIG. 30B.

A structure in which light-emitting devices that emit light of different colors (e.g., blue (B), green (G), and red (R)) are separately formed is referred to as a side-by-side (SBS) structure in some cases.

The emission color of the light-emitting device can be changed to red, green, blue, cyan, magenta, yellow, white, or the like depending on the material of the EL layer 786. When the light-emitting device has a microcavity structure, the color purity can be further increased.

In the light-emitting device that emits white light, the light-emitting layer preferably contains two or more kinds of light-emitting substances. To obtain white light emission, the two or more kinds of light-emitting substances are selected so as to emit light of complementary colors. For example, the emission colors of first and second light-emitting layers are complementary, so that the light-emitting device can emit white light as a whole. This can be applied to a light-emitting device including three or more light-emitting layers.

The light-emitting layer preferably contains two or more selected from light-emitting substances that emit light of red (R), green (G), blue (B), yellow (Y), orange (0), and the like. Alternatively, the light-emitting layer preferably contains two or more light-emitting substances that emit light containing two or more of spectral components of R, G, and B.

This embodiment can be combined with any of the other embodiments as appropriate.

Embodiment 7

In this embodiment, electronic devices of embodiments of the present invention will be described with reference to FIGS. 31A to 31D, FIGS. 32A to 32F, and FIGS. 33A to 33G.

The electronic device of this embodiment can be used for the display system of one embodiment of the present invention. Specifically, the electronic device can be used as a wearable display apparatus or a terminal in the display system of one embodiment of the present invention.

Electronic devices of this embodiment are each provided with the display panel of one embodiment of the present invention in a display portion. The display panel of one embodiment of the present invention can be easily increased in resolution and definition and can achieve high display quality. Thus, the display panel of one embodiment of the present invention can be used for a display portion of a variety of electronic devices.

Examples of the electronic devices include a digital camera, a digital video camera, a digital photo frame, a mobile phone, a portable game console, a portable information terminal, and an audio reproducing device, in addition to electronic devices with a relatively large screen, such as a television device, desktop and laptop personal computers, a monitor of a computer and the like, digital signage, and a large game machine such as a pachinko machine.

In particular, the display panel of one embodiment of the present invention can have a high resolution, and thus can be favorably used for an electronic device having a relatively small display portion. Examples of such an electronic device include watch-type and bracelet-type information terminal devices (wearable devices) and wearable devices worn on the head, such as a VR device like a head-mounted display, a glasses-type AR device, and an MR device.

The definition of the display panel of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K (number of pixels: 3840×2160), or 8K (number of pixels: 7680×4320). In particular, a definition of 4K, 8K, or higher is preferable. The pixel density (resolution) of the display panel of one embodiment of the present invention is preferably 100 ppi or higher, further preferably 300 ppi or higher, further preferably 500 ppi or higher, further preferably 1000 ppi or higher, still further preferably 2000 ppi or higher, still further preferably 3000 ppi or higher, still further preferably 5000 ppi or higher, yet further preferably 7000 ppi or higher. The use of the display panel having one or both of such high definition and high resolution can further increase realistic sensation, sense of depth, and the like in personal use such as portable use and home use. There is no particular limitation on the screen ratio (aspect ratio) of the display panel of one embodiment of the present invention. For example, the display panel is compatible with a variety of screen ratios such as 1:1 (a square), 4:3, 16:9, and 16:10.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device in this embodiment can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Examples of head-mounted wearable devices will be described with reference to FIGS. 31A to 31D. These wearable devices have one or both of a function of displaying AR contents and a function of displaying VR contents. Note that these wearable devices may have a function of displaying SR or MR contents, in addition to AR and VR contents. The electronic device having a function of displaying contents of at least one of AR, VR, SR, MR, and the like enables the user to feel a higher level of immersion. The electronic devices illustrated in FIGS. 31A to 31D are each suitably used as a wearable display apparatus in the display system of one embodiment of the present invention.

Figure 31A:
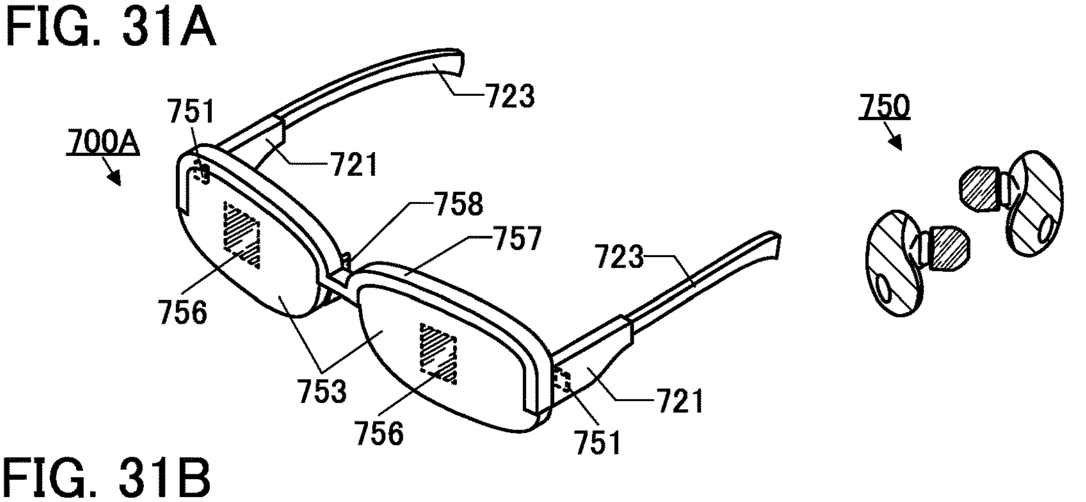
FIGS. 31A to 31D illustrate examples of electronic devices.
Figure 31B:
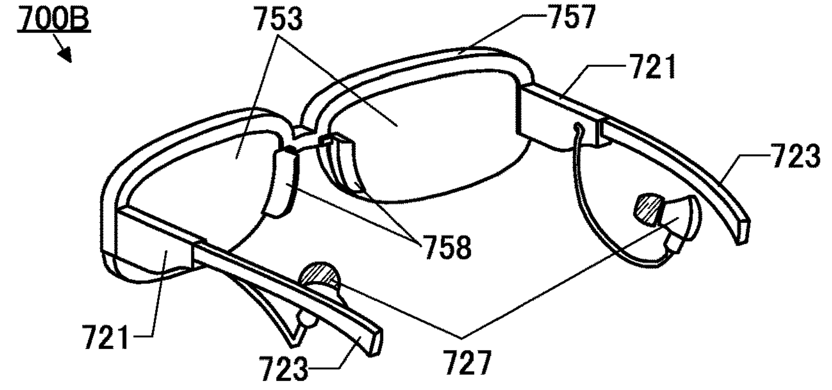

An electronic device 700A illustrated in FIG. 31A and an electronic device 700B illustrated in FIG. 31B each include a pair of display panels 751, a pair of housings 721, a communication portion (not illustrated), a pair of wearing portions 723, a control portion (not illustrated), an image capturing portion (not illustrated), a pair of optical members 753, a frame 757, and a pair of nose pads 758.

The display panel of one embodiment of the present invention can be used for the display panels 751. Thus, the electronic devices are capable of performing ultrahigh-resolution display.

The electronic devices 700A and 700B can each project images displayed on the display panels 751 onto display regions 756 of the optical members 753. Since the optical members 753 have a light-transmitting property, the user can see images displayed on the display regions 756, which are superimposed on transmission images seen through the optical members 753. Accordingly, the electronic devices 700A and 700B are electronic devices capable of AR display.

In the electronic devices 700A and 700B, a camera capable of capturing images of the front side may be provided as the image capturing portion. Furthermore, when the electronic devices 700A and 700B are provided with an acceleration sensor such as a gyroscope sensor, the orientation of the user's head can be sensed and an image corresponding to the orientation can be displayed on the display regions 756.

The communication portion includes a wireless communication device, and a video signal and the like can be supplied by the wireless communication device. Instead of or in addition to the wireless communication device, a connector that can be connected to a cable for supplying a video signal and a power supply potential may be provided.

The electronic devices 700A and 700B are provided with a battery so that they can be charged wirelessly and/or by wire.

A touch sensor module may be provided in the housing 721. The touch sensor module has a function of detecting a touch on the outer surface of the housing 721. Detecting a tap operation, a slide operation, or the like by the user with the touch sensor module enables various types of processing. For example, a video can be paused or restarted by a tap operation, and can be fast-forwarded or fast-reversed by a slide operation. When the touch sensor module is provided in each of the two housings 721, the range of the operation can be increased.

Various touch sensors can be applied to the touch sensor module. For example, any of touch sensors of the following types can be used: a capacitive type, a resistive type, an infrared type, an electromagnetic induction type, a surface acoustic wave type, and an optical type. In particular, a capacitive sensor or an optical sensor is preferably used for the touch sensor module.

In the case of using an optical touch sensor, a photoelectric conversion device (also referred to as a photoelectric conversion element) can be used as a light-receiving device (also referred to as a light-receiving element). One or both of an inorganic semiconductor and an organic semiconductor can be used for an active layer of the photoelectric conversion device.

Figure 31C:
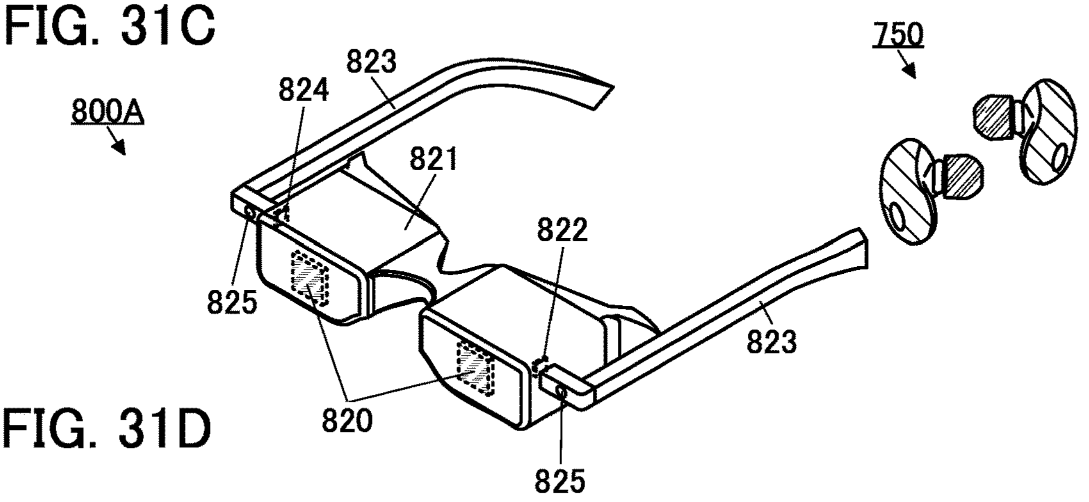
Figure 31D:
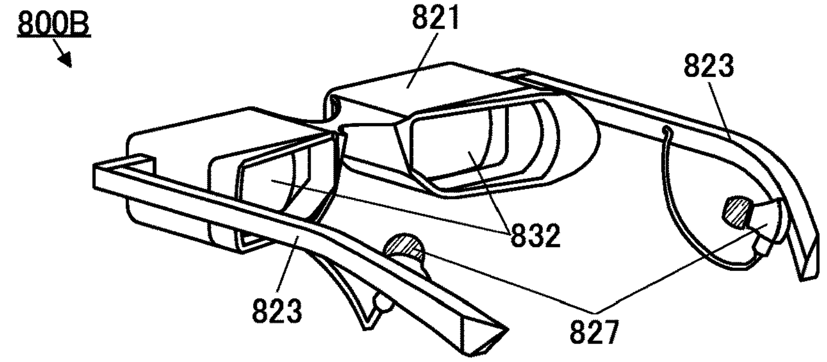

An electronic device 800A illustrated in FIG. 31C and an electronic device 800B illustrated in FIG. 31D each include a pair of display portions 820, a housing 821, a communication portion 822, a pair of wearing portions 823, a control portion 824, a pair of image capturing portions 825, and a pair of lenses 832.

The display panel of one embodiment of the present invention can be used in the display portions 820. Thus, the electronic devices are capable of performing ultrahigh-resolution display. Such electronic devices provide an enhanced sense of immersion to the user.

The display portions 820 are provided at positions where the user can see through the lenses 832 inside the housing 821. When the pair of display portions 820 display different images, three-dimensional display using parallax can be performed.

The electronic devices 800A and 800B can be regarded as electronic devices for VR. The user who wears the electronic device 800A or the electronic device 800B can see images displayed on the display portions 820 through the lenses 832.

The electronic devices 800A and 800B preferably include a mechanism for adjusting the lateral positions of the lenses 832 and the display portions 820 so that the lenses 832 and the display portions 820 are positioned optimally in accordance with the positions of the user's eyes. Moreover, the electronic devices 800A and 800B preferably include a mechanism for adjusting focus by changing the distance between the lenses 832 and the display portions 820.

The electronic device 800A or the electronic device 800B can be mounted on the user's head with the wearing portions 823. FIG. 31C and the like show examples where the wearing portion 823 has a shape like a temple of glasses; however, one embodiment of the present invention is not limited thereto. The wearing portion 823 can have any shape with which the user can wear the electronic device, for example, a shape of a helmet or a band.

The image capturing portion 825 has a function of obtaining information on the external environment. Data obtained by the image capturing portion 825 can be output to the display portion 820. An image sensor can be used for the image capturing portion 825. Moreover, a plurality of cameras may be provided so as to support a plurality of fields of view, such as a telescope field of view and a wide field of view.

Although an example where the image capturing portions 825 are provided is shown here, a range sensor capable of measuring a distance between the user and an object (hereinafter also referred to as a sensing portion) just needs to be provided. In other words, the image capturing portion 825 is one embodiment of the sensing portion. As the sensing portion, an image sensor or a range image sensor such as a light detection and ranging (LiDAR) sensor can be used, for example. By using images obtained by the camera and images obtained by the range image sensor, more information can be obtained and a gesture operation with higher accuracy is possible.

The electronic device 800A may include a vibration mechanism that functions as bone-conduction earphones. For example, at least one of the display portion 820, the housing 821, and the wearing portion 823 can include the vibration mechanism. Thus, without additionally requiring an audio device such as headphones, earphones, or a speaker, the user can enjoy video and sound only by wearing the electronic device 800A.

The electronic devices 800A and 800B may each include an input terminal. To the input terminal, a cable for supplying a video signal from a video output device or the like, power for charging the battery provided in the electronic device, and the like can be connected.

The electronic device of one embodiment of the present invention may have a function of performing wireless communication with earphones 750. The earphones 750 include a communication portion (not illustrated) and has a wireless communication function. The earphones 750 can receive information (e.g., audio data) from the electronic device with the wireless communication function. For example, the electronic device 700A in FIG. 31A has a function of transmitting information to the earphones 750 with the wireless communication function. As another example, the electronic device 800A in FIG. 31C has a function of transmitting information to the earphones 750 with the wireless communication function.

The electronic device may include an earphone portion. The electronic device 700B in FIG. 31B includes earphone portions 727. For example, the earphone portion 727 can be connected to the control portion by wire. Part of a wiring that connects the earphone portion 727 and the control portion may be positioned inside the housing 721 or the wearing portion 723.

Similarly, the electronic device 800B in FIG. 31D includes earphone portions 827. For example, the earphone portion 827 can be connected to the control portion 824 by wire. Part of a wiring that connects the earphone portion 827 and the control portion 824 may be positioned inside the housing 821 or the wearing portion 823. Alternatively, the earphone portions 827 and the wearing portions 823 may include magnets. This is preferred because the earphone portions 827 can be fixed to the wearing portions 823 with magnetic force and thus can be easily housed.

The electronic device may include an audio output terminal to which earphones, headphones, or the like can be connected. The electronic device may include one or both of an audio input terminal and an audio input mechanism. As the audio input mechanism, a sound collecting device such as a microphone can be used, for example. The electronic device may have a function of a headset by including the audio input mechanism.

As described above, both the glasses-type device (e.g., the electronic devices 700A and 700B) and the goggles-type device (e.g., the electronic devices 800A and 800B) are preferable as the electronic device of one embodiment of the present invention.

The electronic device of one embodiment of the present invention can transmit information to earphones by wire or wirelessly.

The electronic devices illustrated in FIGS. 32A to 32F and FIGS. 33A to 33G are each favorably used as the terminal in the display system of one embodiment of the present invention.

Figure 32A:
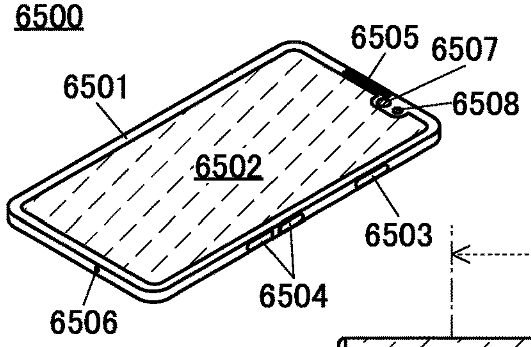
FIGS. 32A to 32F illustrate examples of electronic devices.

An electronic device 6500 illustrated in FIG. 32A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display panel of one embodiment of the present invention can be used in the display portion 6502.

Figure 32B:
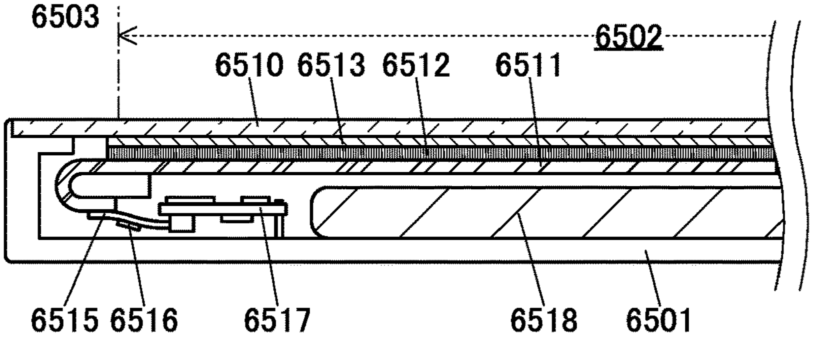

FIG. 32B is a schematic cross-sectional view including an end portion of the housing 6501 on the microphone 6506 side.

A protection member 6510 having a light-transmitting property is provided on the display surface side of the housing 6501. A display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be achieved. Since the display panel 6511 is extremely thin, the battery 6518 with high capacity can be mounted without an increase in the thickness of the electronic device. Moreover, part of the display panel 6511 is folded back so that a connection portion with the FPC 6515 is provided on the back side of the pixel portion, whereby an electronic device with a narrow bezel can be achieved.

Figure 32C:
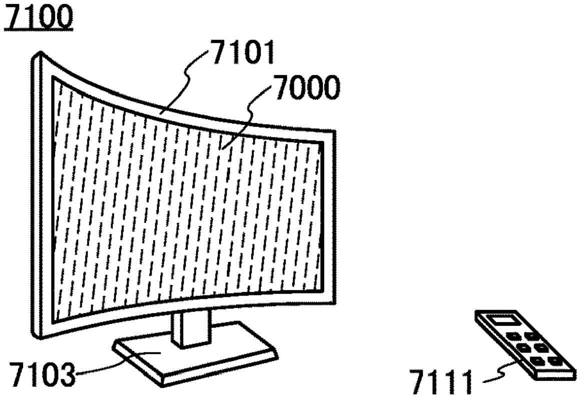

FIG. 32C illustrates an example of a television device. In a television device 7100, a display portion 7000 is incorporated in a housing 7101. Here, the housing 7101 is supported by a stand 7103.

The display panel of one embodiment of the present invention can be used in the display portion 7000.

Operation of the television device 7100 illustrated in FIG. 32C can be performed with an operation switch provided in the housing 7101 and a separate remote controller 7111. Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With operation keys or a touch panel provided in the remote controller 7111, channels and volume can be controlled and videos displayed on the display portion 7000 can be controlled.

Note that the television device 7100 includes a receiver, a modem, and the like. A general television broadcast can be received with the receiver. When the television device is connected to a communication network with or without wires via the modem, one-way (from a transmitter to a receiver) or two-way (between a transmitter and a receiver or between receivers, for example) data communication can be performed.

Figure 32D:
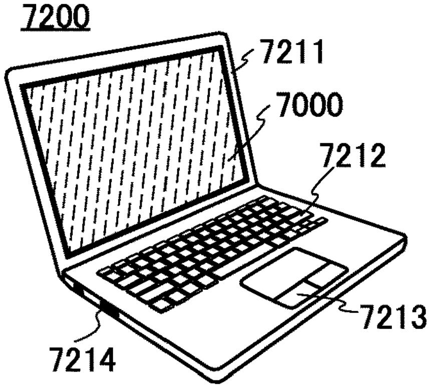

FIG. 32D illustrates an example of a laptop personal computer. The laptop personal computer 7200 includes a housing 7211, a keyboard 7212, a pointing device 7213, an external connection port 7214, and the like. The display portion 7000 is incorporated in the housing 7211.

The display panel of one embodiment of the present invention can be used in the display portion 7000.

Figure 32E:
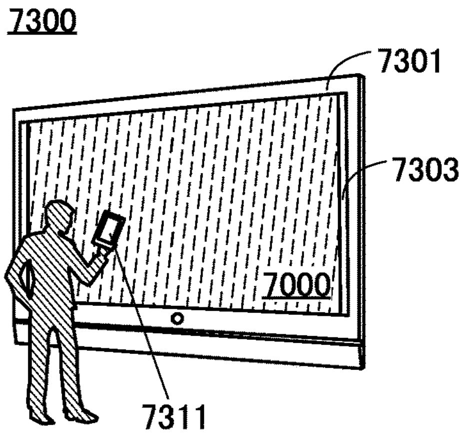
Figure 32F:
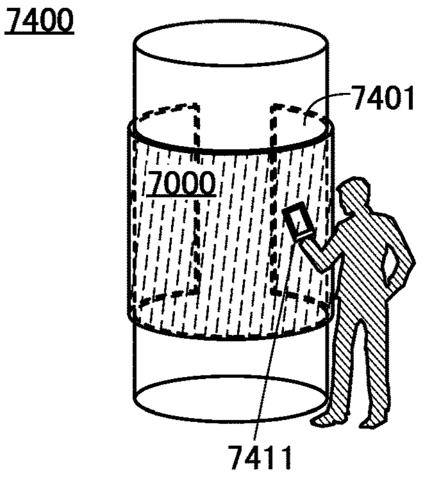

FIGS. 32E and 32F illustrate examples of digital signage.

Digital signage 7300 illustrated in FIG. 32E includes a housing 7301, the display portion 7000, a speaker 7303, and the like. The digital signage 7300 can also include an LED lamp, an operation key (including a power switch or an operation switch), a connection terminal, a variety of sensors, a microphone, and the like.

FIG. 32F shows digital signage 7400 attached to a cylindrical pillar 7401. The digital signage 7400 includes the display portion 7000 provided along a curved surface of the pillar 7401.

In FIGS. 32E and 32F, the display panel of one embodiment of the present invention can be used in the display portion 7000.

A larger area of the display portion 7000 can increase the amount of data that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIGS. 32E and 32F, it is preferable that the digital signage 7300 or the digital signage 7400 can work with an information terminal 7311 or an information terminal 7411, such as a smartphone that a user has, through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

Electronic devices illustrated in FIGS. 33A to 33G each include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, power, radiation, flow rate, humidity, gradient, oscillation, odor, or infrared rays), a microphone 9008, and the like.

The electronic devices illustrated in FIGS. 33A to 33G have a variety of functions. For example, the electronic devices can have a function of displaying a variety of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium. Note that the functions of the electronic devices are not limited thereto, and the electronic devices can have a variety of functions. The electronic devices may include a plurality of display portions. The electronic devices may be provided with a camera or the like and have a function of capturing a still image or a moving image, a function of storing the captured image in a storage medium (an external storage medium or a storage medium incorporated in the camera), a function of displaying the captured image on the display portion, and the like.

The electronic devices illustrated in FIGS. 33A to 33G will be described in detail below.

Figure 33A:
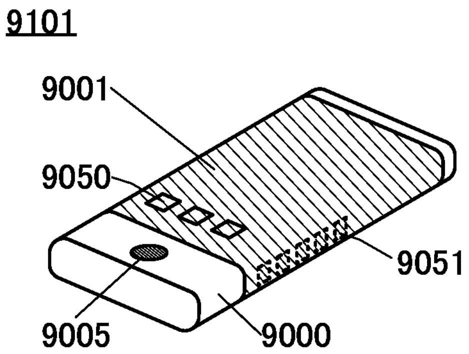
FIGS. 33A to 33G illustrate examples of electronic devices.

FIG. 33A is a perspective view of a portable information terminal 9101. The portable information terminal 9101 can be used as a smartphone, for example. The portable information terminal 9101 may include the speaker 9003, the connection terminal 9006, the sensor 9007, or the like. The portable information terminal 9101 can display text and image information on its plurality of surfaces. FIG. 33A illustrates an example in which three icons 9050 are displayed. Furthermore, information 9051 indicated by dashed rectangles can be displayed on another surface of the display portion 9001. Examples of the information 9051 include notification of reception of an e-mail, an SNS message, or an incoming call, the title and sender of an e-mail, an SNS message, or the like, the date, the time, remaining battery, and the radio field intensity. Alternatively, the icon 9050 or the like may be displayed at the position where the information 9051 is displayed.

Figure 33D:
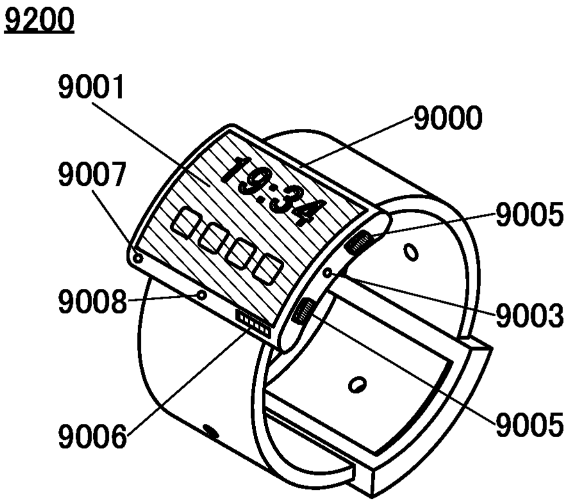
Figure 33B:
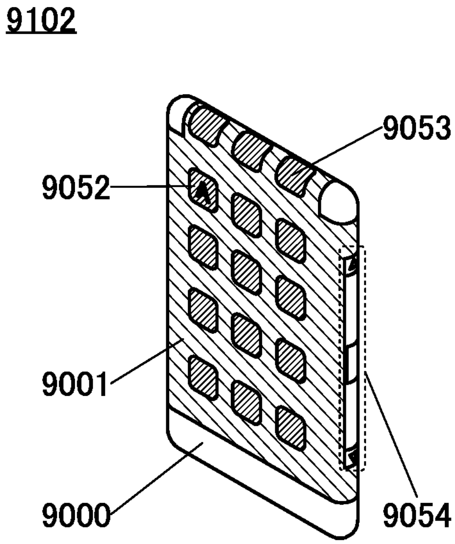

FIG. 33B is a perspective view of a portable information terminal 9102. The portable information terminal 9102 has a function of displaying information on three or more surfaces of the display portion 9001. Here, information 9052, information 9053, and information 9054 are displayed on different surfaces. For example, the user of the portable information terminal 9102 can check the information 9053 displayed such that it can be seen from above the portable information terminal 9102, with the portable information terminal 9102 put in a breast pocket of his/her clothes. Thus, the user can see the display without taking out the portable information terminal 9102 from the pocket and decide whether to answer the call, for example.

Figure 33E:
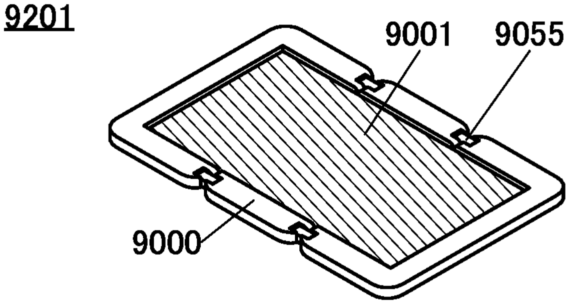
Figure 33F:
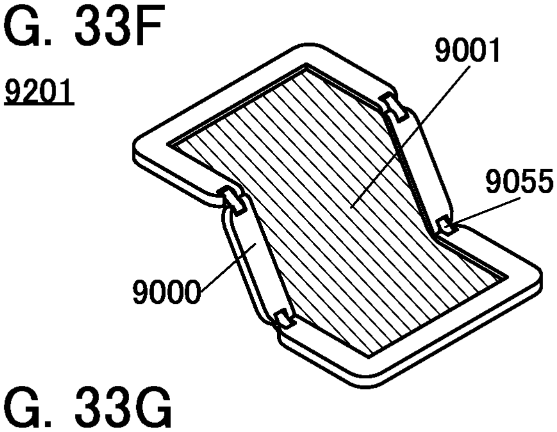
Figure 33C:
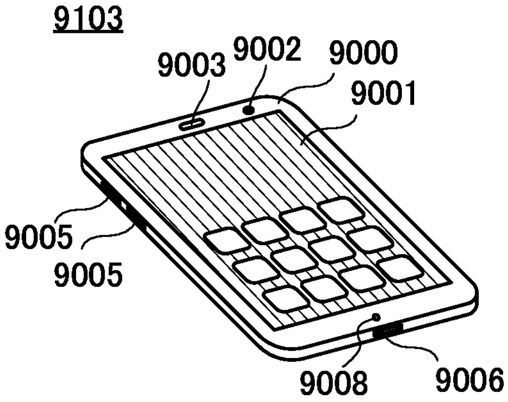

FIG. 33C is a perspective view of a tablet terminal 9103. The tablet terminal 9103 is capable of executing a variety of applications such as mobile phone calls, e-mailing, viewing and editing texts, music reproduction, Internet communication, and a computer game, for example. The tablet terminal 9103 includes the display portion 9001, the camera 9002, the microphone 9008, and the speaker 9003 on the front surface of the housing 9000; the operation keys 9005 as buttons for operation on the left side surface of the housing 9000; and the connection terminal 9006 on the bottom surface of the housing 9000.

FIG. 33D is a perspective view of a watch-type portable information terminal 9200. The portable information terminal 9200 can be used as a Smartwatch (registered trademark), for example. The display surface of the display portion 9001 is curved, and an image can be displayed on the curved display surface. Furthermore, for example, mutual communication between the portable information terminal 9200 and a headset capable of wireless communication can be performed, and thus hands-free calling is possible. With the connection terminal 9006, the portable information terminal 9200 can perform mutual data transmission with another information terminal and charging. Note that the charging operation may be performed by wireless power feeding.

Figure 33G:
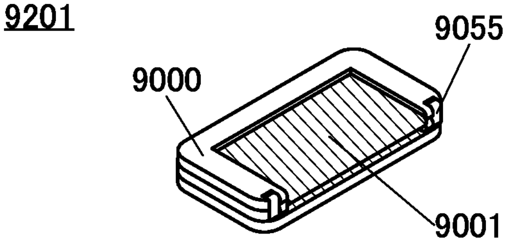

FIGS. 33E to 33G are perspective views of a foldable portable information terminal 9201. FIG. 33E is a perspective view showing the portable information terminal 9201 that is opened. FIG. 33G is a perspective view showing the portable information terminal 9201 that is folded. FIG. 33F is a perspective view showing the portable information terminal 9201 that is shifted from one of the states in FIGS. 33E and 26G to the other. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. The display portion 9001 can be folded with a radius of curvature greater than or equal to 0.1 mm and less than or equal to 150 mm, for example.

This embodiment can be combined with any of the other embodiments as appropriate.

This application is based on Japanese Patent Application Serial No. 2021-096220 filed with Japan Patent Office on Jun. 8, 2021, the entire contents of which are hereby incorporated by reference.

What is claimed is:

1. A display apparatus comprising:

a display portion;

a first communication portion; and a wearing portion, wherein the wearing portion is configured to be worn on a head, wherein the first communication portion is configured to execute wireless communication, wherein the display portion is capable of full-color display, wherein the display portion comprises a first subpixel and a second subpixel, wherein the first subpixel comprises a first light-emitting device that emits blue light, wherein the second subpixel comprises a second light-emitting device that emits light of a color different from a blue color, wherein at least one material in the first light-emitting device is different from at least one material in the second light-emitting device, wherein the first light-emitting device comprises a first pixel electrode, a first electroluminescent layer over the first pixel electrode, and a common electrode over the first electroluminescent layer, wherein the second light-emitting device comprises a second pixel electrode, a second electroluminescent layer over the second pixel electrode, and the common electrode over the second electroluminescent layer, wherein the display portion comprises a first insulating layer comprising a region overlapping with the common electrode, wherein the first insulating layer covers a side surface of the first electroluminescent layer and a side surface of the second electroluminescent layer, and wherein the common electrode is positioned over the first insulating layer.

2. The display apparatus according to claim 1, wherein the first light-emitting device comprises a common layer between the first electroluminescent layer and the common electrode, wherein the second light-emitting device comprises the common layer between the second electroluminescent and the common electrode, and wherein the common layer comprises at least one of a hole-injection layer, a hole-transport layer, a hole-blocking layer, an electron-blocking layer, an electron-transport layer, and an electron-injection layer.

3. The display apparatus according to claim 1, wherein the display portion comprises a second insulating layer, wherein the first insulating layer comprises an inorganic material, wherein the second insulating layer comprises an organic material and overlaps with the side surface of the first electroluminescent layer and the side surface of the second electroluminescent layer, and wherein the first insulating layer is positioned between the first electroluminescent layer and the second insulating layer.

4. The display apparatus according to claim 1, wherein a resolution of the display portion is higher than or equal to 1000 ppi.

5. The display apparatus according to claim 1, wherein the first subpixel comprises a lens overlapping with the first light-emitting device.

6. The display apparatus according to claim 1, wherein an end portion of the first pixel electrode has a tapered shape.

7. The display apparatus according to claim 1, wherein the first electroluminescent covers the end portion of the first pixel electrode.

8. The display apparatus according to claim 1, wherein the first subpixel comprises a reflective layer, wherein the first pixel electrode comprises a material that transmits visible light, and wherein the first pixel electrode is positioned between the reflective layer and the first electroluminescent layer.

9. A display system comprising:

a server;

a terminal; and a display apparatus comprising:

a display portion;

a first communication portion; and a wearing portion, wherein the wearing portion is configured to be worn on a head, wherein the first communication portion is configured to execute wireless communication, wherein the display portion is capable of full-color display, wherein the display portion comprises a first subpixel and a second subpixel, wherein the first subpixel comprises a first light-emitting device that emits blue light, wherein the second subpixel comprises a second light-emitting device that emits light of a color different from a blue color, wherein at least one material in the first light-emitting device is different from at least one material of the second light-emitting device, wherein the first light-emitting device comprises a first pixel electrode, a first electroluminescent layer over the first pixel electrode, and a common electrode over the first electroluminescent layer, wherein the second light-emitting device comprises a second pixel electrode, a second electroluminescent layer over the second pixel electrode, and the common electrode over the second electroluminescent layer, wherein the display portion comprises a first insulating layer comprising a region overlapping with the common electrode, wherein the first insulating layer covers a side surface of the first electroluminescent layer and a side surface of the second electroluminescent layer, wherein the common electrode is positioned over the first insulating layer, wherein the terminal comprises a second communication portion and a third communication portion, wherein the second communication portion is configured to execute communication with the server through a network, and wherein the third communication portion is configured to execute communication with the first communication portion.

10. The display apparatus according to claim 9, wherein the first subpixel comprises a reflective layer, wherein the first pixel electrode comprises a material that transmits visible light, and wherein the first pixel electrode is positioned between the reflective layer and the first electroluminescent layer.

11. A display apparatus comprising:

a display portion, wherein the display portion is capable of full-color display, wherein the display portion comprises a first subpixel and a second subpixel, wherein the first subpixel comprises a first light-emitting device that emits blue light, wherein the second subpixel comprises a second light-emitting device that emits light of a color different from a blue color, wherein at least one material in the first light-emitting device is different from at least one material in the second light-emitting device, wherein the first light-emitting device comprises a first pixel electrode, a first electroluminescent layer over the first pixel electrode, and a common electrode over the first electroluminescent layer, wherein the second light-emitting device comprises a second pixel electrode, a second electroluminescent layer over the second pixel electrode, and the common electrode over the second electroluminescent layer, wherein the display portion comprises a first insulating layer comprising a region overlapping with the common electrode, wherein the first insulating layer covers a side surface of the first electroluminescent layer and a side surface of the second electroluminescent layer, and wherein the common electrode is positioned over the first insulating layer.

12. The display apparatus according to claim 11, wherein the first subpixel comprises a reflective layer, wherein the first pixel electrode comprises a material that transmits visible light, and wherein the first pixel electrode is positioned between the reflective layer and the first electroluminescent layer.

* * * * *